US005732192A

United States Patent [19]

Malin et al.

[11] Patent Number: 5,732,192

[45] Date of Patent: Mar. 24, 1998

[54] GLOBAL QUALITATIVE FLOW-PATH MODELING FOR LOCAL STATE DETERMINATION IN SIMULATION AND ANALYSIS

[75] Inventors: Jane T. Malin; Land D. Fleming, both of Houston, Tex.

[73] Assignee: The United States of America as represented by the Administrator of the National Aeronautics and Space Administration, Washington, D.C.

[21] Appl. No.: 346,793

[22] Filed: Nov. 30, 1994

[51] Int. Cl.[6] .................. G06F 15/00

[52] U.S. Cl. .................. 395/10; 364/578

[58] Field of Search .................. 395/10, 51; 364/578

[56] References Cited

U.S. PATENT DOCUMENTS

| | | | |
|---|---|---|---|
| 4,965,743 | 10/1990 | Malin et al. | 364/513 |
| 5,025,499 | 6/1991 | Inoue | 365/165 |
| 5,138,694 | 8/1992 | Hamilton | 395/10 |
| 5,251,285 | 10/1993 | Inoue | 395/10 |
| 5,253,189 | 10/1993 | Kramer | 364/578 |
| 5,262,960 | 11/1993 | Said | 364/578 |
| 5,265,035 | 11/1993 | Reifman | 395/915 |
| 5,278,770 | 1/1994 | Gore | 364/578 |
| 5,317,525 | 5/1994 | Taoka | 364/578 |
| 5,353,381 | 10/1994 | Hamilton | 395/10 |
| 5,522,014 | 5/1996 | Clark | 395/10 |
| 5,537,644 | 7/1996 | Hamilton | 395/10 |

OTHER PUBLICATIONS

Ishida, "Qualitative reasoning on flow networks," Trans. of the society of instrument and control engineers, v27, n5, 600/606, May 1991.

Kurokawa, "A knowledge based system for envisioning network flow," Transactions of the Institute of electronics information and commumication engineers, vol. J75D–II, issue 3, pp. 608–618, Dec. 1992.

Ishida, "Topolpogy based reasoning on process flow diagram," Proceedings of the 1992 Japan–USA symposium on flexible automation part 2, pp. 1427–1431, Dec. 1992.

Cahill, "A qualitative simulation of faults on NGC's transmission system," IEE Colloquiium on artificial intelligence in simulation, Jan. 1991.

(List continued on next page.)

*Primary Examiner*—Tariq R. Hafiz
*Assistant Examiner*—Jeffrey S. Smith
*Attorney, Agent, or Firm*—Hardie R. Barr

[57] ABSTRACT

For qualitative modeling and analysis, a general qualitative abstraction of power transmission variables (flow and effort) for elements of flow paths includes information on resistance, net flow, permissible directions of flow and qualitative potential. Each type of component model has flow-related variables and an associated internal flow map, connected into an overall flow network of the system. For storage devices, the implicit power transfer to the environment is represented by "virtual" circuits that include an environmental junction. A heterogeneous aggregation method simplifies the path structure. A method determines global flow-path changes during dynamic simulation and analysis, and identifies corresponding local flow state changes that are effects of global configuration changes. Flow-path determination is triggered by any change in a flow-related device variable in a simulation or analysis. Components (path elements) that may be affected are identified, and flow-related attributes favoring flow in the two possible directions are collected for each of them. Next, flow-related attributes are determined for each affected path element, based on possibly conflicting indications of flow direction. Spurious qualitative ambiguities are minimized by using relative magnitudes and permissible directions of flow, and by favoring flow sources over effort sources when comparing flow tendencies. The results are output to local flow states of affected components.

72 Claims, 27 Drawing Sheets

OTHER PUBLICATIONS

"Survey of Software Tools for Evaluating Reliability, Availability, and Servicability," Allen M. Johnson, Jr. & M. Malek, ACM Computing Surveys, vol. 20 #4, Dec. 1988, 228–269.

"Qualitatively Modelling the Effects of Electrical Circuit Faults," M. H. Lee & A. R. T. Ormsby, Artificial Intelligence in Engineering 8 (1993) 293–300.

"Qualitative Reasoning about Physical Systems with Multiple Perspectives," Zheng–Yang Liu, Dissertation, Department of Computer and Information Science, Univ. of Oregon, Mar. 1991.

"CONFIG–Integrated Engineering of Systems and Their Operation," Jane T. Malin, Dan Ryan & Land Fleming, Proc. Fourth National Technology Transfer Conference (Technology 2003, Anaheim, CA Dec. 7–9, 1993.

"Computer–Aided Operations Engineering with Integrated Models of Systems and Operations," Jane T. Malin, Dan Ryan & Land Fleming, Proc. Dual Use Space Technology Transfer Conference (NASA Conference Publication), Houston, TX NASA Johnson Space Center, Feb. 1994: 455–461.

Analysis and Simulation of Multiport Systems, D. Karnopp and R. C. Rosenberg, the M.I.T. Press 1968.

Figure 8B

1. NODE IS AN IN-LINE-ATOM AND FLOW-DIR IS UNAMBIGUOUS?
2. FLOW-DIR IS AMBIGUOUS?
3. FLOW-DIR HAS BEEN DISAMBIGUATED AND PARENT FLOW-DIR IS AMBIGUOUS?
4. EFFORT-DIR OF PARENT IS AMBIGUOUS?
5. PARENTS ARE CIRCUITS?

GLOBAL QUALITATIVE FLOW-PATH MODELING FOR LOCAL STATE DETERMINATION IN SIMULATION AND ANALYSIS

The invention described herein was made in the performance of work under a NASA contract and is subject to the provisions of Section 305 of the National Aeronautics and Space Act of 1958, Public Law 85-568 (72 Stat.435; 42 U.S.C. 2457).

BACKGROUND OF THE INVENTION

1. Field of the Invention

The invention relates to simulation and analysis systems for model structures corresponding to physical components and connections in the modeled system, including discrete event simulation, bond graph modeling and analysis and reliability models. The qualitative modeling approach relates to qualitative physics and model-based reasoning in the field of artificial intelligence. The graph clustering approach relates to the field of graph analysis. The invention also relates to specific domain methods in electrical circuit analysis.

2. Description of the Related Art

The purpose of the invention is to qualitatively determine local flow attributes that are dependent on global configuration (dynamic flow-path topology) in component-connection models, and to provide such determinations for use during dynamic simulations and analyses. Several types of modeling and simulation have addressed the problem of analysis of system behaviors that are affected by changes in the topology of flow and effort. These include continuous system modeling (using conventional numerical analysis), bond graph modeling, reliability graph analysis, discrete event simulation and modeling, and constraint propagation.

Recently, some progress has been made in qualitative modeling and analysis in the electrical circuit domain, for perturbation analysis, using graph clustering methods. After a change in input voltage, ARC (Liu, 1991) uses existence of voltage differences and orientation (permitted flow direction) of devices to determine which parts of a circuit are active and which are inactive, thereby permitting linear-system qualitative analysis of voltages and current flows in active portions of the circuit. CIRQ (Lee and Ormsby, 1993) uses a qualitative representation of electrical resistance and, given specified qualitative resistance changes (which may be internal), locates state changes in circuits and assigns qualitative voltages and current flows within the circuit.

In continuous system modeling, conventional numerical analysis is used to compute actual quantitative values of the behavior of the system and its components in each steady state. Analysis of dynamics involves solving the equations for all proposed topologies, and comparing results to derive changed values. This is a very complex process, requiring identification of dynamic topologies, and appropriate simplifications and statistical assumptions for particular systems.

In typical discrete local modeling structures such as those found in constraint propagation, reliability block diagrams or discrete event simulation models, system states need not be steady. However, the direction and magnitude of flowing substances must be determined strictly from local inputs, with no reference to origin of inputs or other remote model structures. The state of a continuous fluid entity at one point in a network of connected devices can be affected by behavior in another remote device via the power-transmitting medium. For example, a valve closing or switch opening at a remote location can stop flow in many other locations, by breaking a flow-path. Since there is no way to model the global system topology in these modeling approaches, it is necessary to hand-craft component models to be consistent with particular expected flow scenarios. In local modeling structures, the ways that have been found for converting these remote effects to local ones have been ad hoc, using awkward and complex concepts that do not correspond to the physical phenomena being modeled and that do not generalize well.

Bond graphs offer a means by which components in flow and effort systems in several domains can be uniformly modeled quantitatively and qualitatively, to define power transmission and energy conversion among subsystems (Karnopp and Rosenberg, 1968). However, bond graph modeling does not characterize the dynamic configuration of the topology of the system, and is not sensitive to the ordering of the system components or the sequential events found in discrete event simulation. Also, as in constraint propagation systems, each model implicitly depends on pre-identification of the active flow-effort configuration of a steady-state system.

Qualitative electrical circuit analysis methods have been developed for the electrical domain, and are limited by the simplifying assumptions such a domain provides. They are best suited for DC electromechanical systems with a single power source, and with two-port components that can be hierarchically clustered or aggregated based on the strictly serial and parallel graph structure of the system. For other power transmission domains, there may be several power sources and more complex components, and most of the topology may not be strictly serial or parallel.

Electrical circuit perturbation analysis methods are also limited to determining the stable state of a system after a discontinuous change in an input signal or variable. For simulation, system state variable changes due to global configuration changes must be tracked over a period of time, and the simulation must be affected at the appropriate times by these globally determined changes.

SUMMARY OF THE INVENTION

The invention provides a method of explicit global modeling that is compatible with local modeling, discrete simulation and analysis. The invention disentangles the important global system power transmission variables from local component variables. Thus it supports abstracted general-purpose local models, no longer requiring development of multiple system-configuration-specific models for each component.

The qualitative method of abstraction used by the invention supports use of discrete event simulation approaches for analysis of analog systems. The power transmission abstraction and clustering approach also enables broad applicability to several discrete and analog domains, and to analysis domains such as reliability block diagram analysis. This applicability is enhanced by providing robust aggregation functions and analysis for complex structures that could include several power sources, more complex components, and a topology that is not strictly serial or parallel.

The invention provides a dynamic method of operation for determining global flow-path changes during simulation, and for identifying corresponding local model changes to occur at appropriate times.

The invention qualitatively determines local flow attributes that are dependent on global configuration (dynamic flow-path topology) in simulation and analysis systems, for models with structures corresponding to physical components and connections in the modeled system. The invention also provides such determinations for use during dynamic simulations and analyses. The invention supports modeling, simulation and analysis of system behaviors that are affected by operational events or failures that dynamically change the power transmission (flow and effort) topology of the system.

The invention uses a general qualitative abstraction of power transmission variables (flow and effort) to incorporate dynamic system flow computations into discrete event simulation and analysis of systems of connected components. The qualitative flow path elements include information on aggregates and flow-tendencies to support the aggregation and flow-determination procedure, where the path elements are treated as labeled edges between junctions. Divergences and convergences of flow are represented as junctions. The flow path elements also include qualitative information on resistance (finite or infinite), net flow (zero, or in right or left direction), permissible directions of flow and qualitative potential (effort-input). The qualitative power transmission abstractions enable broad applicability to discrete and analog domains.

The invention provides a method of explicit global modeling that is compatible with local modeling, discrete event simulation and various types of analysis of component-connection models. Each type of component device model has flow-related variables and an associated internal flow map, connected into an overall flow network of the system containing the device. The internal connections for the device mirror the connections of the corresponding map nodes in the interfaced flow map. For storage devices, the implicit power transfer to the environment is represented by "virtual" circuits that include an environmental junction. By disentangling the global system power transmission variables from other local component variables and providing an interface, the invention supports use of libraries of abstracted general-purpose local models. Modelers are thus no longer required to develop multiple-system-configuration-specific models for each system device.

The methods for simplifying the graph structure use a heterogeneous aggregation scheme that combines the construction of circuit aggregates with the serial and parallel (SP) clustering techniques. The aggregate data structures include serial (S) and parallel (P) clusters and circuit objects. A circuit is any collection of system components defining a cyclic path such that no nodes are repeated in the path sequence. Clustering allows entire sub-graphs of a flow network to be treated as individual nodes in a circuit. Aggregates contain the same types of information as path elements, but also contain directional information and cluster-circuit interface information. This combination of circuits and clusters overcomes the major representational limitation of SP clustering, which can be applied only to SP-reducible system topologies. The introduction of circuits permits a useful analyzable representation to be constructed for any power-transfer topology. These robust aggregation functions support analysis of complex structures that could include several power sources, complex components, and a topology that is not strictly serial or parallel.

The invention provides a dynamic method of operation for determining global flow-path changes during simulation, and for identifying corresponding local model changes. The procedure for these computations maintains qualitative state information on the power variables for every device or component represented in a simulated system of flows for every quantum of simulation time. The procedure also dynamically determines which port is upstream and which is downstream for each system component when a reconfiguration of the system or reversal of direction of an effort has occurred.

The method for flow path determination permits numerous dynamic updates of local components during simulation, based on events that have global impacts within the connected system. The invention uses a graph of flow-path elements communicating with one or more aggregate "parent" objects, each representing a sub-graph of the overall flow network in a modeled system. During a simulation, the graph elements report information on their local states, and the sub-graph parent aggregates report back the status of flow-related attributes of their sub-graphs. "Virtual" circuits support uniform representation of flows to and from the model environment so that they are not special cases requiring additional computations during simulation. Any change in a flow-related device variable triggers the flow-path determination procedures. A two-phase computation is used to determine flow configuration and local flow directions. In Phase I, the procedure determines components that may be affected and the flow-related attributes favoring flow in one or both of the two possible directions. The actual decisions on flow direction for the affected path elements are made in Phase II. In Phase II, two new techniques minimize spurious qualitative ambiguities that may arise. The first technique resolves ambiguities by distinguishing qualitative values of significant magnitude from those of relatively insignificant magnitude. The second technique favors flow sources when comparing the flow tendencies imposed by flow sources and effort sources.

The separation of computations into two distinct phases allows conflicting indications of flow direction to be recorded for each element in Phase I, so that all such indications are known for all elements before the actual flow-direction decision is made. It also facilitates integration with discrete-event simulation, since Phase II can be deferred until the end of a discrete-event time quantum. The procedure makes qualitative flow computations for a wide range of practical modeling cases sufficiently tractable for simulation approaches such as discrete event simulation, because the aggregation scheme on which the computations are based permits the procedure to ignore all state variables that do not require updating and recompute values for only those variables that require it.

BRIEF DESCRIPTION OF THE DRAWINGS

FIG. 8B is a legend for FIG. 8A.

DESCRIPTION OF THE PREFERRED EMBODIMENT

1. Detailed Description of the Invention

The purpose of the invention is to qualitatively determine local flow attributes that are dependent on global configuration (dynamic flow-path topology) in component-connection models, and to provide such determinations for use during dynamic simulations and analyses. The purpose of the capability is to assist engineers in modeling, simulation and analysis of system behaviors that are affected by changes in the power transmission topology of the system. These changes can be caused by operational events or failures. The classes of reconfigurable systems covered by the capability include both discrete and analog systems modeled with power variables (flow and effort), including electromechanical, thermodynamic and chemical processing and transport systems.

This invention has been embodied as a Flow-Path Management Module (FPMM) that enhances the CONFIG tool for discrete event simulation and qualitative modeling (Malin et al., U.S. Pat. No. 4,965,743, 1990). FPMM design and implementation are described briefly in Malin et al. (1993, 1994) and in detail in a two-part CONFIG FPMM design document (Fleming and Malin, 1994) incorporated herein by reference and entirely contained in pages 7 to 88 of applicants' U.S. patent application Ser. No. 08/346,793 as originally filed on Nov. 30, 1994. Pertinent portions of the text of this two-part CONFIG FPMM design document are reproduced below under the sub-heading "Details for Implementing the Preferred Embodiment."

Figure 1A:
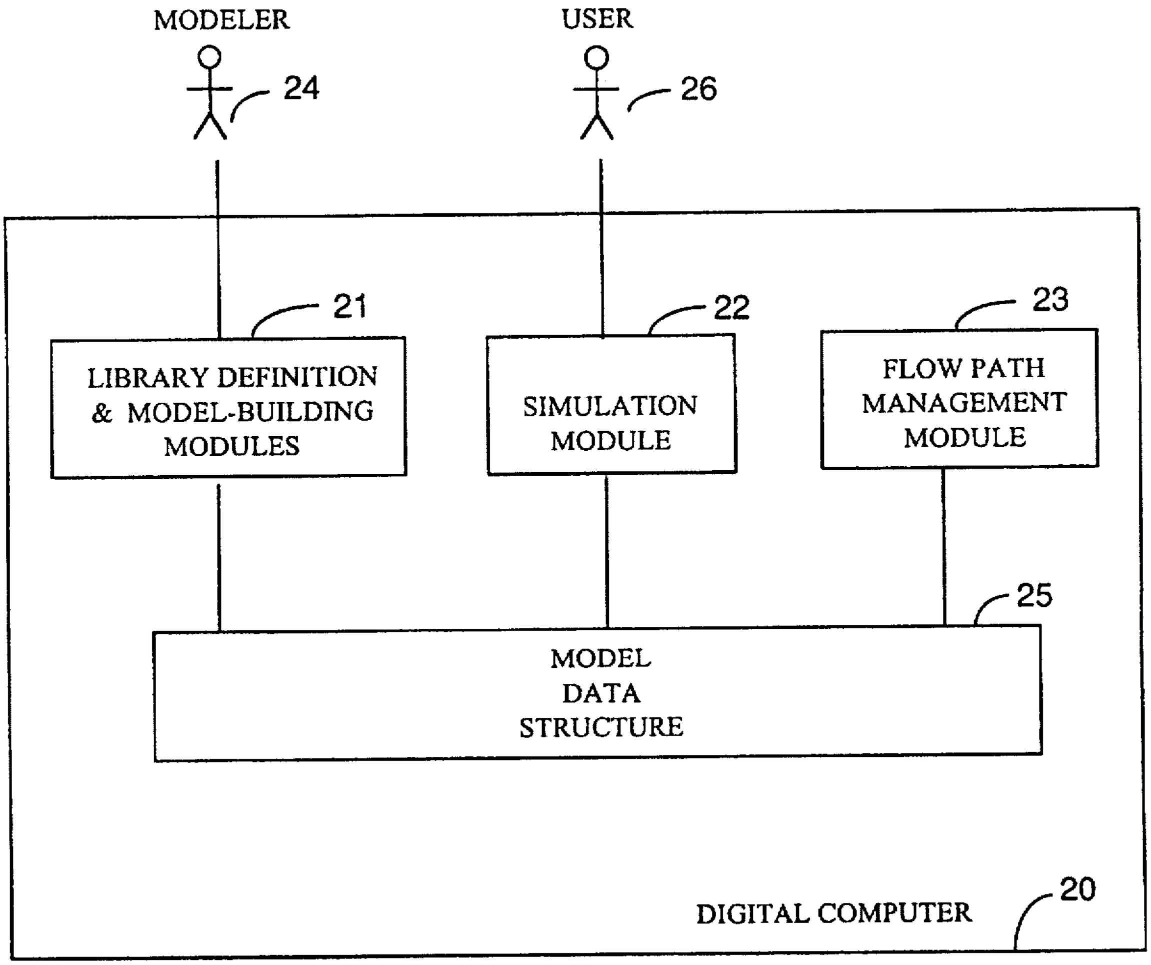
FIG. 1A shows a block diagram of a preferred embodiment of the invention, in which a digital computer is programmed with a flow path management module (FPMM) and with modules of the CONFIG tool for discrete event simulation and qualitative modeling.

Turning now to FIG. 1A, there is shown a block diagram illustrating the integration of the Flow Path Management Module (FPMM) with the CONFIG tool for discrete event simulation and qualitative modeling. The CONFIG tool includes Library Definition and Model Building Modules 21 and a Simulation Module 22 loaded into a digital computer 20. The digital computer 20 is also loaded with the Flow path Management Module (FPMM) 23. A model builder 24 uses the Library Definition and Model-Building Modules to build a Model Data Structure 25. When a user 26 operates the Simulation Module 22 to perform a simulation, the Simulation Module 22 and the Flow Path Management Module 23 access the Model Data Structure 25.

Figure 1B:
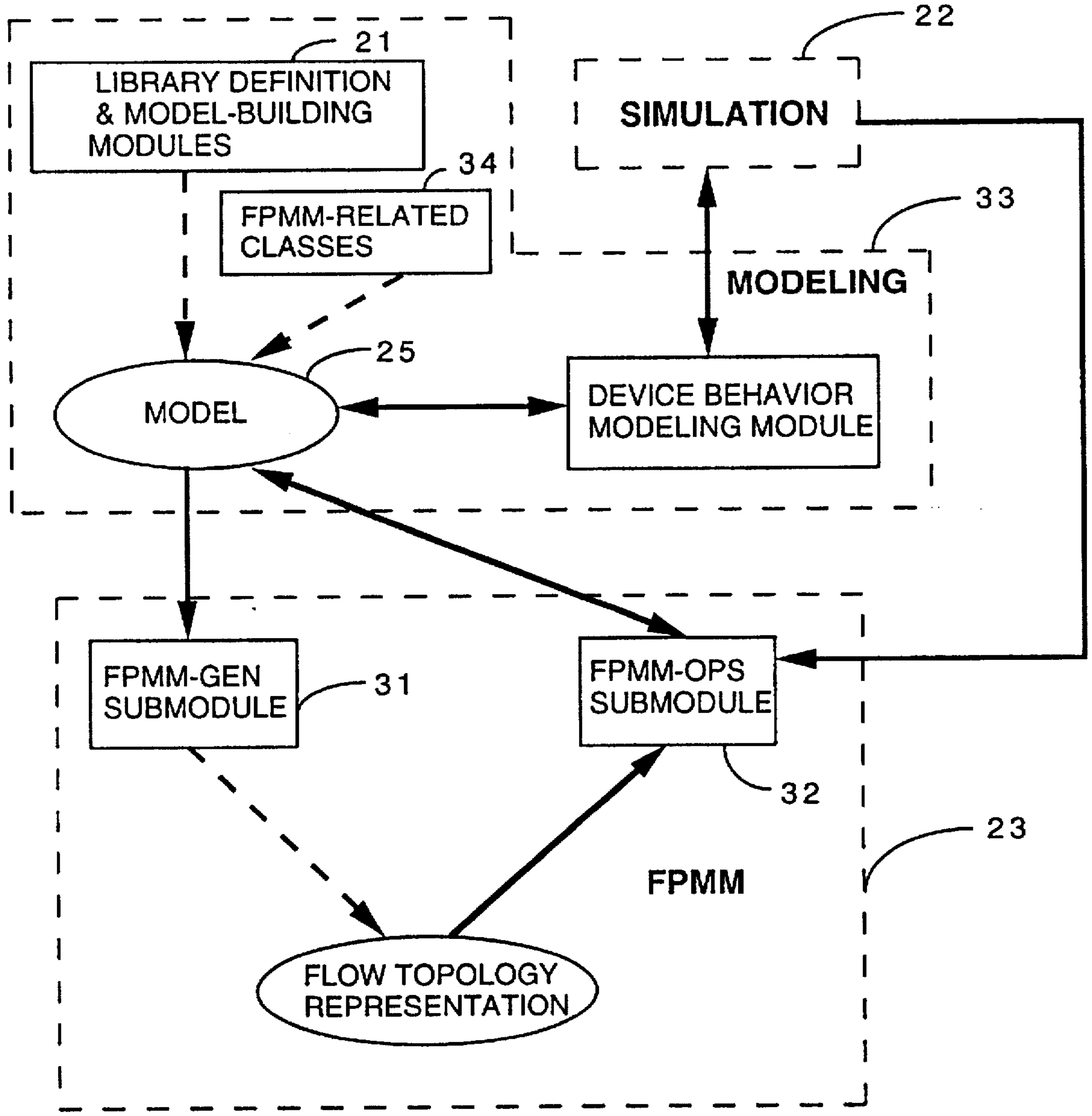
FIG. 1B is a more detailed diagram of an architecture of the flow path management module (FPMM) and its interface with the CONFIG discrete event simulator as introduced in FIG. 1A.
Figure 1C:
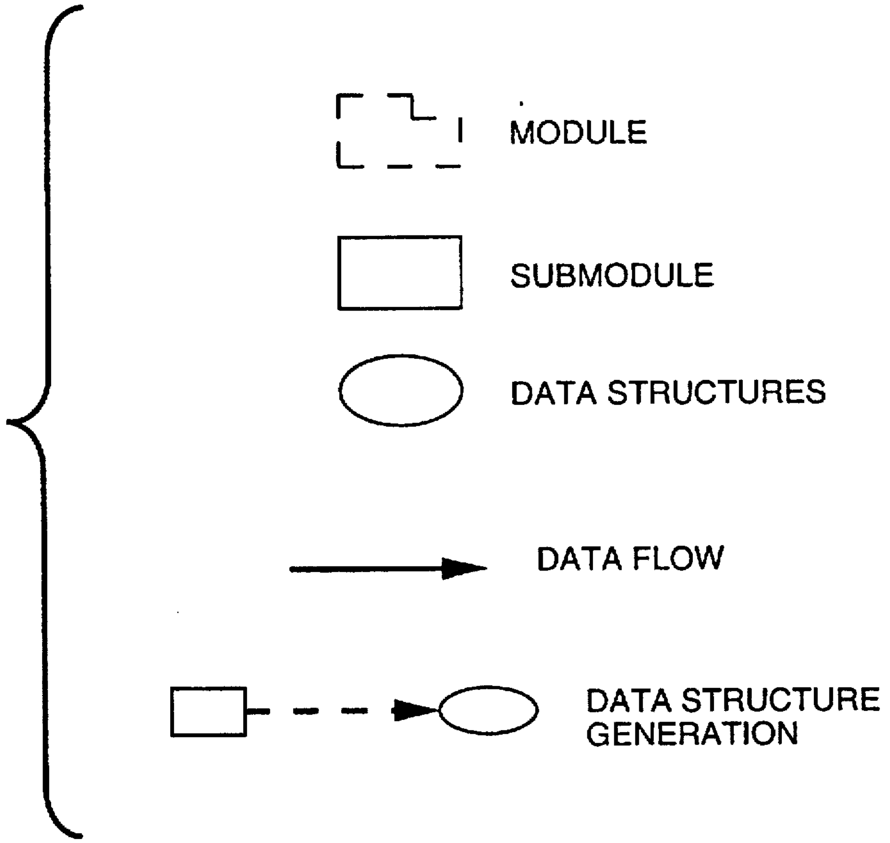
FIG. 1C is a legend showing the definitions of various symbols used in FIG. 1B.

The CONFIG/FPMM architecture and interfaces of the Flow Path Management Module 23 to the Modeling and Simulation Modules are further shown in FIG. 1B. The CONFIG modeling data types were enhanced to interface with the FPMM, by the addition of Internal-Flows and Junctions. An example of the use of the FPMM is in a Thermal Bus System model where the FPMM data type "Flow-Dir" is used to determine in which direction to propagate the user defined properties of fluid (Fluid Phase) carried by flow during the simulation.

During a simulation, the system maintains the data on the direction of flow and the qualitative value of potential drop for every possible path of flow through every system component or device on a flow path. For all resistive elements, the sign of the potential drop is always the opposite of the sign of the flow direction. FPMM also dynamically determines which port is upstream and which is downstream for each system component when a reconfiguration of the system or reversal of direction of an effort has occurred.

The basis of this design is a data structure and procedures in which flow-path elements communicate with one or more "parent" objects, each representing a sub-graph of the overall flow network in a modeled system. During a simulation, the elements report information on their local state and the parent objects report to their elements the status of flow-related attributes of the sub-graph such as whether there is an external flow into the sub-graph due to sources of effort external to it.

Data Structures

A set of fundamental path element objects and flow aggregate objects are provided to construct global power transmission path structures for use in computations concerning the flow-related properties of a system model. The various aggregates are constructed by procedures described later in this document. The design and implementation of FPMM are object-oriented, and so corresponding terminology will be used in the description.

The fundamental path element objects include Resistive Elements, or "In-Line-Nodes", Effort Sources, Flow-Sources and Junctions. An In-Line-Node indicates a resistive element that has exactly two connections to the external environment through which flow may pass. There are two types of attributes of an In-Line-Node, those hidden from and those visible to the modeler. The hidden attributes are used for flow computations, and include aggregate Parent, Left and Right ports, number of Flows-Right and Flows-Left, and Flow-Decided? status. The visible attributes include Pass-P (resistance as finite or infinite), Flow-Dir (computed net flow as zero, or in right or left direction), Effort-Input (one of a modeler-defined set of qualitative values that includes ZERO) and Orientation (permissible directions of flow).

Effort-Sources Effort-Sources are treated as resistive elements when the value of the effort exerted is Zero. Effort-Sources are therefore a subclass of In-Line-Node. Effort-Sources have two attributes in addition to those inherited from In-Line-Node: Effort-Dir (direction of higher potential) and Effort-Value (computed from net effort and flow inputs). Because potential across a resistive element is qualitatively proportional to flow, these two properties have been replaced by a single qualitative potential, also referred to as Effort-Input, for qualitative computations. A qualitative potential for a device in a flow-path is taken from a set of discrete values, such as "High", "Nominal", or "Low". Each such value is a qualitative expression of the difference between an effort at the input (upstream) port of flow and the effort at the output (downstream) port of flow. Since rates of flow are equivalent to qualitative potential in this design, flow sources are represented as a subclass of effort source and there is no "flow" variable for the flow-source, only the Effort-Value variable inherited from the Effort-Source class.

Junctions allow divergences and convergences of flow to be represented. In the node aggregation procedures used to produce aggregate objects, In-Line-Nodes are treated as labeled edges between junctions, which are treated as nodes. Junctions contain no direct information on flow and can impose no constraints on it beyond their static connectivity.

Figure 2A:
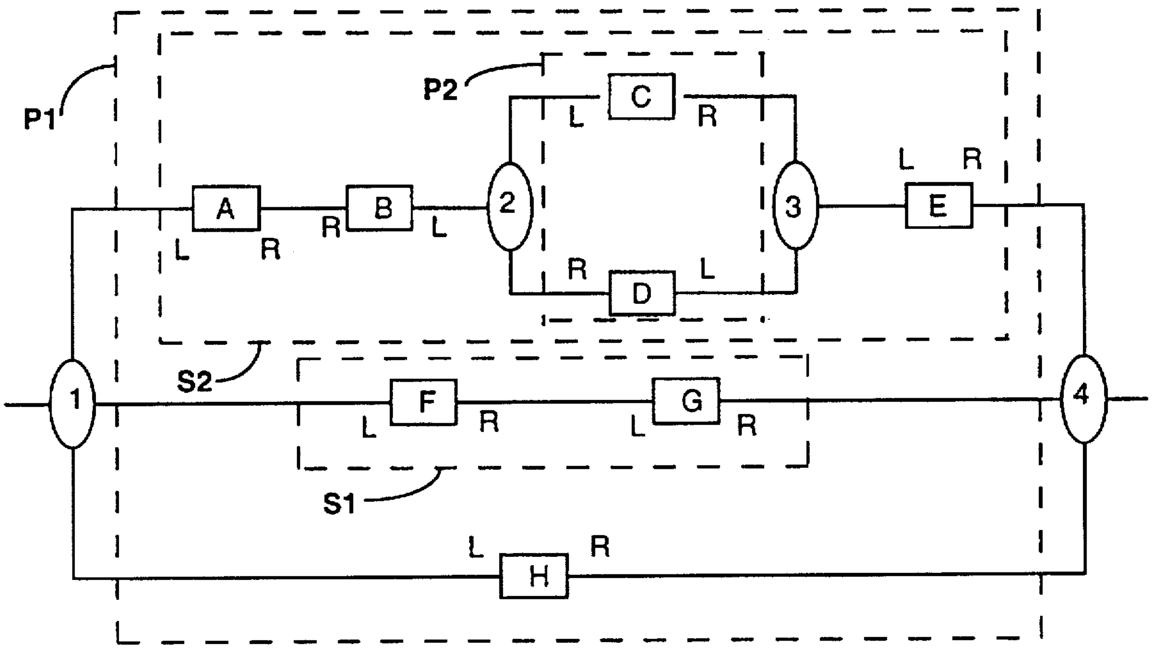
FIG. 2A is a diagram of a simple Serial-Parallel-Reducible sub-graph of a flow network.
Figure 2B:
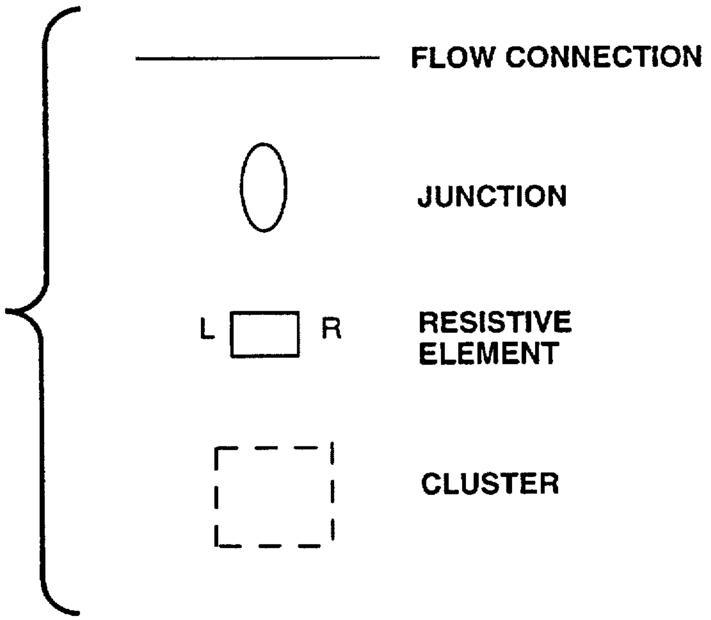
FIG. 2B is a legend for FIG. 2A.

Aggregate Data Structures are not visible to the modeler. They include serial (S) and parallel (P) clusters and circuit objects. A circuit is any collection of system components defining a cyclic path such that no nodes are repeated in the path sequence. Circuits have more than one connection to the external environment and therefore cannot be treated as components. Clustering allows entire sub graphs of a flow network to be treated as individual nodes in a Circuit. In FIG. 2A, a diagram of a simple SP-Reducible sub graph of a flow network is shown, and in FIG. 2B, the equivalent hierarchical cluster representation is shown with directional relationship information. S-Clusters represent series of nodes not separated by junctions and P-Clusters represent parallel nodes between junctions. Clusters are hierarchical graph aggregates that may be treated as components, inheriting from the class In-Line-Node, and have two "ports" to the external environment. Component-like aggregates have qualitative flow- and effort-direction attributes, while non-component-like aggregates do not. All aggregates share the Orientation and Pass-P attributes with In-Line-Nodes. All aggregates have a Children attribute pointing to the In-Line-Atoms or component-like aggregates that comprise the aggregate. The Circuit aggregate is necessary to represent SP-irreducible systems. Prior to the construction of Circuits, SP reductions are performed that replace some sub graphs of a complex flow network with single nodes.

Since all aggregates are used for computation of flow attributes for atomic nodes in CONFIG devices, the sense of direction in an aggregate relative to each child must be maintained. Every aggregate, therefore, rather than directly storing pointers to the child nodes, instead stores Part-Link objects that contain directional information and cluster-circuit interface information.

Simulator Interface

Figure 3A:
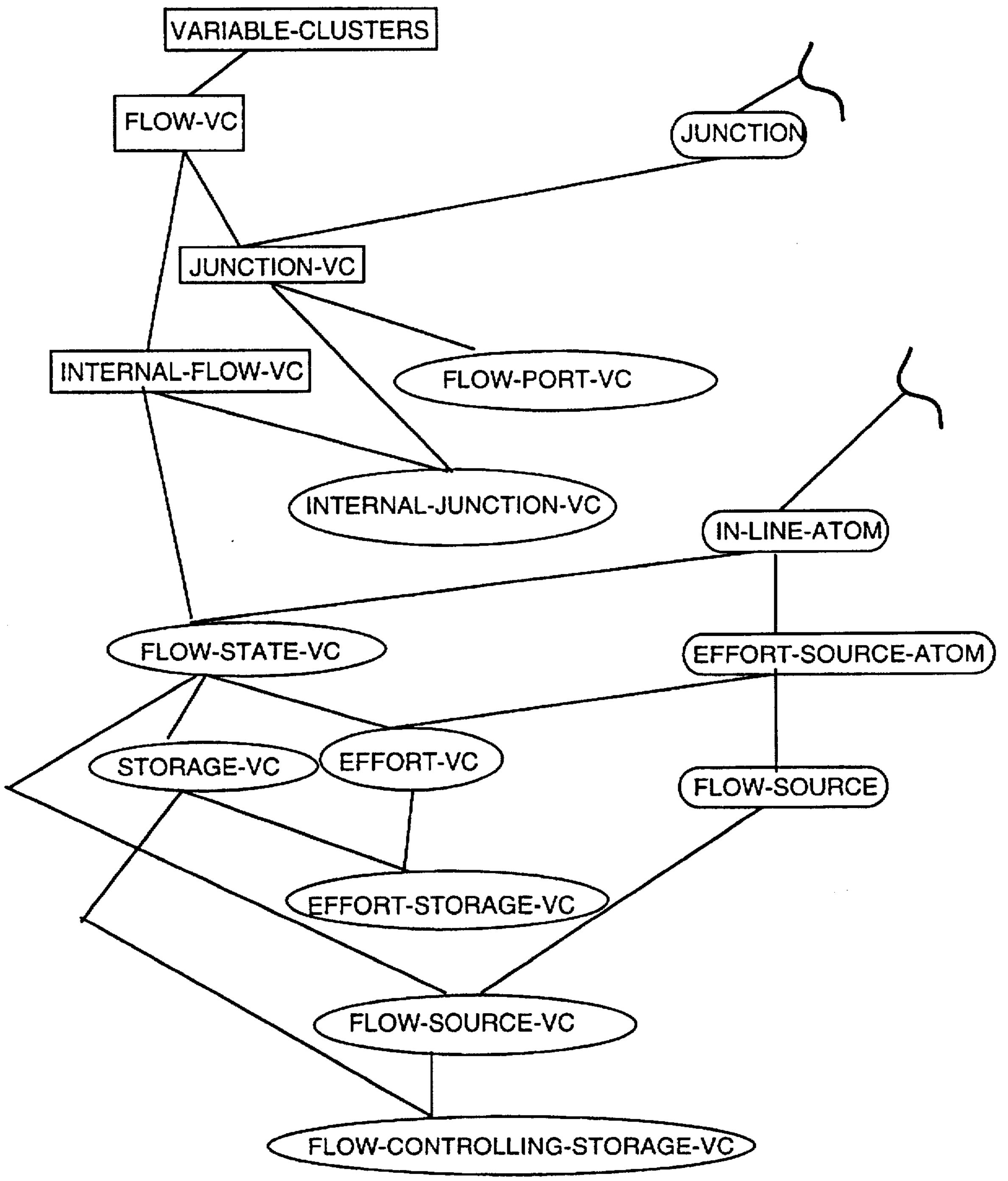
FIG. 3A is a diagram of flow-related variable classes for simulator component models and their interfaces with the flow-path management module.
Figure 3B:
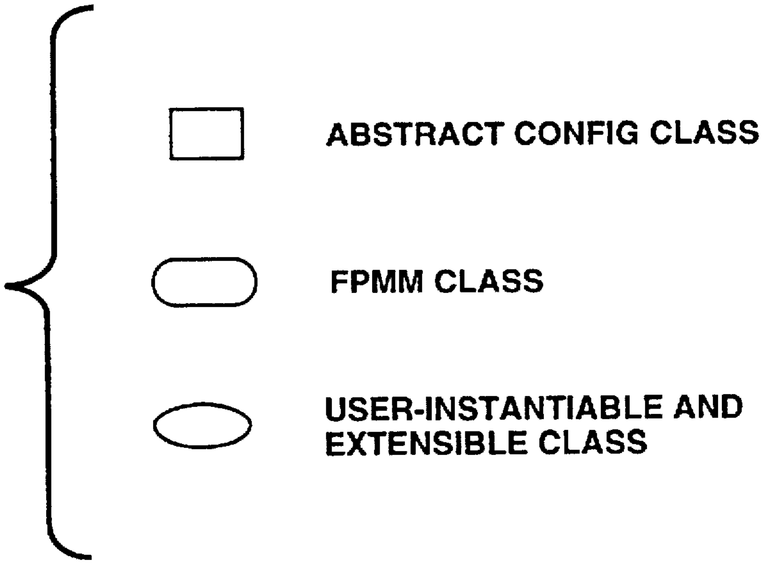
FIG. 3B is a legend for FIG. 3A.

In order to interface with a discrete event simulator such as CONFIG, a number of flow-related variable classes were defined for component models: flow, junction, internal-flow, internal junction, flow-state, flow-port, storage, effort, flow-source, effort-storage, flow-controlling-storage. A diagram of these classes in the CONFIG embodiment and their interfaces with FPMM is shown in FIG. 3A. FIG. 3 illustrates that the flow-related device data structures include a state variable cluster (VC) hierarchy. For storage devices, the implicit power transfer to the environment occurring, for example, during liquid flow into an open container, is represented by "virtual" circuits that include an environmental junction. This special class of junction, Domain-Power-Junction, is used to represent the transmission of power between the system and the environment. From the perspective of FPMM, there is no difference between Storage and In-Line-Nodes. The connectivity appears different only from the perspective of the system simulation model. A special Junction Device class is also defined to permit junctions external to any true device to be added to a model.

Figure 4A:
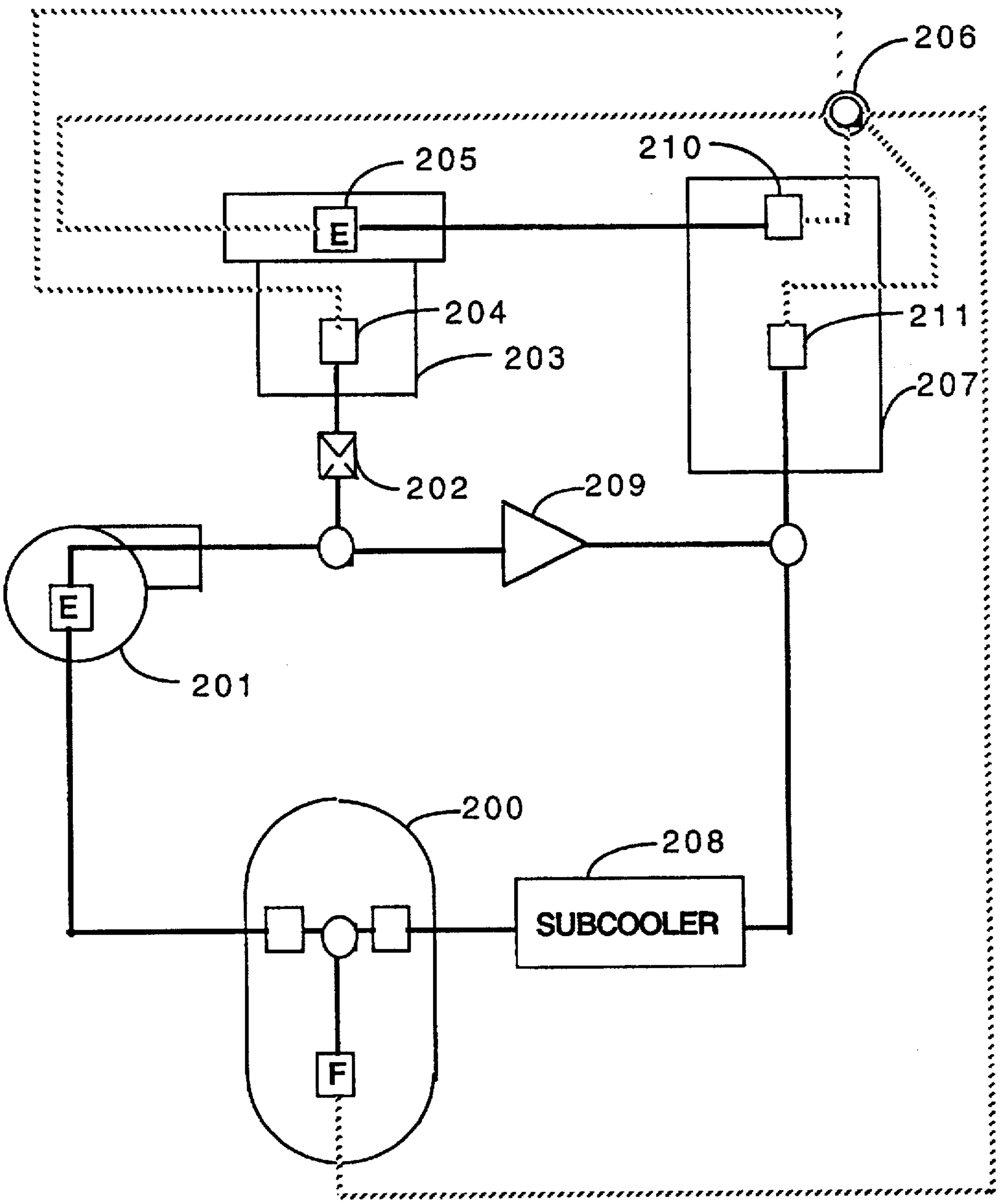
FIG. 4A is an example of a flow map interfaced to a thermal bus system model.
Figure 4B:
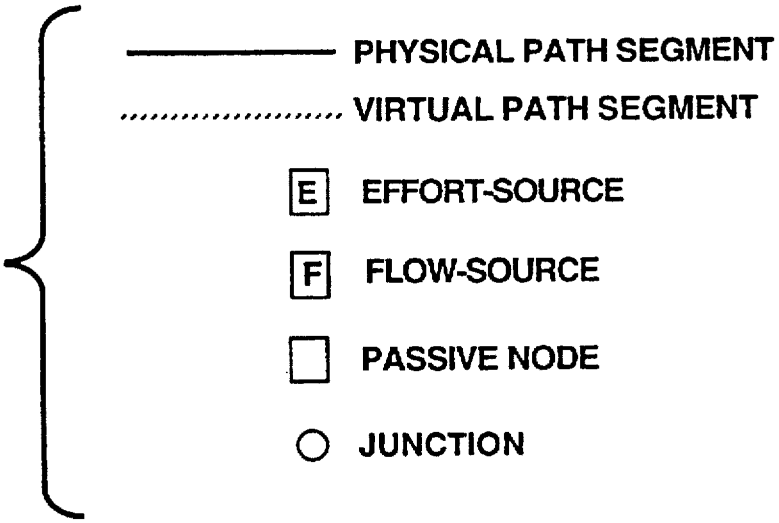
FIG. 4B is a legend for FIG. 3A.

Each system device class defined by the simulator user has a Flow-Map, a directed graph object. A device model may have an arbitrary number of internal data structures that, from the standpoint of FPMM, are interconnected nodes embedded in the overall flow network of the system containing the device. The user specifies a Flow-Map for each class of device that describes those connections internal to a device. When an instance of a device is connected into the system flow network by means of device relations to other devices, the internal connections of nodes contained in the device are automatically established by reference to the flow map for the device's class. For each internal node in a device instance there is a corresponding map node for the class. The internal connections for the device instance are established in such a way that they mirror the connections of the corresponding map nodes. An example of a flow map interfaced to a thermal bus system model is shown in FIG. 4A. In FIG. 4A, physical path segments are illustrated by solid black lines. There is a physical path including an accumulator 200, a pump 201, a solenoid valve 202, an evaporator 203, a condenser 207, and a subcooler 208. There is also physical path including a regulator valve 209 shunting the evaporator 203 and the condenser 207. Virtual path segments are illustrated by dotted lines. All of the virtual path segments terminate at a common domain junction 206. The respective virtual path segments originate from the accumulator 200, a liquid reservoir 204 in the evaporator 203, a vapor chamber 205 in the evaporator 203, a vapor chamber 210 in the condenser 207, and a liquid reservoir 211 in the condenser.

Procedure for Generating Topological Representations

Each time a flow relation is added to a system model or deleted from it, and each time the internal Flow-Map is modified for a device class for which instances exist in a model, a completely new set of Clusters and Circuits is created and any existing representational objects are discarded. The path-construction procedure, Cluster, finds a base-path between two arbitrarily selected junctions, an <origin> and a <destination> that are not the same junction. During the path traversal, S-Clusters are created as they are found. The initial S-Clusters are series of In-Line-Nodes not separated by any junctions. The procedure creates a two-dimensional array. The contents of each cell is then replaced by a cluster created by a recursive call to Cluster, and may be a P-Cluster or an S-Cluster created by the recursive call. Repeated passes are made through the array with increasingly large differences in the j and k cell indices, on each iteration making a recursive call to Cluster followed by a call to auxiliary procedures for combining with previous clustering results. The result is a heterogeneous hierarchical aggregate of Clusters and Circuits.

Simulation-Time Operations

Figure 5:
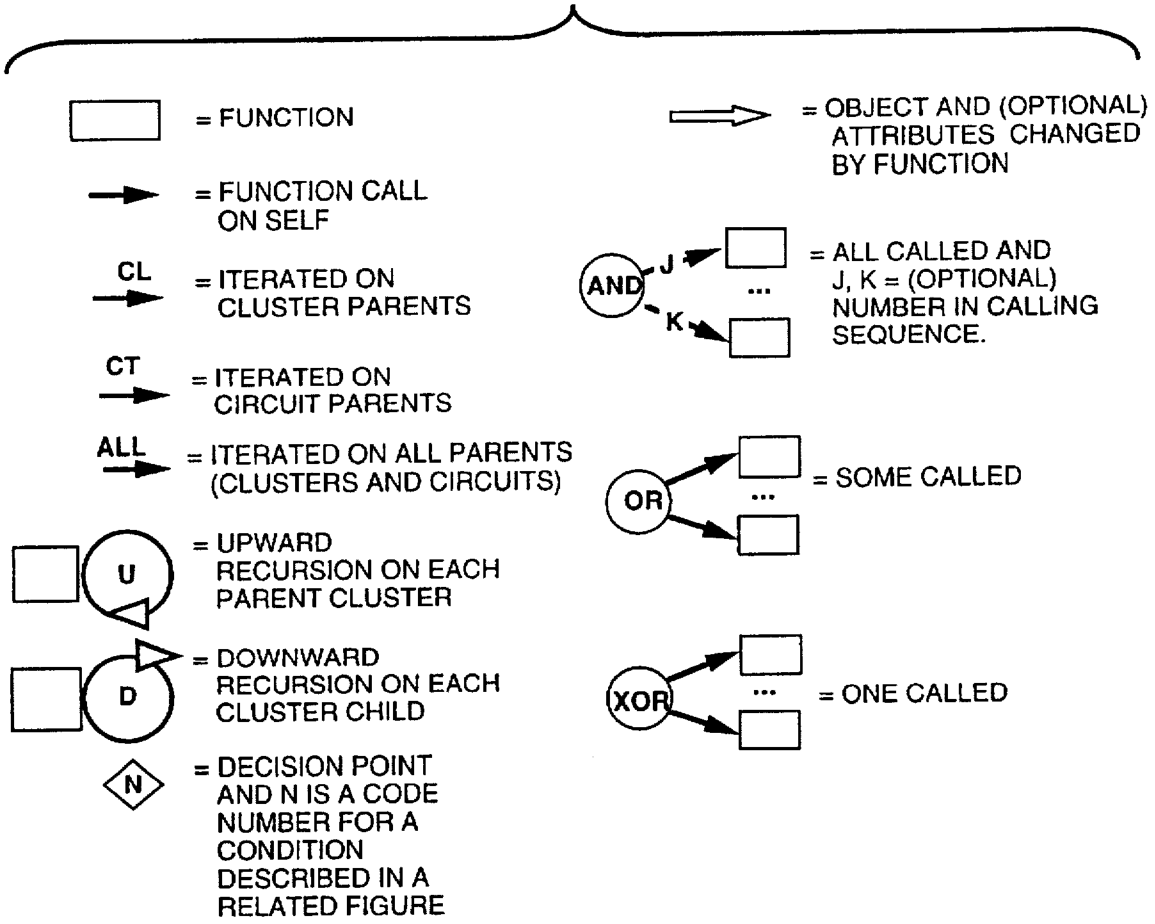
FIG. 5 is the legend for FIGS. 6, 7 and 8.
Figure 6A:
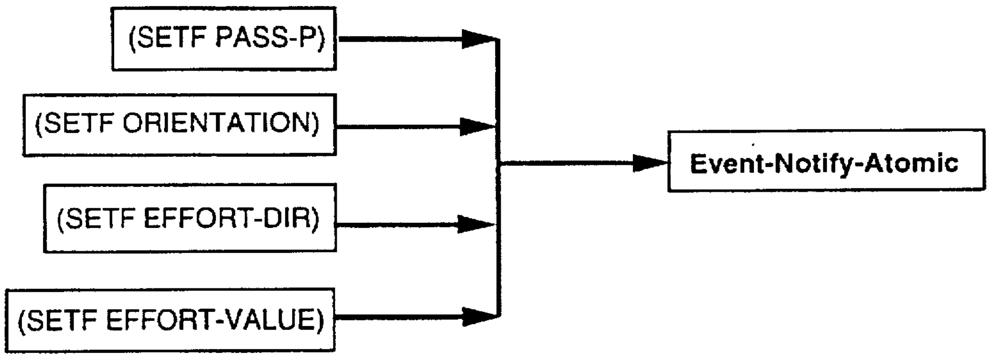
FIG. 6A is a diagram of changes in component (in-line-node) attributes for atoms that trigger flow-path determination during discrete event simulation.
Figure 6B:
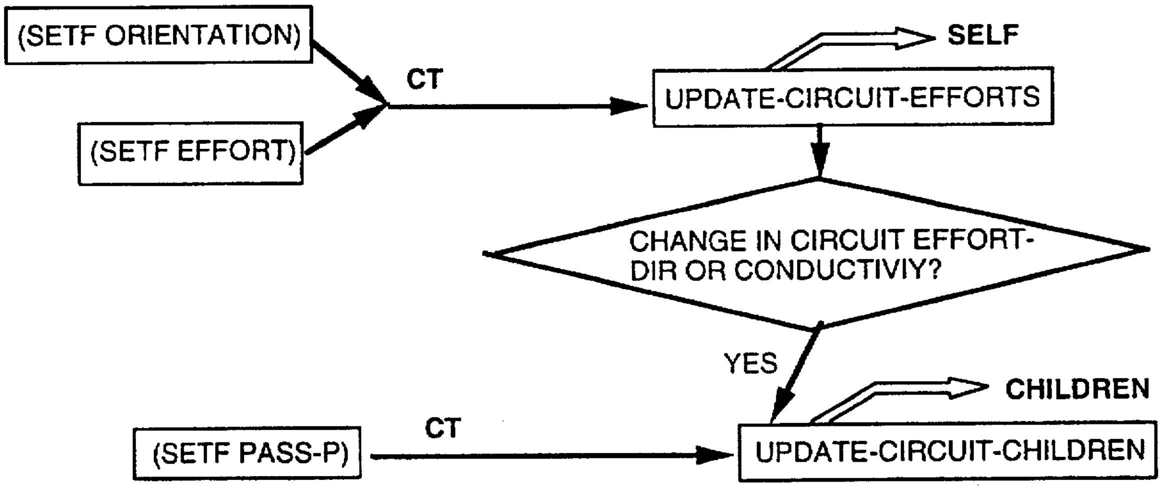
FIG. 6B is a diagram of changes in component (in-line-node) attributes for all in-line nodes with circuit parents, including atoms, that trigger flow-path determination during discrete event simulation.

During discrete-event simulations, FPMM computes the Flow-Dir and Effort-Input attributes of In-Line-Nodes incorporated into CONFIG as Device Variable-Clusters. FPMM employs a two-phase computation compatible with discrete event simulation, in which no new flow is determined until a time quanta has elapsed. The following is given as a summary of how the various procedures and data structures interact during a simulation. There are two major phases of activity triggered when the state of an atomic In-Line-Node changes. A diagram of triggering actions is shown in FIGS. 6A and 6B, and the legend for this and other calling sequence diagrams for procedures called on an in-line node or a node aggregate is shown in FIG. 5.

Figure 7A:
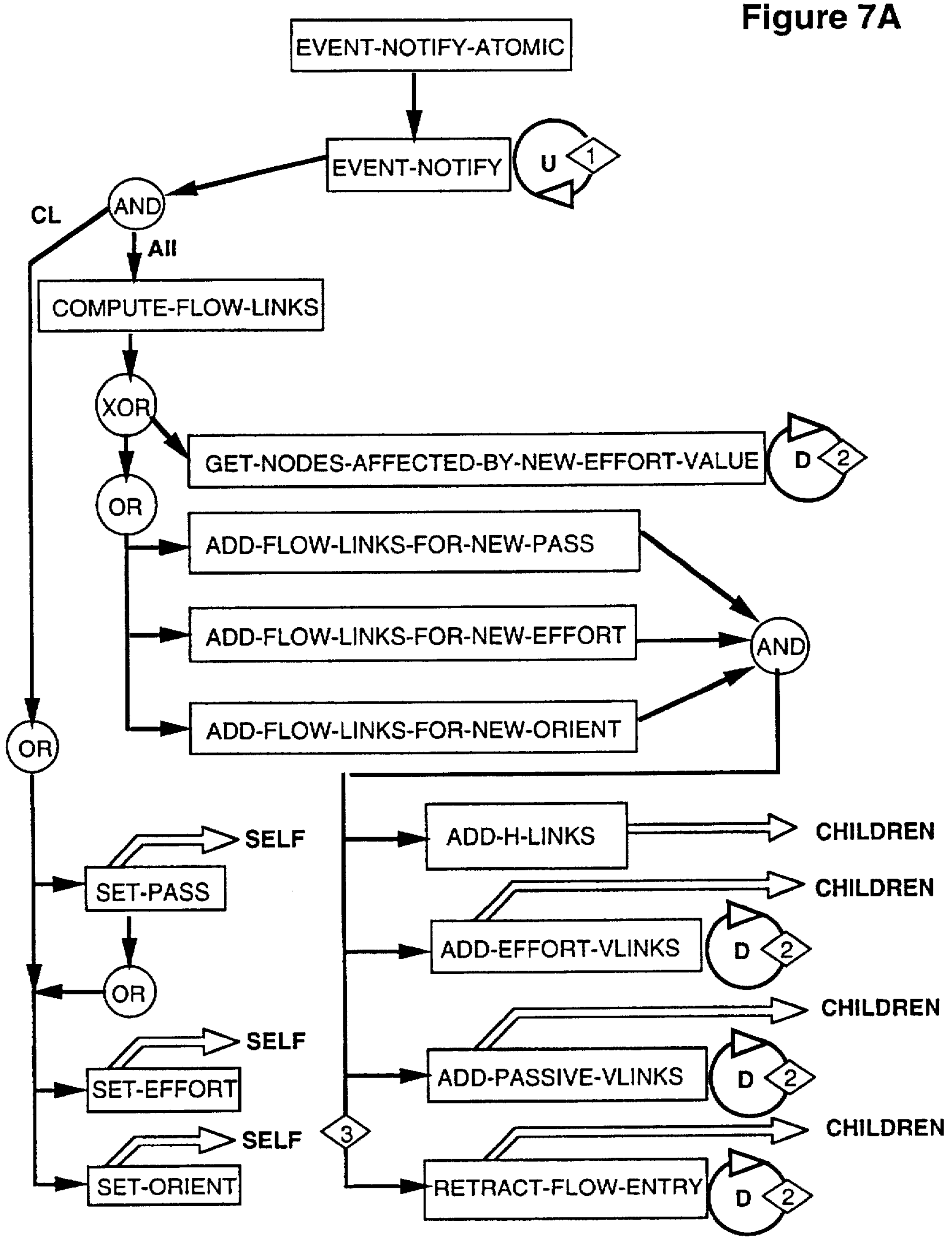
FIG. 7A is a calling diagram for Phase I of flow-path determination during discrete event simulation, in which affected nodes and factors favoring flow in one or both directions in the nodes are identified.
Figure 7B:
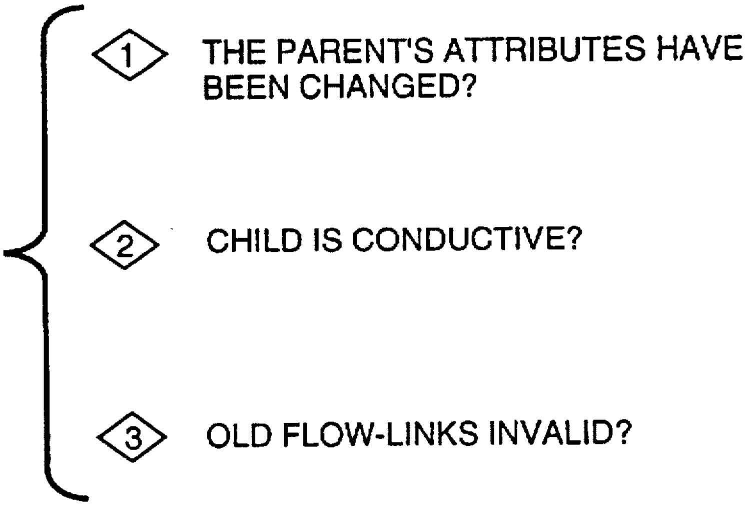
FIG. 7B is a legend for FIG. 7A.

A diagram of the Phase I procedure calls in relation to node aggregates is shown in FIG. 7A. The conditions for the decision points (diamonds) labeled 1, 2 and 3 in FIG. 7A are given in the legend of FIG. 7B. In Phase I, the flow-related attributes favoring flow in one or both of the two possible directions (Left or Right) of the two-port in-Line-Nodes are determined from the "bottom-up" through the system's cluster hierarchy, starting with the atomic in-Line-Node whose state has changed, referred to here as the "origin node". The origin node and the clusters above it whose flow-related attributes are also changed during upward recursion are each referred to as the "event node" on which further upward recursion is based. The state changes in device variables in the simulation model that can affect flow are Pass-P, Orientation, Effort-Dir, and Effort-Value.

The nodes and clusters that have undergone a change in either of the two flow-link token attributes are added to a list of *Affected-Nodes* and the Flow-Decided? attribute of the node is set to NIL. This attribute is used during Phase II operations.

When the event associated with the origin node is a change in Effort-Value, all children of active clusters ancestral to the origin node and all children of active circuits of which the origin node is a child are added to the list of *Affected-Nodes*. An aggregate object is active if flow can reach from one of its two ports to the other. Because Effort-Value is a change in magnitude, not in direction, no flow links are added when this value has changed.

Factors influencing flow are also computed for siblings of the origin node in any of the non-hierarchical Circuit objects of which the origin node is a child. The tokens used to represent factors favoring flow are referred to as Flow-Links. A node may have either a set of Circuit objects as parents or a single S- or P-Cluster parent.

The aggregation of nodes into Circuits and/or clusters allows computations to proceed in an incremental fashion so that only a subset of all nodes in the system must be examined when a flow-related state change occurs in a given node. Upward-recursion halts when the state-change in the child does not produce a qualitative change in the parent.

The Flow-Link tokens are maintained in the Flows-Left and Flows-Right attributes of all In-Line-Node objects. These tokens support a kind of qualitative summation of flows. As long as there is one or more tokens in one of the two attributes, there must be a flow through the node toward the port indicated by the name of the token attribute from the opposite port. For instance, one or more Flow-Links in the Flows-Right attribute indicates a flow into the Left port of the In-Line-Node and out through the Right port. A Flow-Link in the Flows-Left attribute indicates a flow in the opposite direction. There can be tokens in both the Flows-Left and Flows-Right attributes simultaneously, and that may be a source of ambiguity unless other factors favor a net flow in one direction over the other.

Figure 8A:
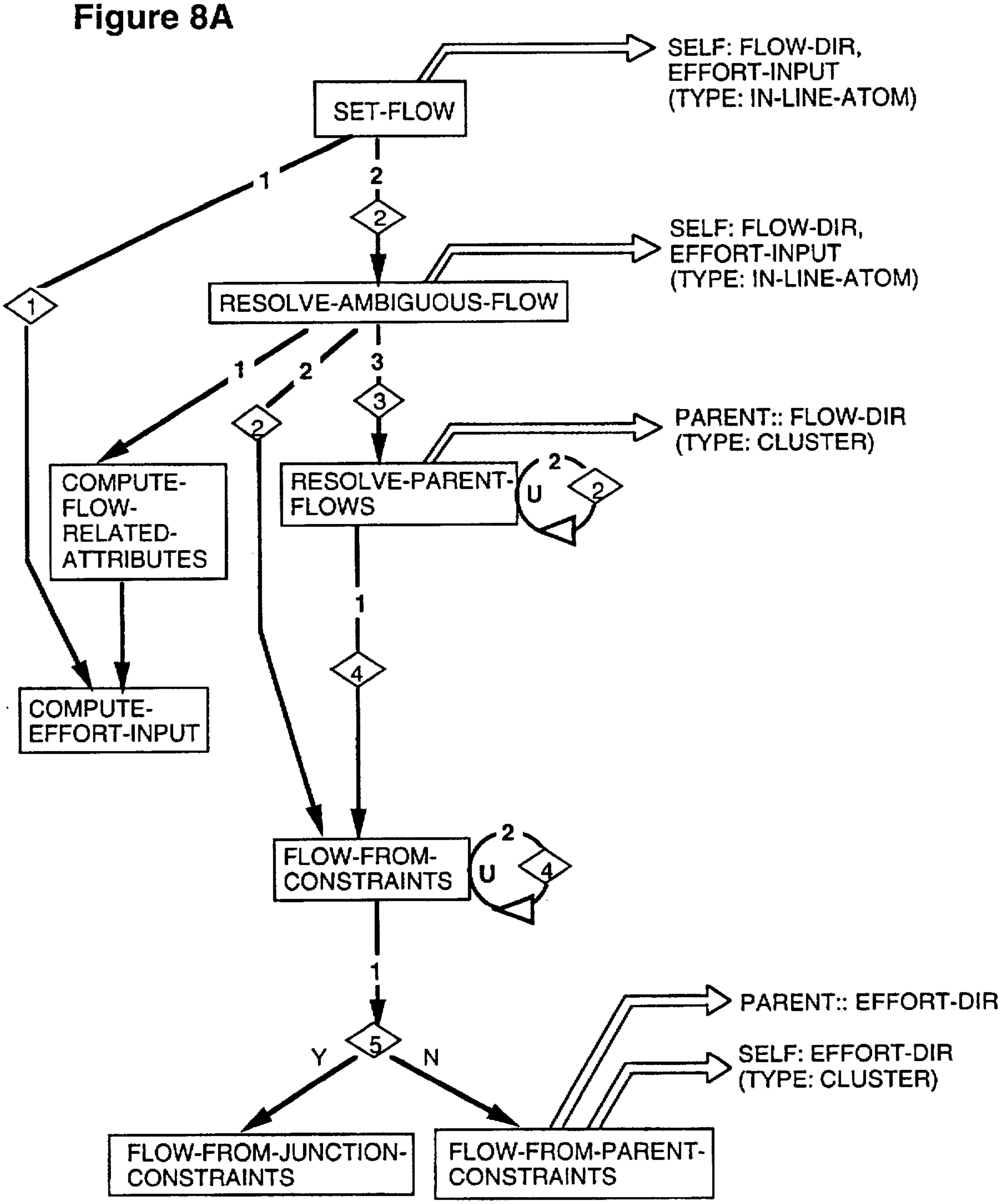
FIG. 8A is a calling diagram for Phase II of flow-path determination during discrete event simulation, in which flow direction and flow-related attributes are determined for affected nodes.

A diagram of Phase II procedure calls is shown in FIG. 8A. The conditions for the decision points (diamonds) labeled 1 to 5 in FIG. 8A are given in the legend of FIG. 8B. In Phase II, the Flow-Dir and Effort-Value are set for only those nodes and clusters on the *Affected-Nodes* list created in Phase I. The Phase-II computations are often straightforward when there is only a single effort-source in a strongly-connected component of a flow-network; the Flow-Dir through a node is in the direction of the non-NIL token attribute and the Effort-Input is the same as the Effort-Value of the single Effort-Source or Flow-Source responsible for a flow reaching the node.

In situations where both flow-link attributes are non-NIL, several approaches are pursued to automatically determine the values of Effort-Input and Flow-Dir. Spurious qualitative ambiguities may arise when more than one effort source is present in a system or when a single effort source is positioned in certain Ways in a non-SP topology. Three different techniques are exploited to minimize spurious qualitative ambiguities. The first technique, derived from the literature, exploits the constraints on flow imposed by the flow orientation inherent in some components. The second technique resolves ambiguities by distinguishing qualitative values of significant magnitude from those of relatively insignificant magnitude. The third technique for resolving ambiguities exploits the qualitative difference between the constraints on flow imposed by flow sources, for which flow is the independent variable, and the constraints imposed by effort sources, for which effort is the independent variable. In the FPMM computational scheme, flow and resistance have been combined into a qualitative-potential variable, so flow is not an explicit property of a flow source in FPMM. This representational difficulty is overcome by giving strict precedence to the qualitative potentials induced by a flow source in other system nodes over the qualitative potentials associated with any effort sources. The user is queried as a last resort—a circumstance that probably indicates either a modeling error or a fault condition in the simulated system.

The separation of computations into these two distinct phases allows conflicting indications of flow direction to be recorded for each atomic node in Phase I so that all such indications are known for all nodes before the actual decision of flow-direction is made in Phase II. It also facilitates integration with discrete-event simulation, since Phase II can be deferred until the end of a discrete-event time slice and the Flow-Dir and Effort-Input cannot take on more than one value during a time slice.

2. Details for Implementing the Preferred Embodiment (A) FPMM Architecture and Data Structure Generation Data structure generation for the FPMM of CONFIG3 is implemented in source code files FPMM-Gen.LISP and CONFIG-Flow-Paths.LISP. The later source file is an interface layer between FPMM, which has no direct representations of CONFIG data structures, and CONFIG proper. Simulation-time flow computations for the FPMM are implemented in a source file FPMM-Ops.LISP. FPMM simulation time operations are discussed below after discussion of the FPMM data structure generation.

The Flow Problem in Qualitative Modeling and Discrete Event Simulation

A major purpose of CONFIG is to serve as a tool for creation of qualitative models of physical systems from a library of reusable device descriptions and for analyses of the modeled system's behavior using discrete event simulations (DEVS). Because CONFIG device descriptions are intended to be reusable in a wide range of systems, possibly with very different purposes, these device descriptions should ideally be independent of assumptions based on the global properties of the system(s) within which instantiations of the device descriptions will be incorporated. While there are practical limitations to total independence, all such global assumptions should at least be made explicit and should, at a minimum, not restrict the usability of the descriptions to a single configuration of one system.

Past experience with modeling using earlier versions of CONFIG has shown that fluid flow is one of the most difficult aspects of physical behavior to simulate using only "local" behavior descriptions. Central to the difficulty is the fact that a flowing substance within a system is an entity that cannot be represented directly within the device ontology. The state of a continuous fluid entity at one point in a network of connected devices is affected by the processes to which it is subjected at other points, and the behavior of one device may therefore be affected by the behavior of another remote device via the fluid medium, some effects being propagated at the speed of power transmission in the fluid (e.g., the speed of sound in a fluid) and others at the rate of flow.

Within a "pure" device ontology, the direction and magnitude of flow must be determined strictly from the inputs the device receives with no reference to the identity of the inputs' origin.

Qualitative Potential and Flow Rates

Although no meaningful qualitative equivalent exists for expressing the value of a potential drop across a device according to Ohm's and Kirchof's laws, it was found that it was still useful to express qualitative potential as a measure of deviation from a "nominal" or median expected value.

This notion has been expanded upon somewhat in the FPMM design described here and can be expressed as follows:

IF there is flow through node *d* THEN $p(d)=Q+(E)$ where p(d) is the potential drop across node d and E is the list of all effort values of nodes in the union of the sets of nodes for closed circuits that contain node d. If node d itself has infinite resistance, the set of closed circuits is of course the empty set, and p(d) must be some qualitative value corresponding to zero. A "closed" circuit is a set of nodes on any cycle for which each node has a non-infinite resistance (i.e., a non-zero conductance). The function Q+ is a function that can perform a qualitative summation of the list of efforts, E, acting on device d. In the design presented here, the result of performing a Q+ on a list of effort values of more than one member is always ambiguous, unless the items in the list are all of differing magnitudes, in which case the result is the item having the greatest magnitude in the list E.

A further assumption can then be made that the rate of flow through a device is proportional to this summation of the efforts inducing flow in the device without regard to the resistance of the device or others in the circuits on which it is located. This second assumption can be explicitly represented with CONFIG processes to compute, for example, the rate at which a container fills or empties during a discrete event simulation. Because assumptions on the relationship of the qualitative potential to flow rate are represented using CONFIG processes, this FPMM design is not directly concerned with it. The FPMM computes only qualitative potentials and the presence or absence of flow and this information is then passed on to the CONFIG modules that handle execution of user-defined device processes. Forbus and DeKleer, 1993, *Building Problem Solvers* gives an almost identical treatment to express qualitatively the relationship of heat flow to the temperature difference between two physical objects in contact:

(Q=(flow-rate ?self)(−(temperature ?*src*)(temperature ?*dst*)))

where, ?self is a process in Forbus' Qualitative Process (QP) theory describing a flow and ?src and ?dst represent the two physical objects of (possibly) differing temperatures. This QP expression states that the rate of heat flow is qualitatively equal (and quantitatively proportional) to the difference in temperature between the ?src and ?dst objects in thermal contact. Temperature is the measure of potential associated with the flow of heat (or more accurately, the flow of entropy) in thermodynamics. Borrowing from Forbus the "Q=" predicate, and generalizing to any kind of flow, a CONFIG process referencing the qualitative potential may assume a flow rate expressed in Forbus' functional notation by the assertion that:

(Q=(flow-rate ?*d*) (*p* ?*d*))

is true, where ?d represents a device and p represents the qualitative potential. This relation can be used to determine the simulation time delays between postings of "incrementing" or "decrementing" events on the CONFIG event queue for variables representing the level of fluid in a container; the rates of filling or emptying of a container will be inversely proportional (quantitatively) to the time delays used.

There are of course limitations to the fidelity of the models constructed under these simplifications; there may well be systems, for example, whose working principles involve changing the potential across devices by reconfiguring the system in such a way as to increase or decrease the upstream resistance to a device or changing the total quantitative resistance of a circuit. The working principles of such systems cannot be accurately modeled with the current FPMM design. These limitations, however, should still allow reasonable qualitative models of many, if not most, conceivable systems. In any event, the simplifying assumptions can be made explicit in the section of the CONFIG user's guide concerned with modeling flow and power transmission.

Topological Representations of Flow

With the exceptions of a few bond graph reasoning systems, most qualitative reasoning tools do not treat flow as a phenomenon distinct from others occurring in a system. Bond graph representations, while providing the basis for rigorous quantitative and qualitative analysis of flow, are still low-level component representations that do not characterize the topology of the system. One qualitative reasoning system called ARC did incorporate topological representations useful for efficient computations of flow, for automating the process of switching perspectives in qualitative reasoning. One aspect of this work was to develop efficient means of examining the properties of large regions of a system so that the global constraints on their constituents could be determined and so that regions in the "active configuration" of the system at a given time could be determined. In ARC, all components not in a system's active configuration are excluded from consideration, eliminating unnecessary search.

Figure 2C:
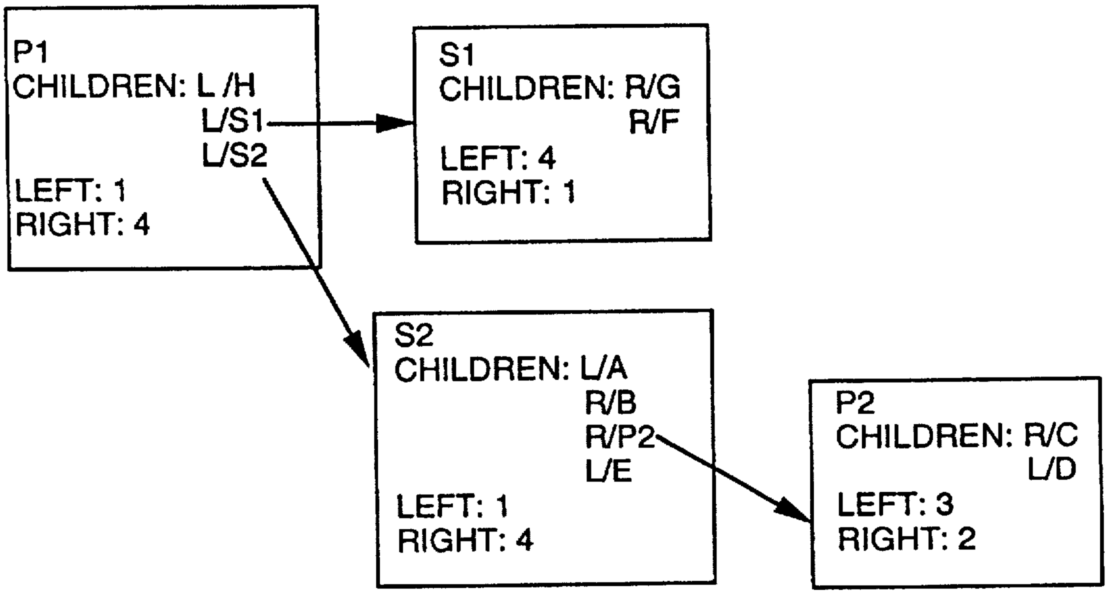
FIG. 2C is diagram of the equivalent hierarchical cluster representation of the Serial-Parallel-Reducible sub-graph of FIG. 1A.

While Liu's work on ARC was more concerned with the kind of perturbation analysis that falls outside of the scope of CONFIG's intended function, the ARC representations were found to be directly applicable to improving the efficiency and representational power of the FPMM design. Liu used graph "clustering," that is subgraphs of a system's flow network. Liu used two kinds of cluster representations: Serial Clusters (S-Clusters) and Parallel Clusters (P-Clusters). S-Clusters correspond to specialized 1-junctions of bond graph theory, and P-Clusters correspond to specialized 0-junctions. On illustration of clustering as adapted to the FPMM is shown in FIGS. 2A and 2C.

Unlike bond graphs, a Serial-Parallel (SP) cluster representation of a system is hierarchical. Each Parallel cluster has a set of child nodes. Each P-Cluster child may be either an "atomic" node (i.e., an original system component) or an S-Cluster. Each S-Cluster also has a set of children, which may be either P-Clusters or atomic nodes. An S-P graph of a flow network is therefore a tree structure, with P-Clusters and S-Clusters at alternating levels in the tree.

Both types of clusters can be treated as components, and have exactly two connections to all external regions of the flow network. Any flow from an external source must enter the cluster at one port and exit at the other, just as for an atomic two-port node.

While ARC, being primarily a perturbation analyzer, uses clustering to improve both computing and storage efficiencies, the CONFIG FPMM design takes advantage primarily of the storage efficiency provided. In earlier stages of the FPMM design, the only aggregate representations of system topology were objects referred to as "Circuits", and the description of a model's flow topology was to consist only of the set of all possible closed-circuit paths in the system, each being represented by a Circuit object. The number of such circuit objects needed to describe a network is on the order of the average degree of nodes in the system raised to the power of the number of nodes. SP clustering, for those systems that can be reduced to this representation, reduces the number of aggregate objects to the order of atomic nodes.

As Liu observed, there is a significant limitation on SP clustering: not all flow networks are reducible to an SP representation. He noted, however, that in many cases, a system graph may contain subgraphs that are not SP-reducible but that could still be treated as components in an SP representation. This is possible when a non-SP-reducible subgraph has only two connections to the rest of the system graph. Liu offers as an example the Wheatstone bridge, which internally cannot be represented as an SP hierarchy but which does have only two connections to the rest of the system.

We recognized that such a non-SP component aggregate could be represented internally as a collection of Circuit objects as initially conceived for FPMM, while treating the aggregate as a component in a higher level S- or P-Cluster. We refer to such aggregate objects here as "Quasi-Clusters". While the order of the number of Circuit objects within such a quasi-cluster is still combinatorially explosive, a system that is reducible to a mixture of SP and Quasi-Cluster representations will always be of more manageable size in this heterogeneous representation scheme than in a homogeneous representation consisting of a collection of circuits for the entire system.

It is also possible for a system to be reducible to an alternating hierarchy of clusters and circuits with no SP clusters. In such a topology, the quasi-clusters would have multiple circuit parents but circuits would never have more than one quasi-cluster parent. Even for this topology, there would be considerable savings in storage and performance in comparison to a pure Circuit representation.

The representation scheme selected for FPMM here is therefore heterogeneous. It has an advantage over Liu's approach because flow computations do not require the model to be completely SP-reducible. Any mixture of SP and Quasi-Cluster/Circuit aggregates is permissible. One inherent problem with quasi-clusters is that if an effort is applied across its ports, one or more nodes internal to the cluster will have a qualitatively ambiguous potential. In contrast, qualitative ambiguity occurs in SP clusters only when more than one effort source is active at the same time. But at least such ambiguities can be detected by FPMM and, in many cases, would be indicative of an overly complex connectivity in a model's design.

A partial procedure is given in this document for quasi-cluster generation, but only the capability to mix SP subgraphs with circuits is completed and has been implemented.

Clustering improves computational efficiency in the FPMM design, but unlike ARC, CONFIG cannot simply ignore all atomic nodes belonging to an aggregate that is not part of the active configuration. During a simulation, each atomic node, which in the FPMM design is a CONFIG device variable cluster, must be updated so that the device's state description will be correct.

Many devices such as electrical diodes and fluid check-valves permit flow in only one direction. Liu refers to the permitted flow direction as the "orientation" of the device. Because SP clusters may be treated as components, ARC assigns orientations to clusters. The orientation of a cluster is derived from the orientations of its children. Cluster orientations provide additional constraints that limit the search required during reasoning. The notion of orientation has been incorporated into the FPMM design and is also applied to Circuit objects.

In the terminology as adapted for FPMM, the basic components of a system may have an orientation of Left or Right relative to some frame of reference, or they may have an orientation of None, indicating that flow in both directions is permitted (the more common case). In addition to these three possible values, a cluster's orientation may be Impasse, indicating flow is not possible in either direction. The derivation of cluster orientation can be stated as follows:

For an S-Cluster, S:

IF any one child has an orientation of Impasse

OR (one or more children has an orientation of Left

AND one or more children has an orientation of Right)

THEN Orientation(S)←Impasse

ELSE IF any child, C has an orientation not equal to None

THEN Orientation(S)←Orientation (C)

ELSE Orientation(S)←None.

For a P-Cluster, P:

IF all children have an orientation of Impasse THEN
Orientation(P)←Impasse

ELSE IF All children have the same orientation, O THEN
Orientation(P)←O

ELSE Orientation(P)←None.

The orientation of a Circuit object in FPMM is derived in precisely the same way as is the orientation of an S-Cluster.

Design Requirements

Functional Requirements

Detection of Flows

During a CONFIG simulation, the data on the direction (i.e., sign) of flow and the qualitative value of potential drop will be maintained for every possible path of flow through every device on a flow path. For all resistive elements, the sign of the potential drop is always the opposite of the sign of the flow direction.

Computation of Qualitative Potentials

The notion of a qualitative potential is derived from earlier experience from CONFIG2 use tests as previously described. A qualitative potential for a device in a circuit is taken from a set of discrete values, such as "High", "Nominal", or "Low". Each such value is a qualitative expression of the difference between an effort at the input (upstream) port of flow and the effort at the output (downstream) port of flow.

The FPMM design will dynamically determine which port is upstream and which is downstream when a reconfiguration of the system or reversal of direction of an effort has occurred.

The qualitative potential is referred to as the "effort-input" in the current implementation of FPMM. The qualitative potential of a device is independent of the position of the device relative to the effort or flow sources in the system topology, unlike the case for quantitative potential where the same resistive element will have a different potential based on the value of its resistance, the element's position in the overall system topology, and the quantitative resistance and effort values of other elements in the topology.

For a resistive element exposed to a single qualitative effort source, the qualitative potential is identical to the qualitative effort value of the source. This is a reasonable assumption if and only if the resistance along the path(s) of flow between the source and resistor do not change significantly during the operation of the modeled system. If the resistance quantities are a significant factor in the operation of a system, then the type of qualitative simulation provided by CONFIG/FPMM is not suitable.

Computation of Qualitative Flow Rates

For electrical circuits, ideal resistance according to Ohms law is:

$$V=IR$$

For other flow domains, the more general expression is:

$$P=M\div(F, R)$$

The value of flow is determined given the potential. No distinction will be made between the linear and non-linear cases for resistance, and therefore no distinction between flow and qualitative potential is required for the current FPMM design. As explained above, flow and potential are treated as being qualitatively proportional. No additional computation for flow rates are performed and there is no separate state variable for the magnitude of flow. Any flow-integrating computations, such as fluid level in a container, will be performed by CONFIG processes using the qualitative potential. For example, a HIGH qualitative potential is equivalent to a HIGH flow rate. CONFIG operators for computing a level-incrementing process delay must take the qualitative potential as an argument.

Detection of Ambiguity of Flow Direction

Ambiguity in the direction of flows arising from the existence of opposing flows along a path segment will be detected and resolved during simulations.

Implementation Note:

Only the detection of ambiguity is currently supported by the FPMM.

Congruent Flows in Multiple Domains

The user will be able to model systems in which flows occur in several physical domains simultaneously (e.g., electrical and fluid). Flow topologies in the various domains may be partially or totally congruent, such as when heat is conducted across temperature gradients in a pipe by the fluid flowing through the pipe.

Implementation Note:

The CONFIG3_Demo_Build implementation currently allows only one kind of flow network in a model. Extensions to multiple flow domains is largely a matter of user-interface extensions.

Representation of Divergent Flows Within a Device

The user will be able to model any arbitrary number of flows entering at a port in a device that may be split into any arbitrary number of sub flows exiting the device at two or more device ports. The FPMM will employ a representation that is compatible with the generally-understood notion of junctions for this purpose.

Representation of Multiple Internal Connections

Multiple internal connections between a given pair of device ports will be supported, with restrictions enforced on the number of connections that the user can make to any given internal node. For example, if a device has several internal resistive elements, all must have exactly two connections to other nodes (internal or external) and any divergences of flow within the device must be represented by the use of internal junctions, which are permitted to have any number of connections greater than two.

Compatibility With Existing CONFIG Design

In CONFIG, a model often represents how substances moving through a series of connected devices are transformed and modified locally by each device in turn. This makes the precise sequence of devices encountered by a substance of primary importance. In certain kinds of analyses, the sequence of nodes connected in series is also important because the sequence indicates an ordering of the node potentials relative to some reference.

Any FPMM manipulations of the flow network representations in a CONFIG model must preserve this sequencing information.

The chosen representation must be compatible with CONFIG's current representation of discrete event sequencing information and must provide a well-defined interface for interactions between CONFIG processes and flow-related state information.

Architecture Requirements

Open Architecture

The representations of flow-paths will be readily translatable for analysis by non-CONFIG software, such as systems that perform power-transmission analyses using bond graph representations. This will allow models constructed using CONFIG/FPMM to be converted to other representations for other kinds of analyses and simulation, and for further refinements to the model including the addition of quantitative descriptions of the model.

Extensibility

The representations of flow paths will be extensible to more sophisticated qualitative and quantitative simulations and analyses of time-varying flow properties. This will allow future enhancements to FPMM functionality and/or integration of FPMM with new code modules having additional functionality beyond what is described in this document.

FPMM Architecture

The diagram shown in FIG. 1B illustrates the relationships between the two FPMM sub modules 31, 32, CONFIG proper 33, and the CONFIG Simulation module 22. Note that there is no direct communications between CONFIG and FPMM. The models constructed by the user serve as a "blackboard" for both FPMM-Ops 32 and CONFIG. The CONFIG/FPMM Classes sub module 34 of CONFIG defines classes that inherit from both CONFIG and FPMM classes and other objects that are used jointly by the two modules.

The only module with which FPMM is in direct communication is the CONFIG Simulation module 22. FPMM must know when all events in a time slice have been executed by the simulator. This is necessary because the Simulator executes events that may set flow-determinant variables and all must be known before FPMM-Ops computes new values for flow variables dependent on the determinant variable. The simulation module 22 therefore informs FPMM-Ops 32 when there are no more events queued for the current simulation time-slice.

Design

The basis of this design is an arrangement in which flow-path elements communicate with one or more "parent" objects, each representing a sub graph of the overall flow network in a modeled system. During a simulation, the elements report information on their local state and the parent objects report to their elements the status of flow-related attributes of the sub graph such as whether there is an external flow into the sub graph due to sources of effort external to it.

FPMM Path-Element Hierarchy

Figure 9:
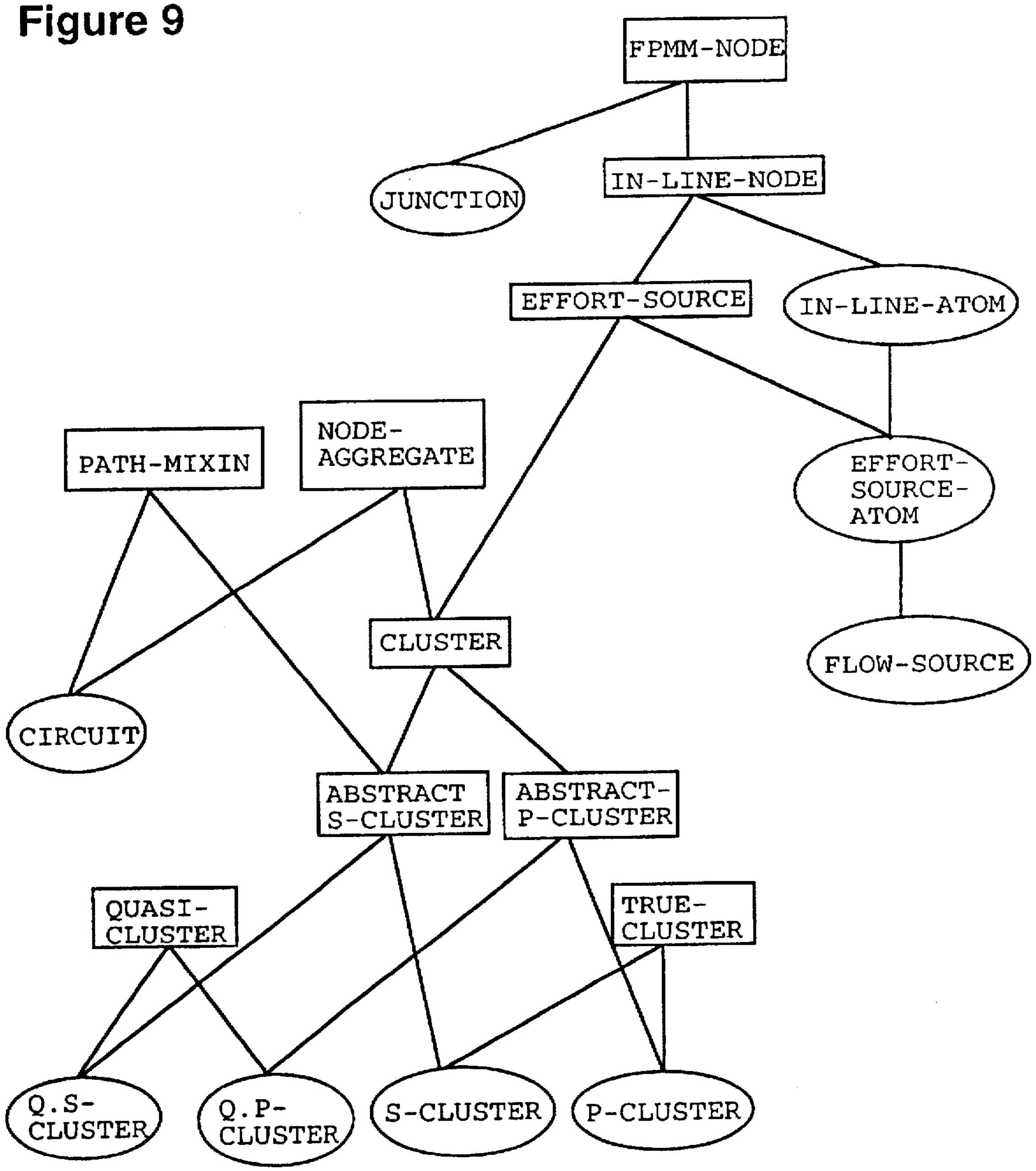
FIG. 9 diagram of the FMPP Node Class Hierarchy.

The classes of all objects used to represent flow-path topologies are given in FIG. 9. Boxes represent abstract classes and ovals represent instantiable classes. Note that the only portion of this hierarchy inherited by objects in CONFIG-proper are the 3 classes at the far right: In-Line-Atom, Effort-Source Atom, and Flow-Source, since CONFIG creates and is aware only of atomic nodes, which are variable clusters in devices. All other objects are aggregates for use in computations concerning the flow-related properties of a CONFIG system model. The various aggregates are constructed by procedures described below.

Fundamental Path Elements

All fundamental, or "atomic", elements to be added by a CONFIG user are a subclass of the CONFIG class VARIABLE-CLUSTERS that also inherit from either the FPMM class IN-LINE-ATOM or the class JUNCTION, but never both. When the user defines internal connections between variable-clusters as part of a DEVICE class definition, a sub graph of a flow network will be instantiated every time an instance of the device class is added to a model and external connections via Port variable clusters are made using CONFIG device relations. The relationship of FPMM objects to CONFIG variable clusters will be described in more detail subsequently.

Flows-Left and Flows-Right—A pair of slots named Flows-Left and Flows-Right store lists of tokens, each list indicating separate "tendencies" for flow in the associated direction. A non-empty list in the Flows-Left slot indicate flow is occurring in the direction from the right port to the left port. A non-empty list in the Flows-Right slot indicates flow in the opposite direction. When there are no tokens in one of these slots, there can be no flow, and the Flow direction and qualitative potential associated with flow are assigned qualitative values corresponding to zero. When both lists are non-empty, the direction of net flow may be ambiguous or it may be determined by other factors associated with the tokens as will be discussed subsequently. Computation of dynamic flow properties using these tokens is the primary subject of the FPMM-Operations document.

Flow-Decided?—This slot holds a Lisp Boolean (T or NIL) and indicates whether the Flow-Dir attribute (below) is valid for the set of nodes affected by a reconfiguration event during a CONFIG simulation run. See Part II of this document on the simulation-time operations of FPMM.

The slots visible to CONFIG and its users are as follows:

Pass-P—All elements are represented as fixed resistances of taking on a Boolean value corresponding either to infinite or to finite. The notion of a "zero" resistance, allowing detection of short circuits, is not included in the current design. A CONFIG qualitative value mapping to Boolean True indicates that there is a finite resistance allowing flow through the element while a value mapping to Boolean False indicates no flow is possible. "Pass-P" has exactly the same interpretation as the "Clear" variable used in the CONFIG2 modeling of flow in the TBS model.

Flow-Dir—This attribute indicates the direction of net flow as computed by FPMM based on the token lists in the Flows-Left and Flows-Right slots and related factors. This attribute is assigned a value from a CONFIG qualitative variable type that maps to a fixed set of directions: Left, Right, and None. These directions indicate respectively that flow through the node is directed towards the Left port, the Right port, or neither.

Effort-Input—A resistive element has an Effort-Input slot representing a Qualitative-Potential across the element. It may have a value from any set of qualitative values with the restriction that one of the value must be stored in the FPMM global variable ZERO. For passive elements, the direction of decreasing potential is the Flow-Dir of the In-Line-Node.

Orientation—Each resistive element also has an orientation attribute, indicating in which direction flow is permissible. This attribute is assigned a value from a CONFIG qualitative variable type that maps to a fixed set of directions: Left, Right, and None. These directions indicate respectively that flow is permissible through the node towards the Left port, the Right port, or either. Note that the interpretation of the value "None" here is the opposite of the same direction value for the Flow-Dir attribute; an In-Line-Node with an Orientation of None permits flow in either direction.

Effort Sources

Effort-Sources are treated as resistive elements when the value of the effort exerted is Zero. Effort-Sources are therefore a subclass of In-Line-Node.

Effort-sources have two attributes in addition to those inherited from In-Line-Node as follows:

Effort-Dir—The direction in which the effort source is raising the potential that motivates flow. The values are of the CONFIG qualitative variable type Direction. The semantics for direction of effort are the same as for the Flow-Dir attribute: a value mapping to Left means the potential at the Left port is greater than the potential at the Right port, a value mapping to Right indicates the converse, and a value of None indicates there is no potential difference induced by the node and therefore no flow motivated by it. The Effort-Dir and Flow-Dir will generally be the same for an Effort-Source unless the source shares a circuit with another Effort-Source having an Effort-Value that takes precedence over it. (See Effort-Value attribute below).

Effort-Value—The set of values for this attribute is the same as for the Effort-Input slot. However, the Effort-Value is the qualitative potential increase caused by Effort-Sources or Flow-Sources in a circuit. The Effort-Value and Effort-Input will generally be the same for an Effort-Source unless there is another Effort-Source on the circuit with Effort-Value of sufficiently greater magnitude such that the Effort-Value of the first source is deemed trivial in comparison to the Effort-Value of the second source, and the first source is treated as a passive node. (See the discussion of Q>> in Part II, which is an operator that is used to determine when this condition is true). Also, the Effort-Value of a Flow-Source will in some cases take precedence over the Effort-Value of an Effort-Source as will be explained in the next section.

Fundamental effort sources are in the class Effort-Source-Atom.

Flow-Sources

Flow sources are semantically similar to the bond graph elements of the same name.

Since rates of flow are equivalent to qualitative potential in this design, flow sources are represented as subclass of effort source and there is no "flow" variable for the flow-source, only the Effort-Value variable inherited from the Effort-Source class.

When an effort-source and a flow-source are on the same circuit, the effort-value of the flow-source determines the qualitative potential of all resistive elements on the circuit and the effort sources is ignored. The justification of this treatment of Flow-Sources relative to Effort-Sources is that it is impossible for an Effort-Source to affect the flow through any passive node if the only circuits that can be completed between the Effort-Source and the passive node includes a Flow-Source, which by definition determines the magnitude of flow passing through itself.

Quantitatively, the divergences of flow leaving a Flow-Source and the resistances of elements on the flow path also are determinants of the flow at a given passive node, but even quantitatively, an effort source cannot be a determinant of flow in the presence of a flow-source. If, however, a passive node can be reached by an effort source on a circuit not including any flow-sources, the effort source must be considered in computing the qualitative potential, even if the passive node is simultaneously on other circuits containing flow-sources. In such cases, the flow-sources determine only part of the flow through the node.

Details of how the qualitative potentials for nodes are computed in the presence of multiple Effort—and/or Flow-Sources are discussed below in the section entitled "Procedure Effort-Sources."

Capacitive and Inertial Elements

Capacitive and inertial elements will not be included in the implementation because their behavior inherently involves the time-derivatives of flow-related attributes that are beyond the scope of the current proposal. Representations of such elements may, however, be included in a CONFIG built-in library of abstract flow component devices at some point in the future.

IMPLEMENTATION NOTE: The Thermal Bus System (TBS) library in the CONFIG3_Demo_Build version of FPMM contains definitions implementing non-capacitive storage devices, which are those for which the rate of flow is independent of the time-derivative of potential. Capacitive storage devices, which participate in the determination of system flows and potentials, would require closer integration between CONFIG and FPMM and would constitute a significant extension to the current FPMM design.

Junctions

Junctions allow divergences and convergences of flow to be represented as stated in the Requirements section of this document. A junction node has the following properties:

It may have degree>=2.

It is assumed to have zero resistance.

Its connections to other nodes in the system are completely static.

The adjacency list of a junction is stored in the Effective-Nodes slot and consists of a list of conses of the form ((<port>.<ILN>) . . . )

where <port> is one of the symbols Left or Right, and ILN is an In-Line-Node (degree=2.)

Funcalling <port> on the <ILN> object will return the Junction object. In other words, <port> is the direction of traversal relative to the <ILN> that will reach Junction by traversing one arc. In the node aggregation procedures used to produce aggregate objects, In-Line-Nodes are treated as labeled edges between junctions, which are treated as nodes.

FPMM Flow-Related Attributes

Flow-related attributes are a subset of the attributes previously described for the various subclasses of In-Line-Node.

The flow-related attributes are those state variables of a node that either act as direct constraints on the flow through the component or are directly affected by an existing flow. These are distinct from other attributes of Junctions and In-Line-Nodes that contain auxiliary data used in FPMM's flow computations.

The flow-related attributes constrained by the states of devices are Flow-Dir and Effort-Input (qualitative potential). The constraining attributes are Pass-P (qualitative Boolean resistance), Effort-Dir, Effort-Value, and Orientation.

Flow-related attributes are defined only for In-Line-Nodes. Junctions contain no direct information on flow and can impose no constraints on it beyond their static connectivity. However, in the extensions to path element data structures made within the context of CONFIG, attributes indirectly related to flow may be added to junctions as well as In-Line-Nodes. This is discussed in the subsequent section entitled "Interface to CONFIG Behavior-Modeling Mechanisms."

Design Note:

As can be seen in the previous diagram of the FPMM node hierarchy, clusters inherit all of the attributes of In-Line-Node. All but one of these attributes are used in FPMM computations. The information on the attributes of clusters assist in efficient computation of the flow-related attributes of the In-Line-Atoms. However, the Effort-Value (qualitative potential) for clusters is currently unused. In future extensions to the FPMM design, the Effort-Value of clusters may be of use for solving problems such as the effects of time-varying resistances or other trends in the values of flow-related attributes.

Aggregate Data Structures

Several classes of aggregate data structures are defined for use in differing topologies. Certain types of clusters may be treated as components, inheriting from the class In-Line-Node, and have two "ports" to the external environment. Others have more than one connection to the external environment and therefore cannot be treated as components. Component-like aggregates have qualitative flow- and effort-direction attributes, while non-component-like aggregates do not. All aggregates share the Orientation and Pass-P attributes with In-Line-Nodes. All aggregates have a Children attribute pointing to the In-Line-Atoms or component-like aggregates that comprise the aggregate.

Circuit Objects

A previous version of this design was based completely on Circuit data structures, each of which recorded a single sequence of nodes completing a circuit. A circuit is any collection of system components defining a cyclic path such that no nodes are repeated in the path sequence. Circuit objects are non-component-like aggregates because they may have any number of connections to the external environment by junctions at points along the path. Circuit objects are always constituents of a Quasi-Parallel cluster, another kind of aggregate described subsequently.

A circuit is never treated as a network component. It maintains a list of all its children, currently inactive children, and children that are currently exerting an effort-value in either the Left or Right direction. Unlike all other aggregates, Circuits do not inherit from In-Line-Node, and therefore do not have a Parents slot. Circuits are non-hierarchical.

Serial and Parallel Clusters

The circuit approach has been extended by clustering, an approach adapted from the previously described work of Liu and Farley, for two reasons:

(1) The Circuit approach requires exhaustive enumeration of all possible cyclic paths within a flow network. The complexity of both the number of circuits needed to describe a given network and the time required to compute them is exponential. More precisely, the order is the average degree of nodes within the network raised to the power of the number of network nodes. Clustering allows entire sub graphs of a flow network to be treated as individual nodes in a Circuit. Clustering ameliorates, but does not eliminate, the computational complexity of flow-path representations by greatly reducing the number of Circuits needed to represent networks that include sub graphs that can be represented as clusters of nodes connected to each other in series or in parallel.

(2) The clustering captures information on the network topology that is lost or at least not explicit in Circuits. Namely, clusters are either serial (S-Clusters) clusters or parallel (P-Clusters). This information is of significance in determining flow directions and other properties, especially when resolving qualitative ambiguity. It should be noted that S and P clusters are somewhat similar to S and P junctions in bond graph theory, except that S clusters retain information on the sequence of the clustered objects explicitly while S junctions do not.

A diagram of a simple SP-Reducible sub graph of a flow network is shown below in FIG. 2A with the equivalent hierarchical cluster representation in FIG. 2C. Note that the positions of the Left (L) and Right (R) ports of the resistive elements relative to the page are completely arbitrary.

Because there are two and only two points at which flow can enter an S- or P-Cluster, both may be viewed as components and are assigned a pair of port attributes, just as for In-Line-Atoms. When S or P clusters are constructed, a Left and a Right port are selected for the aggregate and the selections are arbitrary as they are for the elements the cluster contain. This is illustrated in FIG. 2C showing the SP hierarchy. The Left and Right "sense of direction" for the top-level P-Cluster, P1, and for the lower-level cluster, S2, is the same as for the page, but the lower-level clusters S1 and P2, have their left-to-right sense reversed to that of the page.

In the cluster hierarchy diagram, a port symbol (L or R) is prefixed to each child. This symbol indicates which port—Left or Right—has to be entered when traversing the parent cluster from its own Left port to its Right port.

While many practical systems can be reduced to a hierarchy of S-P clusters, Liu noted that many cannot. In order to represent such SP-irreducible systems, we have determined that Circuit representations are still necessary. Prior to the construction of Circuits, Serial-Parallel (SP) reductions are performed that replace some sub graphs of a complex flow network with single nodes.

For any P-Cluster, an internal flow exists for every possible pairing of conductive child nodes in which one child is an Effort- or Flow-Source.

Quasi-Clusters

An extension to the clustering concept referred to as "quasi-clusters" is proposed, but has not been fully implemented in the first version of the FPMM. True serial and parallel clusters have quasi-cluster counterparts.

Quasi-Parallel (Q.P) Clusters

Figure 10:
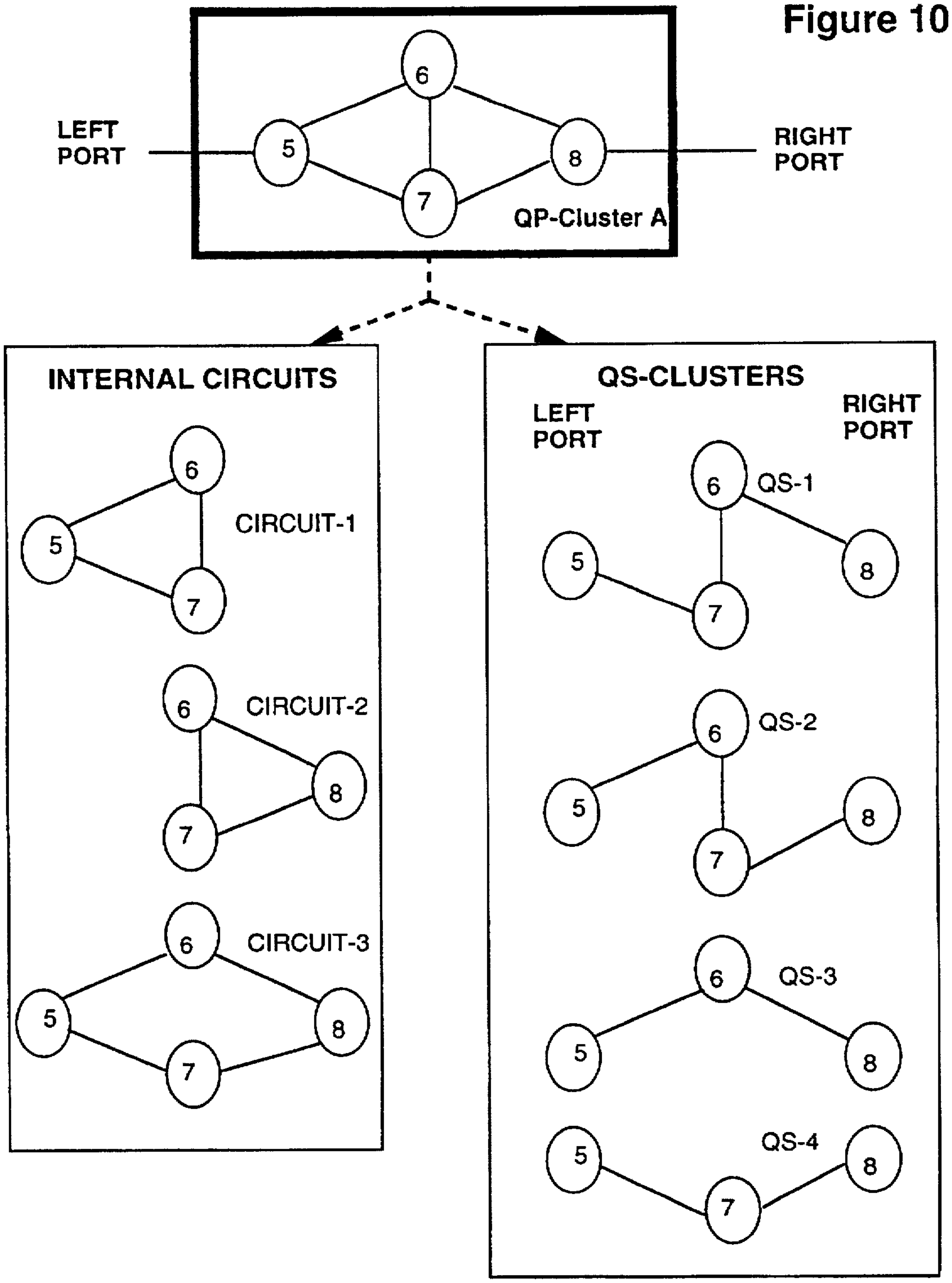
FIG. 10 is a diagram of the internal organization of a Quasi-Parallel cluster (Q.P-cluster).

Quasi-Parallel clusters (Q.P-Clusters) differ from true P-Clusters in that one or more of the child clusters will always be a Quasi-Serial Cluster (Q.S.-Cluster), described in the next section. Q.P-Clusters also require Circuit objects to describe their internal flows whereas the flow internal to a P-Cluster can be described by the loops implicit for all pairings of the P-Cluster's children. However, a Q.P-Cluster may still be treated as a network component, since it has exactly two connections to the external environment. Internally, it consists of a set of Q.S-Clusters, which are the connections between the two ports of the Q.P-Cluster, and a set of internal Circuit objects. The circuits internal to a Q.P-Cluster each indicate a flow path that is strictly internal to the Q.P-Cluster whereas a Q.S-Cluster indicates a path of flow between the Q.P-Cluster's 2 ports and out into the external network. The use of Q.P-Clusters will extend the size and kinds of topologies that can be handled before combinatorial explosion becomes a problem of storage and/or performance. The internal organization of a Q.P-Cluster into a set of circuits and a set of Q.S-Clusters is shown in FIG. 10 below. The 2-port In-Line-Nodes (atomic or Q.P-, S-, or P-Clusters) appear as edges between the junctions (ovals) in the diagram. Note that even for this simple sub graph (a Wheatstone Bridge), the number (7) of objects needed to describe it is approaching the number (9) of original "elemental" objects (junctions and In-Line-Nodes).

The Q.P-Cluster may form hierarchies, but there is in general no strict alternation between Q.S and Q.P clusters in the hierarchy as is the case for SP hierarchies. While Q.S-Clusters never have other Q.S-Clusters as children, A Q.P-Cluster may have other Q.P-Clusters as children.

Implementation Note:

The CONFIG3_Demo_Build implementation uses Q.P-Clusters in a trivial way only. A model's flow domain points to a list of top-level clusters, each of which may be either a true hierarchical S or P cluster, or A.P-Cluster with a list of Circuit objects stored in the Circuits slot. There are no lower level Q.P- or Q.S-Clusters at all, which in general are required only to more efficiently represent system topologies. Since all flows MUST be internal to a top-level cluster of any sort (no flows are allowed to leave the system) there can be no flow "through" a top-level cluster. Since describing such through-flows is the only purpose of Q.S-Clusters, there was no need to implement them in the demo built.

Resistive Elements

The class of all resistive elements is currently named "In-Line-Node", indicating an element that has exactly two connections to the external environment through which flow may pass. The class of fundamental resistive elements is In-Line-Atom, a subclass of In-Line-Node as shown in the partial reproduction of the LISP class definition below:

```
(defclass In-Line-Node (FPMM-Node)

(Parents:TYPE(SET (OR Cluster Circuit-Child-
  Envelope))
(Left:TYPE FPMM-Node)
(Right:TYPE FPMM-Node)
(Flows-Left:TYPE (SET Flow-Link))
(Flows-Right:TYPE (Set Flow-Link)
(Flow-Decided?:TYPE (OR T NIL))
(Pass-P:TYPE:TYPE CONFIG::Boolean-Type)
(Flow-Dir:TYPE CONFIG::Direction)
(Effort-Input:TYPE CONFIG::Effort-Value)
(Orientation:TYPE CONFIG::Direction))
```

The attributes of an In-Line-Node can be separated into two major categories: those hidden from direct examination or use by CONFIG by the user, and those that are visible. The purpose of the attributes hidden to CONFIG are as follows:

Parents—Each instance of In-Line-Node has a Parents slot that stores either a Part-Link or a Circuit-Child Envelope, both of which are intermediate objects pointing to one or more aggregate objects that are considered to be the parent(s) of the node. These aggregate objects are created by the aggregation procedures of FPMM-Gen. These procedures and Part-Links are described subsequently in this document. Circuit-Child-Envelopes are described in Part II of this document and handle additional complexities associated with a node that is simultaneously on many paths of flow.

Left and Right—Each resistive element has a Left and a Right port pointing to the elements adjacent to that element. A resistive element is therefore always a node of exactly degree 2. The direction, or sign, of flow-related values is directly tied to these ports. A flow-direction or orientation value of "Right" indicates flow into the Left port and out of the Right port. A flow from Right to Left indicates the opposite.

Quasi-Serial (Q.S) Clusters

Q.S-Clusters are proposed to describe paths of flow through a higher-level Q.P cluster "parent". In contrast, Circuit objects are used to describe paths of flow that are strictly internal to the Q.P-Cluster. A quasi-serial cluster (Q.S-Cluster), records a sequence of path elements, as do both true S-Clusters and Circuits. Q.S-Clusters differ from S-Clusters, however in that a Q.S-Cluster cannot be treated as a component. A Q.S-Cluster is a series that always contains at least one node of degree>2 between the first and last nodes in the series whereas a true S-Cluster's series contains only degree 2 nodes except for the first and last. In this respect, Q-S-Clusters are similar to Circuits, which may also contain nodes of degree>2. Liu and Farley refer to nodes of degree>2 as "fan-out" nodes. These are semantically identical to objects of class Junction in FPMM. Because of the presence of fan-out nodes in a Q.S-Cluster's series, Kirchoff's law of current and its analogs cannot be applied: the current (or flow) is not generally equal for elements on either side of a fan-out node in the series.

Open Issues

A procedure has been implemented for detecting a Q.P-Cluster in a network, but has not been integrated with the SP-Clustering implementation. Integration will probably result in alternating calls to SP-Clusters and Quasi-Clustering.)

Representation of Directionality

Qualitative Direction Values

Directions of flow, effort, and orientation are assigned values from sets of qualitative values, each stored in a FPMM global variable. The intersection of these three attribute sets are the set of global variables Left, Right, and None. The values of these three variables default to the symbols of the same name in the "stand-alone" mode of FPMM used for testing, but each of them contain a value object for the CONFIG Qualitative-variable-Value-Type Direction on integration with CONFIG. The interface to CONFIG is subsequently described in more detail. The Effort-Direction attribute may have the additional value of Ambiguous, and the Orientation attribute may have the additional value of Impasse. These latter two direction values are not CONFIG variable types because they are hidden from CONFIG and its users.

For any In-Line-Node, including aggregates, a value of Right always implies a direction of traversal from the Left port of the node to the Right port.

In Circuit objects, a value of Right is the direction of traversal from the Left-most (i.e., first) child node in the list of children toward the Right-most (i.e., last) child node.

Part-Link Data Structures and Relative Directionality

Since there is more to the relationship between clusters or circuits and their children than the mere assertion of the parent-child relationship, simply maintaining lists of children in the parent objects cross-referenced with the parents in the child nodes will not suffice. Instead, the Children and Parents slots maintain lists of Part-Links, which are intermediate data structures that store additional information describing the parent-child relationships. The basic Part-Link is defined as follows:

```
(defclass Part-Link ( )

((Parent:TYPE Cluster)
(Child:TYPE In-Line-Node)
(Port:TYPE (OR Left Right)))
```

The structure is more complex than this for the subclass of Part-Link used to describe the relationship of an In-Line-Node whose parent happens to be a Circuit instead of a cluster. This class, Circuit-Part-Link, is described in Part II of this document. The basic slots of all Part-Links are as follows:

Child and Parent

Since the purpose of all aggregates is computation of flow attributes for atomic nodes in CONFIG devices, the sense of direction in an aggregate relative to each child must be maintained. Every aggregate, therefore, rather than directly storing pointers to the child nodes, instead stores Part-Link objects in their Children slots. Each Part-Link contains a Child slot pointing to the child node and a Parent slot pointing to the aggregate. Each child node contains a Parents slot, described previously, that points to the Part-Link directly if the parent is a true cluster. If the parent is a Circuit, the In-Line-Node's Parents slot points instead to another intermediate object called a Circuit-Child-Envelope which in turn points to a Circuit-Part-Link.

Port

Figure 11A:
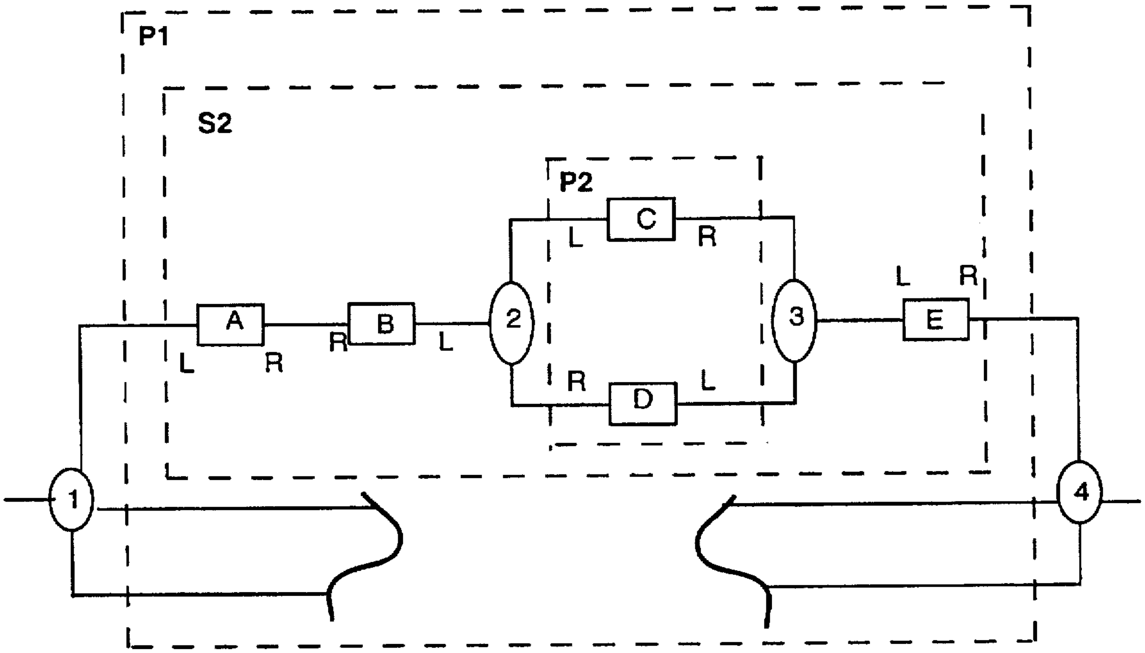
FIG. 11A is a schematic for an example of relative directionality.
Figure 11B:
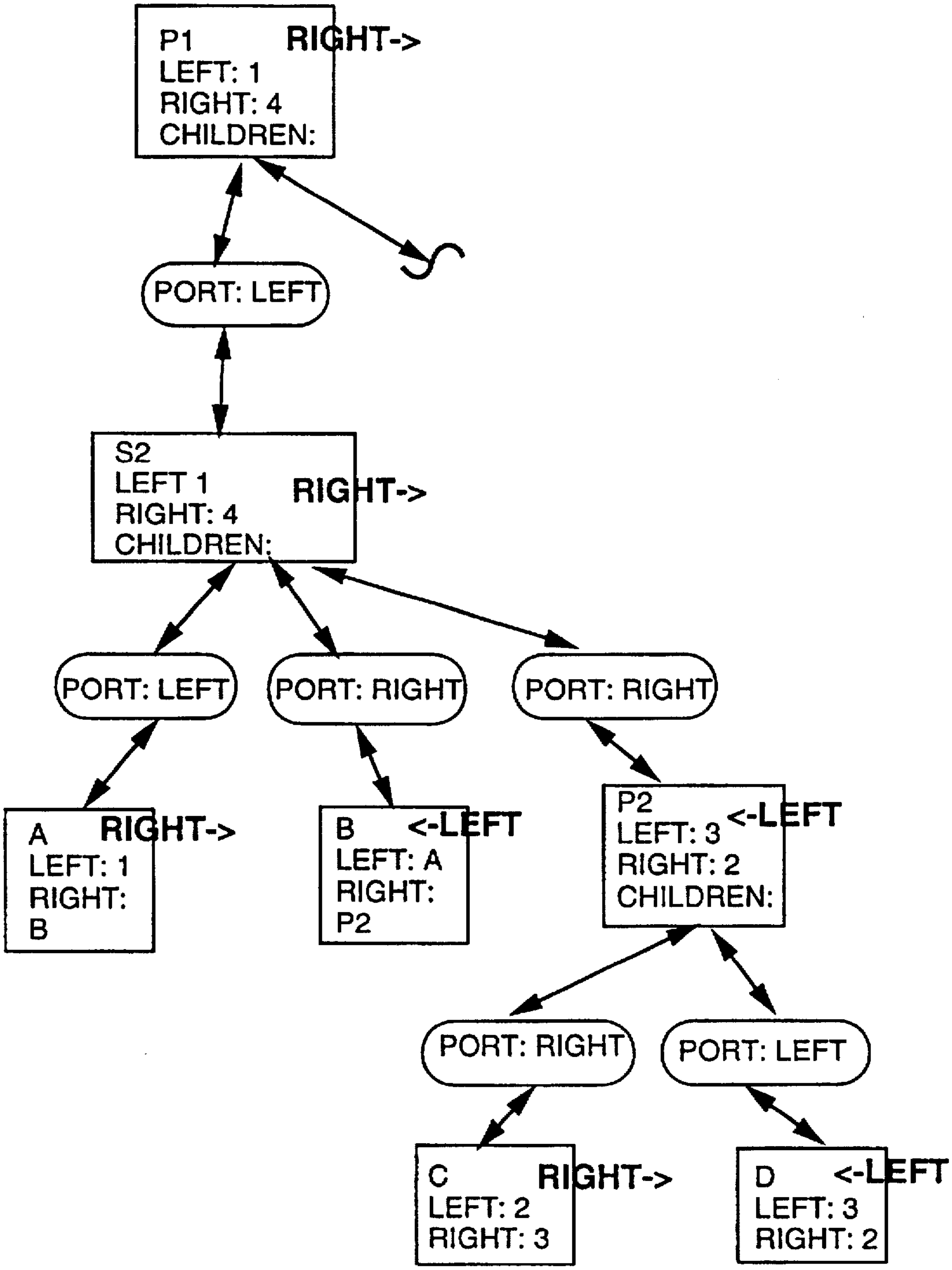
FIG. 11B is a diagram of a cluster with part links corresponding to the schematic of FIG. 11A.

In addition, each Part-Link contains a Port slot storing one of the symbols Left or Right. The Port slot indicates the Port of the child node that must be entered to traverse from Left to Right through the children of the aggregate. For example, a value of Left indicates that traversing from left to Right through the aggregate requires moving from the left port to right port in the child node. A Port value of Right indicates a reversal of this sense. A portion of the S-P circuit diagram previously referred to is repeated in FIG. 11A, but with the Part-Links included to show how relative directions are determined by the relationships between parent, child, and part-links. Note that whatever direction the parent has is the same for the child if the Part-Link's Port attribute is Left, and that the child-relative direction is inverted if the port is Right.

A special subclass of Part-Link is used for Circuit children. This class stores information that prevents the proliferation of flow tokens in computation of flow properties in circuits. This is discussed further below.

Implementation Note:

A macro Relative-Direction is provided in FPMM-Gen.Lisp, which converts child directions to parent-relative directions, and vice-versa.

Flow-Computation Tokens

FPMM-Gen defines the data structures used as tokens for recording the various influences of flow on a given In-Line-Node. The root class of these tokens is called Flow-Link. There may be many tokens for flow added to and deleted from the Flows-Left and/or Flows-Right slots of an In-Line-Node as circuits are completed or broken and as the efforts and orientations of other elements in the network change. To minimize garbage accumulation, deleted tokens are placed in a resource pool and reused as needed during a CONFIG simulation.

Because the class hierarchy and data structure designs are bound closely with the flow computation procedures, further descriptions of these data structures are given below in the section "Simulation Time Operations".

Implementation Note:

The macro Declare-Link-Resource (defined in FPMM-Gen.Lisp) and associated functions are used for resource management of flow tokens.

Interface to CONFIG Behavior-Modeling Mechanisms

The CONFIG sub module, in file CONFIG-Flow-Classes.Lisp, defines objects and classes shared by FPMM and CONFIG. These objects are the input and output of FPMM-Ops flow computations.

Design Note:

An additional module for doing qualitative integral and differential computations on flow data may be desirable. For example, CONFIG processes may interpret the effort-input (qualitative-potential) value as a determinant of rates of fluid flow which in turn may be used to compute process effect delays for incrementing fluid mass or level in a container. Such processes are qualitatively accurate only for relatively simple cases in which there are few sources of flow. The processes would often be inaccurate for networks containing multiple sources and sinks dynamically being opened and closed during a simulation. Such a "qualitative flow calculus" module would, like FPMM, construct representations of properties global to the modeled system, and would use information from both CONFIG and FPMM. Alternatively, it might be possible to simply extend the capabilities of the current CONFIG-Flow-Classes module.

Flow Domains

Each instance of the class Flow-Domain stores the structures created by FPMM-Gen to describe the flow of a single type of substance however the user chooses to define a substance "type". The objects are stored in a list in the Clusters slot of the Flow-Domain object. Each cluster represents a strongly-connected component of the flow network's topology. The term "strongly-connected component" as used here refers to an undirected graph in which, for each node, every other node is reachable by at least two paths that share no nodes in common.

Each CONFIG model contains a Flow-Domains slot for storing a list of domains because, in general, a CONFIG model may require multiple flow domains to be represented, such as, for example, an electrical domain and a fluid domain.

For each Flow-Domain, a Domain-Power-Junction, which is simply an instance of the FPMM class Junction, is defined. These special hidden junctions are used to represent the transmission of power between the system and the environment. The use of domain power junctions in the connections made to Storage-VCs is explained in the next section.

Implementation Note:

In the CONFIG3_Demo_Build implementation the CONFIG-Flow-Classes module and associated UI functionality, are not fully equipped to handle the construction of multiple flow-domain representations. The TBS model constructed for integration testing had only a single flow domain.

CONFIG Variable-Clusters and FPMM Objects

Dual CONFIG/FPMM Class Inheritance

The region in the class hierarchy where objects share a common inheritance from the CONFIG class Variable-Clusters and FPMM path element classes is shown in the diagram of FIG. 3A. The CONFIG classes shown provide only semantic distinctions among the instantiable classes shown; all attributes visible to the user and user processes are inherited from the FPMM path element classes and have been previously described.

A user of CONFIG may define subclasses for any of the extensible classes in the diagram and add new state variables to the subclasses. These additional variables may be used to contain information indirectly related to flow, such as the impurity content or phase of a fluid that is propagated by flow from one device to another. Unlike the attributes directly related to flow defined in FPMM, such indirect flow attributes may be defined for Variable-Clusters subclasses inheriting from Junctions as well as those inheriting from In-Line-Nodes. Properly updating these variables would require reference to the direct flow-related attributes by device processes defined in CONFIG.

Description of Flow-Related Variable Cluster Classes

The CONFIG semantics of the CONFIG superclasses are as follows:

Flow-VC—The class of all Variable-Clusters that are also elements in the flow-path representations constructed and managed by FPMM.

Junction-VC—The class of all Variable-Clusters that are nodes that may be of degree>2 from the FPMM perspective. The FPMM class Junction was described previously.

Internal-Flow-VC—The class of all Flow-VCs that are internal to devices from the perspective of CONFIG as opposed to device port variable clusters, which are the points of connection between devices.

Flow-State-VC—The class of all Flow-VCs that are FPMM In-Line-Nodes (i.e., degree 2 nodes). The flow state variables of a device are stored in instances of these variable clusters. All the FPMM attributes are recognized by CONFIG as device state variables. The process of updating these variables are the only way that CONFIG and FPMM interact during a simulation. Due to the importance of Flow-State-VCs in the simulation-time integration of CONFIG with FPMM, these interactions are more fully described in a subsequent section, entitled "Protocol for Accessing Flow-Related Attributes."

Flow-Port-VC—The class of Junction-VCs that are also CONFIG port variable clusters. FPMM In-Line-Nodes are never port variable clusters. Since the flow-related attributes such as qualitative potential are always properties internal to a device, they are not needed in port variable clusters. All instances of Flow-Port-VCs in a device instance will be connected to one or more Flow-Port-VCs in other devices. In general, any given Flow-Port-VC should be connected via a device relation to only one other Flow-Port-VC. The graphical appearance of the connections in the CONFIG digraph display can be highly misleading otherwise. Since Flow-Port-VCs will often be connected to only one internal node, Flow-Port-VCs will tend to be of degree 2, and are therefore extraneous from the standpoint of FPMM. All extraneous junctions are removed and their connections are merged with the remaining junctions by FPMM prior to clustering. This process does not affect the connectivity as viewed from the CONFIG perspective, since the CONFIG device relations between ports are never disturbed.

Internal-Junction-VC—This is intended for inclusion in device definitions in cases where a device has more than one internal Flow-State-VC and they are connected to the device ports in such a way that an internal junction is required. The term "VC" is something of a misnomer, even though it inherits from that class. This class is strictly to provide connectivity and no subclasses should ever be defined for it by the user.

Implementation Note:

The only reason why

Internal-Junction-VC is defined as a variable cluster is so that the existing CONFIG3_Demo_Build user interface for adding variable clusters to a device definition may be used for these objects. In Build3, this should be changed to a non-VC object. Since some models will have multiple flow-domains, each such internal junction should also be labeled with a specific flow-domain so that illegal inter-domain connections cannot be made accidentally by the user.

Storage-VC—The class of all Flow-State-VCs for which the Right port is automatically connected to the flow-domain environmental power junction. The user connects only the left port of Storage-VCs to other variable clusters in a device. This class allows one-port storage containers to be represented in a model. The implicit power transfer to the environment occurring, for example, during liquid flow into an open container, is represented by "virtual" circuits that include the domain junction. From the perspective of FPMM, there is no difference between Storage-VCs and in-Line-Nodes. The connectivity appears different only from the perspective of CONFIG.

Effort-VC—The class of Flow-State-VCs that are effort-sources in the bond graph sense. These variable clusters must be included in the definitions of devices such as pumps and batteries.

Flow-Source-VC—The class of Flow-State-VCs that are flow-sources in the bond graph sense. These variable clusters must be included in the definition of such devices as an electrical current supply.

Effort-Storage-VC—Instances of this class are equivalent to a pair consisting of an Effort-VC and a passive Storage-VC connected in series. This class is defined to avoid the redundancy of attributes in the equivalent pair of nodes.

Flow-Controlling-Storage-VC—Instances of this class are equivalent to a pair consisting of a Flow-Source-VC and a passive Storage-VC connected in series. This class is defined to avoid the redundancy of attributes in the equivalent pair of nodes.

Implementation Note:

In the CONFIG3_Demo_Build implementation, there is also a definition object for each Variable-Clusters subclass. This is needed for that version of CONFIG in order for the user to extend the class hierarchy. The concept of definition object will be merged with the CLOS user-extensible class definitions themselves in Build 3 so that the parallel sets of objects can be dispensed with.

Implementation Note:

In the CONFIG3_Demo_Build implementation, no checking is done by the User Interface functions to ensure that multiple connections are not added to Map-Nodes that map to device variable clusters inheriting from FPMM In-Line-Nodes. Map-Nodes and Flow-Maps are described subsequently.

Junction-Devices

A special class named Junction-Device is also defined. This pseudo-device contains a single VC slot which can be set to take any VC inheriting from Flow-Port-VC. Unlike true CONFIG devices, the class of the VC can be determined on instantiation of a Junction-Device, so the user does not have to define any subclasses of Junction Device. The purpose of a junction device is to permit junctions external to any true device to be added to a model. The Flow-Port-VC in a Junction-Device may be connected via Device-Relations to true devices or to other Junction-Devices.

Conversion of CONFIG Models to FPMM Graph Representation

Each device class defined by the user has a Flow-Map, a Digraph object similar to the CONFIG device Mode-Transition-Digraph (MTD). For each of the Variable-Cluster slots defined for a device that is specified as containing a VC inheriting from an FPMM class, a corresponding Map-Node is inserted into the Flow-Map. The user must connect these Map-Nodes together to define the internal connections of the device that carry flow when an instance of the device is connected into a model by flow relations.

There are only two classes of map-nodes, the Flow-State-VC-Map-Node, and the Junction-VC-Map-Node classes.

The former inherits from the FPMM class In-Line-Node and the latter from the FPMM class Junction. Each variable cluster in a device definition inheriting from the FPMM class In-Line-Node (and therefore the CONFIG class Flow-State-VC) is associated with a unique instance of a Flow-State-VC-Map-Node. Each variable cluster in a device definition inheriting from the FPMM class Junction (and therefore, from the CONFIG class Junction-VC) is associated with a unique instance of a Junction-VC-Map-Node in the device class Flow-Map. The association of the Map-Node to the variable cluster is made by a Map-Node slot, Mapped-VC-Slot so that when the LISP form:

```
(funcall (Mapped-VC-Slot map-node) device)
```

is evaluated, the instance of the variable-cluster corresponding to map_node in device will be returned. Each time the FPMM-Gen sub module is called to construct the graph of flow for the modeled system, the first step is to establish the internal device variable-cluster connections for each device. For every two pairs of a map-nodes: {Map-Node1, Map-Node2}. If there is a connection between the map nodes, a connection will be made between the two corresponding variable-cluster instances referenced in the Mapped-VC-Slot of the Map-Nodes. The FPMM indicates connectivity for Junctions in a different manner than for In-Line-Nodes. Associating the variable-cluster with a Map-Node inheriting from the same FPMM class as itself ensures that the correct connection method will be used.

When a model is completed, the CONFIG-Flow-Classes combines adjacency information from external device connections indicated by CONFIG Device-Relations connecting devices with the information on internal connectivity created by reference to the class allocated device flow-maps. This produces the complete digraph representation of the modeled system used by FPMM.

FPMM-Gen expects no junctions to be adjacent to each other, while CONFIG modeling requires connections between the Flow-Port-VCs, which are FPMM Junctions, of two devices. Therefore, part of the conversion process performed by this module is the removal of one in each pair of adjacent junctions and merging the adjacent nodes of the remaining junction with the nodes adjacent to the removed junction.

The representations used by FPMM make no reference to CONFIG concepts of devices and relations.

Qualitative Value Types

Direction Value Types

The CONFIG-Flow-Classes module defines the Qualitative-Variable-Value-Types "Direction" and sets a global variable in the FPMM module to each of the value objects in the value set of type Direction. The FPMM variables are Right, Left, None, Ambiguous, and Impasse. The CONFIG value objects stored in them have the same print-name as the print-name of the associated FPMM global. For example, the print-name of the value object in the FPMM global variable Left has the print-name "Left," which will appear in any CONFIG process statements referencing this value. This correspondence of print-names facilitates consistency of the semantics used in the FPMM with the semantics of process statements written by the CONFIG user. The Direction value set is the union of all direction values of the FPMM flow attributes Effort-Dir, Flow-Dir, and Orientation. Each value is in the Value-Set of the CONFIG Qualitative-Variable-Value-Type named "Direction". The user is not allowed to modify these definitions.

Effort Value Types and Magnitudes

The FPMM-Ops sub module computes qualitative effort values. The FPMM Effort-Dir attribute, is assigned a value from the set of values stored in the global variables named Left, Right, and None. The interface module between FPMM and CONFIG proper sets each of these globals to a different instance from the value set of Direction, a CONFIG Qualitative-Variable-Value-Type defined in the interface module.

The value of Effort-Dir corresponds to the sign of the Effort-Value in the Effort-Source-Atom and Flow-Source classes. In other words, an Effort-Dir value of Right may be thought indicating a "+" sign on the Effort-Value and a value of Left to a "–" sign. An Effort-Dir of None appears only with an Effort-Value of Zero. Similarly, the Flow-Dir corresponds to the sign of the Effort-Input, which is the current FPMM name for qualitative potential across a resistance in resistive nodes.

The Q>> Function and Order of Magnitude in Effort-Values

The CONFIG-Flow-Classes module defines the Effort-Value Qualitative-Variable-Value-Type with a value set consisting of seven (7) values that are, in order of increasing numeric value, named Zero, Low1, Medium1, High1, Low2, Medium2, and High2. The FPMM global variable Zero is set to the Zero Effort-Value object by the CONFIG-Flow-Classes module. The Zero Effort-Value object is defined so that the object's print-name as it appears in CONFIG process statements will also be "Zero".

Implementation Note:

For system having multiple flow domains, each flow-domain will have its own set of effort value objects. In the demo build, there is only one flow-domain. The FPMM-Ops module should be extended so that, whenever an event occurs during simulations that requires FPMM computations, the FPMM global variable Zero should be set to point to the Zero value object for the particular domain affected before computations proceed.

The value set of the Effort-Value value type is partitioned into two separate lists of High-Magnitudes and Low-Magnitudes. Values from Zero to High1 are in the Low-Magnitude list and values Low2 through High2 are on the High-Magnitude list. The FPMM module has no direct access to this list. Instead, a method is defined for the FPMM generic function, Q>>, which returns true only when the first argument to the function is in the High-Magnitude list and the second is in the Low-Magnitude list. A default Q>> method is defined so that all values are greater than Zero, which is also the name of an FPMM global variable which is set to contain the CONFIG Zero value object.

Design Note:

The current implementation provides no mechanism for user-defined effort-values and magnitude sets. This is primarily a user-interface issue because the FPMM requires no direct knowledge of the nature of the Effort-Values. It requires a definition only of the Q>> methods for value objects. The user should be allowed to define any number of effort-value sets for differing flow domains and to partition any such value set into magnitude subsets for use with the Q>> function.

Protocol for Accessing Flow-Related Attributes

CONFIG users and user-processes are intended to have read-write access to some Variable-Cluster flow-attributes, and read-only access to others. The table below shows the access protocol, where R indicates CONFIG processes may reference these variable in invocations but are not allowed to set their values in process effect statements.

R/W indicates that CONFIG processes may both read and write the value of the variable.

| ATTRIBUTE | ACCESS |
|---|---|
| Effort-Dir | R/W |
| Effort-Value | R/W |
| Orientation | R/W |
| Pass-P | R/W |
| Flow-Dir | R |
| Effort-Input | R |

Setting of an R/W variable by CONFIG initiates FPMM computations whose output are the R variables in Flow-State-VCs.

Implementation Note:

This protocol was adhered to in the modeling of the Thermal Bus System model created in the CONFIG3_Demo_Build, but is not enforced by the User Interface or the CONFIG3-Flow-Classes sub module. The latter is most likely the best location to implement the access protocol because some AROUND methods on the accessors for the various read-only attributes can be put in place to trap attempts by either the user or a user process to set a read-only attribute.

Procedures for Generating Topological Representations

Each time a Device-Relation is added to a model or deleted from it in such a way that the flow topology has changed and each time the internal Flow-Map is modified for a device class for which instances exist in a model, a completely new set of Clusters is created and any existing representational objects are discarded. This approach is much simpler to implement than incrementally changing an existing representation although more garbage is generated. The aggregation procedures are summarized below.

Implementation Note:

In the CONFIG3_Demo_Build implementation, validation procedures are only partially implemented to ensure that a model's flow-network consists of a set of strongly-connected components (i.e., sub graphs in which every node is reachable from every other node by at least two paths with no nodes in common except the origin and destination.

IMPLEMENTATION NOTE:

The CONFIG3_Demo_Build version calls the network-aggregation functions each time any device or relation is added or deleted from the model. The more discriminating set of conditions described above should not require a large expenditure of time to implement.

Procedure Cluster-Domain

This procedure is defined in the CONFIG-Flow-Classes module. In this procedure, junctions are treated as the nodes and nodes in the FPMM class In-Line-Node are treated as edges connecting the junctions, and does the following, for the Flow-Domain that is an argument to the procedure:

Procedure steps:

(1) Create a copy of the list of Flow-Domain junctions for destructive modification by the procedures called.

(2) Repeat until all junctions have been removed destructively from copied list of junctions Call Procedure Cluster with two junctions arbitrarily chosen from the current junction list as arguments.

If the procedure returns a P-Cluster object, push it on the list in the Top-Clusters slot of the domain.

The procedure returns NIL if no P-Cluster can be constructed with the two junctions as input and output ports.

(3) If the copied junction list is not empty, then some sub graphs of the flow-network are not reducible to SP hierarchies, so create a Q.P-Cluster and push it onto the Top-Clusters list of the domain.

It is used to store all circuit objects created below. Create an empty list of In-Line-Nodes (ILNs) that are either In-Line-Atoms or true clusters created in step (2).

(4) Until the copied list of junctions is empty

Repeat

For each Junction, J, in the copied Domain junction list

For each ILN adjacent to J

Call Procedure Build-Circuits

Add the circuits to the Circuits slot of the Q.P Cluster.

Push the ILN onto the list of origins.

(5) For each ILN in the Domain's list of Atomic-Nodes that does not have a parent cluster or circuit call the Procedure Build-Simple-Circuit. This is done for the simple case of a circuit consisting of ILNs with no junctions. Any ILN not assigned a parent cluster or circuit(s) in steps (2) and (4) must be in such a simple, junction less circuit.

Design Note:

If a non-trivial implementation of Q.P-Clusters is done, this procedure will be changed radically. Creation of quasi-clusters and true SP-Clusters will be an alternating process because, as non-SP aggregates are reduced to single nodes, additional SP clustering may be possible.

Procedure Cluster

The procedure here is based on finding a base-path between two junctions, an <origin> and a <destination>, which are never the same junction. This pair of junctions is selected arbitrarily from the list of junctions for the flow-domain. During the path traversal, S-Clusters are created as they are found. The initial S-Clusters are series of In-Line-Nodes not separated by any junctions.

The procedure creates a two-dimensional array, where the index pair, (j, k) references an initially empty cell in which is stored a cluster or In-Line-Atom connecting the j-th junction in the base-path list and the k-th junction. Every cell (j, j+1) is initialized with the In-Line-Node that is adjacent to both junctions on the base path (there may be more than one ILN adjacent to a given pair of junctions, but only one such ILN will be on the base path). In effect, the In-Line-Nodes are treated as the edges between junctions. The contents of each cell (j, k) is then replaced by a cluster created by a recursive call to Cluster, and may be a P-Cluster or an S-Cluster created by the recursive call.

Repeated passes are made through the array with increasingly large differences in the j and k indices, on each iteration making a recursive call to Cluster followed by a call to an auxiliary procedure named P-Combine.

P-Combine determines if a P-Cluster can be created between the jth and kth junction due to earlier clustering iterations with smaller kj intervals. For each index h, j<h<k, P-Combine calls S-Combine.

S-Combine attempts to merge P-Clusters and/or S-Clusters created from earlier recursive calls to Cluster and/or In-Line-Atoms at cell locations (j, h) and (h, k) into a single S-Clusters between (j, k). An S-Cluster can be created whenever junction h has been reduced to degree 2 by the earlier clustering. When more than one S-Cluster with indices (j, k) can be created from the calls to S-Combine, there is a P-Cluster between j and k. If cell (j, k) already contains a P-Cluster created on a recursive call to Cluster, the new S-Clusters are added to its list of children. If cell (j, k) contains an S-Cluster or In-Line-Atom, a new P-Cluster is created and stored in cell (j, k).

The Left port of a new P-Cluster at cell (j, k) is initialized with junction (j) and the Right port is initialized with junction (k).

Whenever P-Combine creates a new P-Cluster between junctions j and k, the degree of both junctions is reduced by the number of children added to the P-Cluster. The reduction in the number of nodes adjacent to a junction will then allow further S-Clusters to be created whenever the degree of the junction is reduced to 2.

When Procedure Cluster can create a P-Cluster or S-Cluster between the zero-th and last junction in the base-path, that is returned to the calling function. If no cluster can be created, NIL is returned, indicating that there is no way to create a true cluster between the origin and destination nodes that were the arguments to the procedure.

Design Note:

This clustering technique differs from the approach taken by Liu in that the procedure employed by Liu is not based on path construction. Liu's procedure is based on making repeated passes through the list of all junctions in the graph, removing those that can been subsumed by an S- or P-Cluster. Path construction was made the basis for S-P clustering for two reasons. First, path construction is necessary for building Circuit objects and this procedure allows re-use of the same path-construction functions. Second, an earlier conception of quasi-clustering also required path-construction, and the procedure was initially designed to create both P-Clusters and Q.P-Clusters. It was found, however, that the earlier quasi-cluster representations did not contain sufficient information to do flow computations and was abandoned. However, the newer conception of quasi-clustering, which is given subsequently, is not based on path construction, must be interleaved with SP-clustering, and share some similarities with Liu's approach.

If the new quasi-clustering technique is at some point incorporated into FPMM, the non-path-based SP-clustering employed by Liu should probably replace the current approach for better integration with quasi-clustering.

Procedure Quasi-Cluster

Assuming that the connectivity of a model is complete, if there are junctions in the model that Procedure Cluster has not reduced to degree 2, then there must be at least one Q.P-Cluster in the topology of the model. This procedure operates on the set of system junctions that has not been reduced to degree 2. The terminology used in the description of the procedure is given below.

Implementation Note:

Quasi-clustering is not implemented in the CONFIG3__ Demo Build_except in a trivial way—as a receptacle for the circuits created for all nodes that could not be assigned to true S- or P-Clusters. Q.S-Clusters are not implemented at all. This procedure should provide the basis for the creating quasi-clusters that serve a non-trivial function in the representation of a flow network in future versions of CONFIG. This would be needed only if there are practical modeling tasks of interest to a CONFIG user that would be intractable without quasi-clusters.

Terminology:

Node—Junctions are treated here as nodes while In-Line-Nodes are treated as the edges between adjacent junctions.

Adjacent—the term adjacency here refers to a pair of junctions for which there is an In-Line-Node that has one of the pair in its Left slot and the other in its Right slot.

External Node—Any junction not in a given Q.P-Cluster is external to it.

Port—A port is defined here as a junction that is internal to a Q.P-Cluster but that is adjacent to a single junction external to the cluster. A port node must be adjacent to at least two other junctions within the Q.P-Cluster.

Internal Node—Any node in a Q.P-Cluster not adjacent to any external node.

Cluster-Set—The union of the (always disjoint) Port set and Internal sets of a Q.P-Cluster.

Figure 12A:
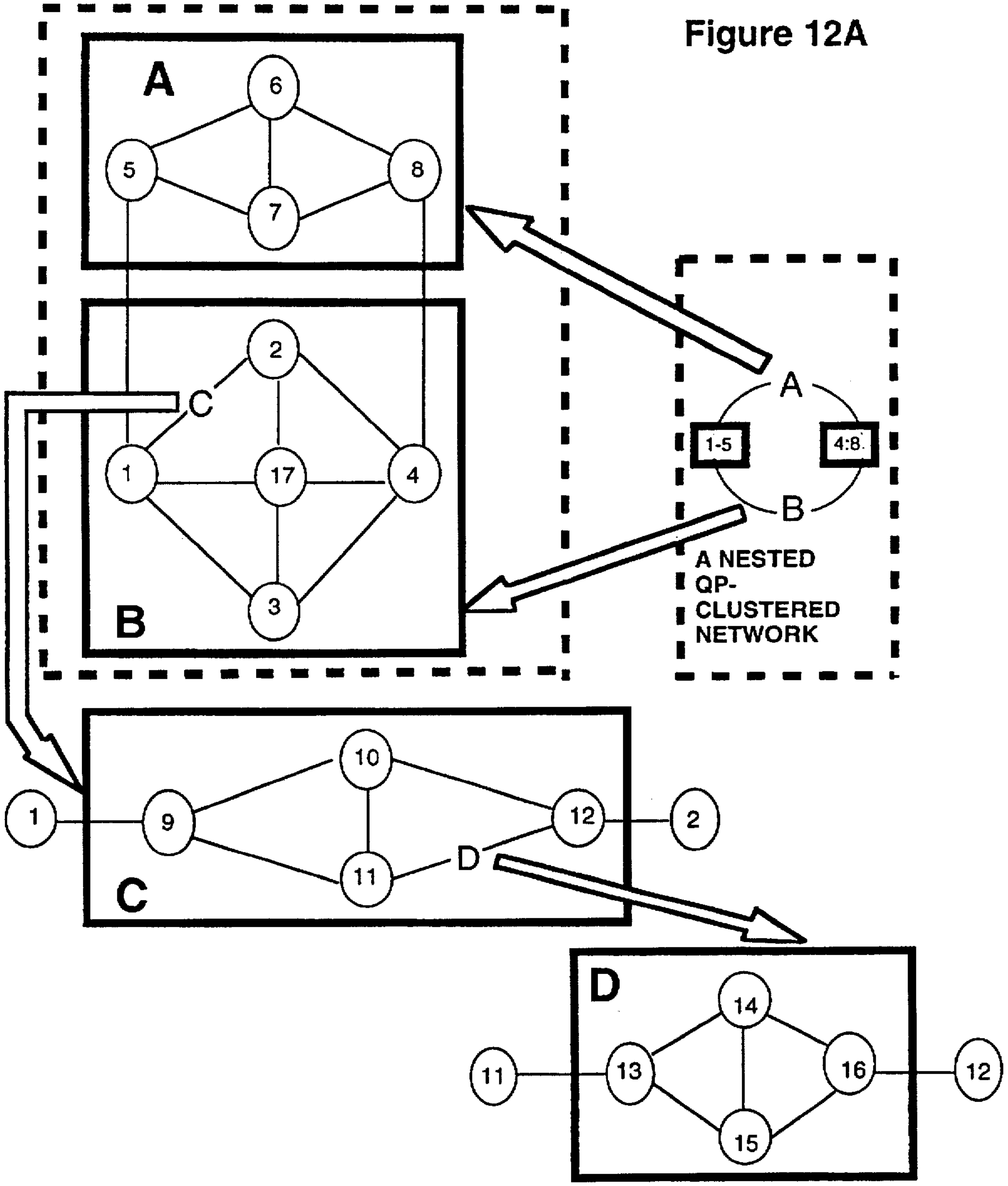
FIG. 12A is a diagram of a decomposition of a flow network into Q.P-clusters.
Figure 12B:
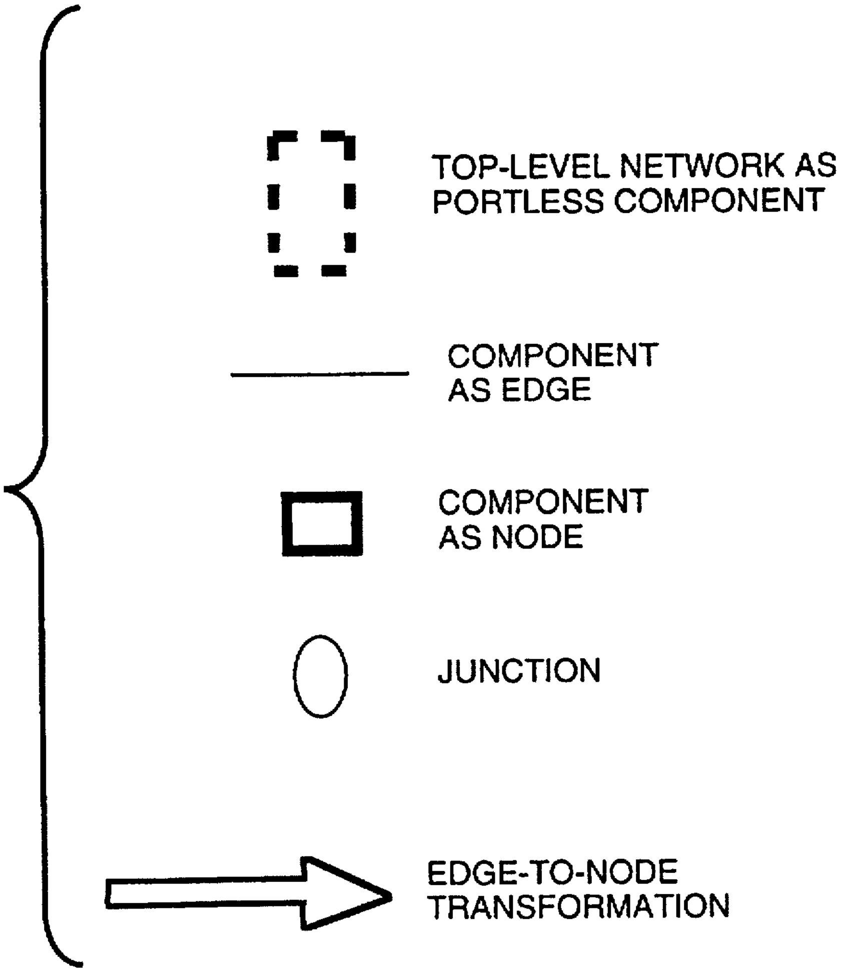
FIG. 12B is a legend for FIG. 12A.

A network that is reducible to a collection of nested Q.P-Clusters is shown in FIG. 12A. This network was the most complex test case of the prototype implementation of the quasi-clustering procedure. The top level network itself is reducible to the two equivalent Simple-Circuits of two nodes each as shown in the diagram. The network representation on the right shows the In-Line-Atoms labeled 1–5 and 4–8 connected by the two Q.P-Clusters A and B represented as edges while the one on the left shows clusters A and B as nodes connected by the two In-Line-Atoms as edges. The original network representation before decomposition by the clustering procedure and as viewed by that procedure is the one at the left with the expansions of the lower-level aggregates C and D. In this diagram, any edge between a pair of junctions (j, k) is an atomic node or cluster implicitly labeled jk.

This procedure takes one junction, referred to as the "seed" for a quasi-cluster, chosen from the flow network at random and builds the Q.P-Cluster by a breadth-first search. The object is to partition junctions into a set of 2 port nodes and set of two or more nodes considered to be internal. When more than 2 hypothetical port nodes are found, further clustering must be done to reduce the port set to 2.

Steps:

(1) If all but one of the junctions adjacent to the seed are also adjacent to one other junction in the seed's adjacency list
  Then
  those junctions satisfying that condition are placed on the Internal list, and the single node not satisfying the condition is paired with the seed node on an External/Port list, with the seed being considered the port.
  Else
  The seed is placed on the list of internal nodes.

(2) For each node <internal> in the Internal list, If <internal> is adjacent to exactly 1 node, <extern>, not in the internal-set
  If <extern> is not adjacent to any other nodes in the internal-set except <internal>
    add the pair (<extern><intern>) to the Extern/Port set and delete <intern> from the Internal-Set.
  Else
    Put <extern> in Internal-Set.
  Else If <internal> is adjacent only 1 node, <internal2> in the Cluster-Set
    Then
      Delete <internal> and <internal2> from the Internal-Set, and add the pair (<internal><internal2>) to the Extern/Port set. <internal> is now considered to be external to the cluster.

(3) If there are only 2 ports found in Step (2),
  Then the cluster is complete.
    A recursive call to Quasi-Cluster is made to determine if further subclusters exist within the new cluster. A node may be moved from the internal set to the port set, but no node is ever moved in the reverse direction, and no node, once in the cluster-set is ever considered external.
  Else the cluster is incomplete, since a component must have exactly 2 connections to the external network, so:
    Recursive calls are made to Quasi-Cluster for each <extern> node in the Extern/Port set until the number of ports is reduced to 2. Lower-level calls may cause either completely new clusters to be created or merge new nodes with the ports and internal-set of higher level calls.

Design Note:

This procedure, which is only summarized here, can be shown to be correct in that it always returns valid clusters with exactly two connections external to the cluster. However, it is not yet complete because:

(1) it will not cluster the entire flow network, although clusters external to the initial cluster are sometimes found inadvertently;

(2) quasi-clustering reduces sub graphs of the flow-network to nodes that can permit further true SP clustering to occur. To be practical, the procedure must therefore be integrated with true SP-clustering.

(3) once it is known that no more clustering is possible, only then should circuit objects be constructed to represent flows internal to the quasi-parallel clusters and Q.S-Clusters representing the flows through the Q.P-Clusters between its ports.

FPMM SIMULATION TIME OPERATIONS

Overview of Simulation-Time Operations

The ultimate purpose of FPMM is the computation of the Flow-Dir and Effort-Input slots of In-Line-Atoms incorporated into CONFIG as Device Variable-Clusters during discrete event simulations.

The following is given as a summary of how the various procedures and data structures interact during a simulation. There are two major phases of activity triggered when the state of an atomic In-Line-Node changes.

In Phase I. the flow-related attributes favoring flow in one or both of the two possible directions (Left or Right) of the two-port In-Line-Nodes are determined from the "bottom-up" through the system's cluster hierarchy, starting with the atomic node whose state has changed, referred to here as the "origin node". The origin node and the clusters above it whose flow-related attributes are also changed during upward recursion are each referred to as the "event node" on which further upward recursion is based. The state changes that can affect flow are Pass-P, Orientation, Effort-Dir, and Effort-Value.

Factors influencing flow are also computed for siblings of the origin node in any of the non-hierarchical Circuit objects of which the origin node is a child. The tokens used to represent factors favoring flow are referred to as Flow-Links. A node may have either a set of Circuit objects as parents or a single S- or P-Cluster parent.

The aggregation of nodes into Circuits and/or clusters allow computations to proceed in an incremental fashion so that only a subset of all nodes in the system must be examined when a flow-related state change occurs in a given node.

Upward-recursion halts when the state-change in the sibling does not produce a qualitative change in the parent.

The Flow-Link tokens are maintained in the Flows-Left % and Flows-Right % slots of all In-Line-Nodes. These tokens support a kind of qualitative summation of flows. As long as there is one or more tokens in one of the two slots, there must be a flow through the node toward the port indicated by the name of the token slot from the opposite port. For instance, one or more Flow-Links in the Flows-Right slot indicates a flow into the Left port of the In-Line-Node and out through the Right port. A Flow-Link in the Flows-Left % slot indicates a flow in the opposite direction. There can be tokens in both the Flows-Left % and Flows-Right % slot simultaneously, and that may be a source of ambiguity unless other factors favor a net flow in one direction over the other.

The nodes and clusters that have undergone a change in either of the two flow-link token slots are added to a list of *Affected-Nodes* and the Flow-Decided? attribute of the node is set to NIL The use of this attribute is described in the section on Phase II operations.

When the event associated with the origin node is a change in Effort-Value, all children of active clusters ancestral to the origin node and all children of active circuits of which the origin node is a child are added to the list of *Affected-Nodes*. An aggregate object is active if flow can reach from one of its two ports to the other. No Flow-Links are added when the event is a change in Effort-Value.

In Phase II, the Flow-Dir and Effort-Value are set for only those nodes and clusters on the *Affected-Nodes* list created in Phase I. The Phase II computations are often straightforward when there is only a single effort-source in a strongly-connected component of a flow-network; the Flow-Dir through a node is in the direction of the non-NIL token slot and the Effort-Input is the same as the Effort-Value of the single Effort-Source or Flow-Source responsible for a flow reaching the node. In situations where both flow-link slots are non-NIL, several approaches are pursued to automatically determine the values of Effort-Input and Flow-Dir. The user is queried as a last resort—a circumstance that is likely be an indication of either a modeling error or a fault condition in the simulation.

The separation of computations into these two distinct phases allows conflicting indications of flow direction to be recorded for each atomic node in Phase I so that all such indications are known for all nodes before the actual decision of flow-direction is made in Phase II. It also facilitates the integration of FPMM-Ops with the CONFIG Simulation module in such a way that Phase II can be deferred until the end of a time slice and the Flow-Dir and Effort-Input cannot take on more than one value during a time slice.

The procedures are described in subsequent sections. There will not necessarily be a one-to-one mapping of these procedures to LISP functions in the more detailed object-oriented design. Many of the data-type conditional clauses (e.g., "IF <X> is a true P-Cluster . . .") will become implicit in method specializations in the implementation.

Terminology

There have been changes in terminology as this design has been developed and implemented. The following terms are used here frequently, but are not necessarily used in the source code.

Flow-Related Attribute—Refers to the In-Line-Node attributes Effort-Dir, Effort-Value, Pass-P, and Orientation. Changes in any of these attributes trigger recomputation of the Flow-Dir and Effort-Input attributes of the node and related nodes and the flow-related attributes of ancestral clusters.

Conductive—The state of an In-Line-Atom for which Pass-P is true, the state of a Circuit or S-Cluster for which the Inactive.Children list is empty, or the state of a P-Cluster for which the Active.Children list is not empty.

Active—Describes a P-Cluster or Circuit through which flow is being conducted. For a P-Cluster to be active, it must have at least one conductive child whose Effort-Value attribute is not equal to Zero, and one other conductive child to return the flow. The term "active" is also used to refer to the child node of an active P-Cluster that has the non-Zero Effort-Value (i.e., the Effort- or Flow-Source). For a Circuit to be active, it must be conductive and have child Part-Links listed in either the Efforts-Left or Efforts-Right slot. Note that the terms Inactive.Children and Active.Children slots referred to in the above definition of "conductive" is misleading in this context. Those slot names should probably be changed to Nonconductive.Children. and "Conductive.Children". There are also predicate functions defined in the source files called Active? and Inactive? and these should also be changed.

Passive—Describes a child node of a P-Cluster in a pair of conductive nodes that returns the flow to the active node in the pair. A node may be active in one pairing and passive in another simultaneously, although the direction of flow in this situation is generally ambiguous if no magnitude differences exist that justify ignoring some flow components through the node.

Flow token slot—Refers to either the Flows-Left % or Flows-Right % slots of In-Line-Nodes where Flow-Links are listed. This is also referred to as a "flow-justification" slot.

Effort token slot—Refers to either the Efforts-Left or Efforts-Right slot of Clusters and Circuits.

Associated token slot—This term is used to relate one of a pair of token slots to a direction. For example, the Flows-Left % slot of a node is associated with the direction Left relative to that child. When the direction refers to a child node while the token slot refers to a parent cluster or circuit, a Left direction in the child may be associated with the Flows-Right % slot in the parent if the parent and child have opposing frames of reference, as indicated by the Port attribute value of the Part-Link that links the parent to the child.

Origin Node—The In-Line-Atom that has just undergone a state change in a flow-related attribute.

Event Node—The In-Line-Atom or cluster whose flow-related attributes are currently being recomputed. The state change of the origin node causes ancestral clusters to be treated recursively as the event node.

Interpretation of Procedure Call Diagrams

The procedures described here are illustrated by schematics that all are based on the symbols shown in FIG. 5. This graphical representation was chosen over the more traditional flow chart because it emphasizes the relationship of the parts-hierarchy of flowpath objects to the procedure iterations and recursions. This representation method shows call-sequencing and logic information not contained in a simple call-tree graph, but less than a complete flow chart. All of the procedures described operate on In-Line-Nodes (including Clusters) and/or Circuits and all take one of those objects as an argument. Two procedures connected by an unlabeled arrow indicate that a procedure A at the tail calls the procedure B at the head on "self", which means that A was called on the In-Line-Node "self" and that A then calls procedure B on the same In-Line-Node. Labeled arrows indicate other relationships between an object that is the main argument to a procedure and the object that is an argument to subsequent procedures. Procedures that actually modify the Flows-Left % and Flows-Right % token slots of In-Line-Nodes are indicated by a gray arrow. A gray arrow labeled "children" indicates that a procedure iterates over the children of the circuit or cluster argument, changing the token slot contents of all of them as appropriate. Where the calling sequence is not explicitly indicated by numbered arrows, the calling sequence for subprocedures and recursions are indicated by the left-to-right or top-to-bottom order of the connecting arrows, including arrows originating at AND junctions and non-exclusive OR junctions.

Event-Notify-Atomic

When the value of a flow-related attribute of an atomic In-Line-Node changes due to the execution of a CONFIG Process effect, the procedure Event-Notify-Atomic is called as shown in the first part of the previous diagram. This procedure calls Event-Notify on the origin node. Event-Notify then does upward-recursion through the Cluster hierarchy. Even at the atomic level, a change in orientation may actually result in two events, a change in the atomic-nodes Effort-Dir as well as its Orientation, as when the Orientation takes on a value opposite to the Effort-Dir, effectively changing the Effort-Dir of the atom to None.

Circuit-Update Triggering

Circuits are not truly hierarchical and the procedures for updates to circuit objects differ considerably from those for clusters. If an In-Line-Node or cluster has Circuit parents, the state changes in the child are communicated immediately to each of its circuit parents, and each circuit in turn communicates any change in conductivity or Effort-Dir to all of its children.

If an event node has one or more Circuit parents, one or both of the circuit-updating functions is called as shown in the second part of the previous diagram. Since this triggering occurs for clusters as well as In-Line-Atoms, the setting of a single attribute may result in Circuit updates at higher levels in the cluster hierarchy if it has an ancestral cluster that is a circuit child. This indirection is performed by the Event-Notify procedure, discussed subsequently.

Setting of the Pass-P attribute leads to a change in siblings of the event node only if it changes the list of Inactive-Children of the Circuit from nil to non-nil or vice versa. Then, the Circuit object is added or removed from the Circuits-Left and/or the Circuits-Right slots of each sibling of the event node and the event node itself.

Setting the Effort-Dir of an In-Line-Atom results in an incremental update of the Efforts-Left and/or Efforts-Right slots of all Circuit parents, regardless of whether a given Circuit is conductive at the time of the event. For each conductive Circuit, if the Effort-Dir associated with the Circuit has been changed, the function Update-Circuit-Children is called to update the Circuits-Right and Circuits-Left slots of the siblings and the event node. A circuit with effort sources only to the Right relative to a child is added to the Circuits-Right slot of the child's Node-Envelope, and deleted from the Circuits-Left slot if it formerly was listed in that slot. A Circuit with effort sources in both its Efforts-Right and Efforts-Left slot must be in both the Circuits-Left and Circuits-Right slot of each child's Node-Envelope.

When the Orientation of the event node is changed, both Update-Circuit-Effort and Update-Circuit-Children may be called but only if the change in orientation changes the conductivity or Effort-Dir of the circuit. This is done when the Effort-Dir of the parent Circuit and/or its conductivity are affected by a change in orientation of the event node.

No operations are performed on Circuits at this point if only the event associated with the event node is a change in Effort-Value. New Effort-Inputs for siblings of the event-node are computed by the Event-Notify function to reflect the change in the value of an effort source.

Procedure Event-Notify

This procedure, is upward-recursive through the clustering hierarchy but calls procedures that are downward recursive. The calling sequences associated with Event-Notify are shown in the diagram of FIG. 7A.

Event-Notify is event-oriented in that one of its arguments is a list of events affecting the node that is its primary argument. An "event" refers to a change in value of any of the flow-determining attributes. The value of the attribute just prior to the state change is part of the event description. The main arguments to this procedure are the event node and a list of events identified by the keywords:ORIENT, :PASS-P, :EFFORT, and :EFFORT-VALUE.

Event-Notify is not called on Circuits, but may affect the states of circuits in two ways:

(1) when a flow-determining attribute of a parent cluster is changed by the Set-Effort, Set-Orientation, or Set-Pass functions since each of these procedures calls the accessors that trigger the circuit-update functions.

(2) when Procedure Compute-Flow-Links is called by Event-Notify on a Circuit parent of the event node that is its argument. In this case, Flow-Links may be added or retracted in the Flows-Left % and/or Flows-Right % slots of the Circuit's child nodes.

The effects of the state change of the event node on the overall Pass-P, Effort, and Orientation each of the node's parent cluster is determined on each call to Event-Notify. (If a node has a true S- or P-Cluster parent, it is the only parent). In addition to the Flows-Left and Flows-Right slots inherited from In-Line-Node, clusters also have Effort-Dir, EffortsLeft, Efforts-Right, and Orientation slots that are used for the computation of the overall effort and orientation of the cluster as viewed as a single component at the next level up in the cluster parts hierarchy.

If any of the flow-determining attributes of the parent cluster(s) has changed, that cluster becomes the event node on an upward recursion, otherwise, no upward recursion is done for that parent.

If the event node is associated with a :PASS-P event, then the only event that can be associated with a parent cluster on upward recursions of Event-Notify is a :PASS-P event. Orientation and Effort are also recomputed when the Pass-P value of a cluster changes from False to True.

Effort-Dir and Effort-Value are both computed by Set-Effort. If both attributes have been changed by Set-Effort or if only the Effort-Value has changed, an EFFORT event is associated with the cluster on the next upward recursion of Event-Notify. If only the Effort-Value has changed, an :EFFORT-VALUE event is generated. Effort-Dir, which is computed the same way for all subclasses of cluster, may take on the additional value of AMBIGUOUS, implying that the effort associated with the cluster can contribute to flowing both directions in the cluster's siblings. This occurs when the Efforts-Left and Efforts-Right slots of the cluster are both set to non-NIL values due to the child node event. When a cluster has an effort value of AMBIGUOUS, nodes in circuits with that node may have a marker associated with the effort source node in both the Flows-Left and Flows-Right slots.

For S-Clusters and Q.S-Clusters, the orientation may take on the additional value of IMPASSE if an :ORIENT event in a child node causes the cluster to have children with orientations of both directions relative to the cluster. The effect of adding or removing an IMPASSE orientation is the same as that involved in setting the Pass-P to FALSE and TRUE respectively. A change in orientation produced by Set-Orient generates an :ORIENT event on the upward recursion of Event-Notify for the cluster.

Upward recursion of Event-Notify—and Phase I of the simulation-time operations cycle of FPMM—ends when no further ancestors of the origin atomic node are found that have undergone a change in any flow-related attribute due to the origin node's change in state. The Flow-Link token slots have been updated for all ancestors and siblings of every event node in the chain of recursive calls. All nodes that have had their Flows-Left and Flows-Right slot values changed during Phase I or that are subject to a new Effort-Input due to a change in an Effort-Value are collected and passed to the main Phase II procedure, Set-Flow.

Procedure Set-Pass

This procedure sets the Pass-P attribute of P-Clusters to True if one or more child Part-Links are listed in its Active.Children % slot, and to False otherwise.

For S-Clusters, the Pass-P attribute is set to True if the cluster's Inactive.Children % slot is empty, and to False otherwise.

When the Pass-P value of a cluster changes from False to True, the Procedures Set-Effort and Set-Orientation must also be called, because a non-conductive cluster has no orientation or effort and these must be computed for the newly-conductive cluster.

Procedure Set-Effort

This procedure sets both the Effort-Dir and Effort-Value of S-Clusters and P-Clusters based on a qualitative summation of those values for the clusters children. The argument is the Part-Link between the Event-Node and the Cluster.

Design Note:

In quantitative terms, Effort-Dir is actually the sign of Effort-Value, the effort exerted by a node that induces flow in other nodes. These are considered two separate but related attributes primarily due to the fact that there is no representation of a signed value built into CONFIG. In addition, however, this separation also makes it easier to model flows in which only the direction of flows and efforts are important. For example, in an electrical power supply and switching subsystem of secondary importance to other modules, it may only be of interest to model the fact that there is electricity flowing to the model and the directions involved, while the actual value of effort is unimportant.

This procedure calls Q+, a qualitative addition function that takes a list of effort values assumed to be of the same sign and returns their sum. Q– takes two effort values of opposing signs and returns the sign (i.e., Effort-Dir) and Effort-Value as the result. These procedures are described subsequently in the discussion of Phase II operations.

The logic of Set-Effort is the same for both S- and P-Clusters, with the exception of the special treatment of a Flow-Source that is a child of an S-Cluster. If an S-Cluster has both Flow-Sources and Effort-Sources as child nodes, the Effort-Value contributions of the Effort-Sources are ignored and the Flow-Sources only are used to compute the Effort-Value of the S-Cluster. This is so because of the assumption used in FPMM that flow is qualitatively proportional to the potential (i.e., Effort-Input) of the passive siblings of the S-Cluster. Since only the Flow-Source children of an S-Cluster determine the flow to those passive siblings, they also should determine the qualitative Effort-Value of the S-Cluster used to compute the Effort-Input of the siblings.

The pseudo code for Set-Effort is given below.

PUSH the event node's Part-Link onto the Efforts-Left and/or Efforts-Right slot of the Cluster or delete it from one or both of those slots depending on the Effort-Dir of the child node relative to the Cluster. If the child has an Effort-Dir of Ambiguous, it is pushed onto both slots. Ambiguous can be a value only for Clusters, never for In-Line-Atoms. IF the Cluster is an S-Cluster AND one or more children are Flow-Sources IF all Flow-Source children have a common Effort-Value and Effort-Dir relative to the parent SET the Effort-Value and Effort-Dir to the common values of the children SET the Flow. Source? Boolean attribute of the S-Cluster to True.

ELSE

There is an error in modeling since there cannot be more than one direction and value of flow through a series.

ELSE

IF the Cluster is an S-Cluster

SET the Flow.Source? Boolean attribute of the S-Cluster to False

IF only one of the Efforts-Left and Efforts-Right slots are occupied

SET Effort-Dir of the parent to the value. associated with that slot (i.e., Left for Efforts-Left, Right for Efforts-Right)

LET Child.Efforts be the list of Effort-Values of all child nodes of the Part-Links in the Efforts-Left or -Right slot.

SET Effort-Value of the parent to (Q+ Child.Efforts)

ELSE

LET Efforts.Left and Efforts.Right be the lists of Effort-Values of all child nodes of the Part-Links in the Efforts-Left and Efforts-Right slots of the cluster respectively.

SET Left.Value to (Q+ Efforts.left))

SET Right.Value ←(Q+ Efforts Right)

SET the Effort-Dir and the Effort-Value simultaneously by calling (Q–Right.Value Left.Value)

Implementation Note:

The CONFIG3_Demo_Build Implementation does not provide any way to recognize that an S-Cluster is acting as a Flow-Source because it has one or more children that are Flow-Sources (i.e., S-Clusters have no Flow. Source? attribute). This must be added for completeness when an S-Cluster with Flow-Source children is itself the child of a P-Cluster.

Procedure Set-Orient

For a P-Cluster, the Orientation is set to None if there are conductive children with orientations to both the Left and the Right relative to the cluster, or if there is one child node having an orientation of None.

If all conductive children have the same orientation relative to a P-Cluster, then the P-Cluster has either a Left or Right orientation and permits through-flow only in that direction.

An S-Cluster will have an orientation of Left or Right if one or more children have the same orientation relative to the cluster and has an orientation of None only if all its children also have no orientation. If any children have opposite orientations relative to the cluster, the S-Cluster has an orientation of Impasse, and the Pass-P value of the cluster is set to False. Also, when the Orientation of an S-Cluster is changed, the Effort-Value of the cluster may also change. If the new Orientation is the opposite of the S-Cluster's Effort-Dir prior to the event, the S-Cluster's Effort-Dir is set to None and its Effort-Value to Zero. Conversely, if the prior Effort-Dir of the S-Cluster was None, the cluster's new Effort-Dir may be in the same direction as its new Orientation if any of the cluster's children also have Effort-Dir values in that direction. As shown in FIG. 7A, a change in Orientation may result in the subsequent assertion or retraction of Flow-Links of the cluster within the scope of the Event-Notify procedure's execution on the event node child.

The logic of setting the orientation of Circuits is the same as for S-Clusters. However, the Set-Orient procedure is not called on Circuits. The orientation of Circuits is set instead by the Orientation access trigger on the Circuit's children.

Use of Part-Links in Flow Phase-1 Computations

The instance of class Part-Link carry two types of information necessary for flow computations:

(1) the Port slot is used to convert a parent-relative direction to a chid-relative direction.

(2) the Activity.Ptr slot points to the Part-Links position in a list maintained by the parent cluster. In S-Clusters, this is the Inactive.Children % list and in P-Clusters, the slot is Active.Children %. P-Clusters are conductive as components when their Active.Children % slot has one or more items while S-Clusters and Circuits are conductive when their Inactive.Children % slot is empty and their orientation is not Impasse.

A special subclass of Part-Link named Circuit-Part-Link is used to record information on the relationship of a node to a circuit. Unlike Part-Links, Circuit-Part-Links contain information on the dynamic relationship of a child node to the parent as well as the static part relationship.

Flow-Link Data Structures and Procedures

A Flow-Link is a token indicating that there is a justification, in the sense of a truth-maintenance system, for flow in one of the two possible directions (Left or Right) through an In-Line-Node. These tokens are stored in flow-justification slots named Flows-Left % and Flows-Right %. The number of tokens in either slot implies nothing about the magnitude of flow. When there is one or more tokens in both slots in an In-Line-Node, the direction of flow is ambiguous and cannot be resolved in favor of the slot with the largest number of tokens.

The Flows-Left % and Flows-Right % slot names in In-Line-Nodes have the "%" suffix to indicate they contain lists whose first item is always a "%" symbol. The "%" symbol is the first element of the list so that all operations on the list can be performed using list surgery without the need for setting the value of the slot. The Flow-Links contain back-pointers to their positions in those lists for fast deletion by the Procedure Retract-Flow-Entry when the conditions for flow disappear. This naming convention has also been followed for other flow-related slots containing lists updated by list surgery.

Figure 13:
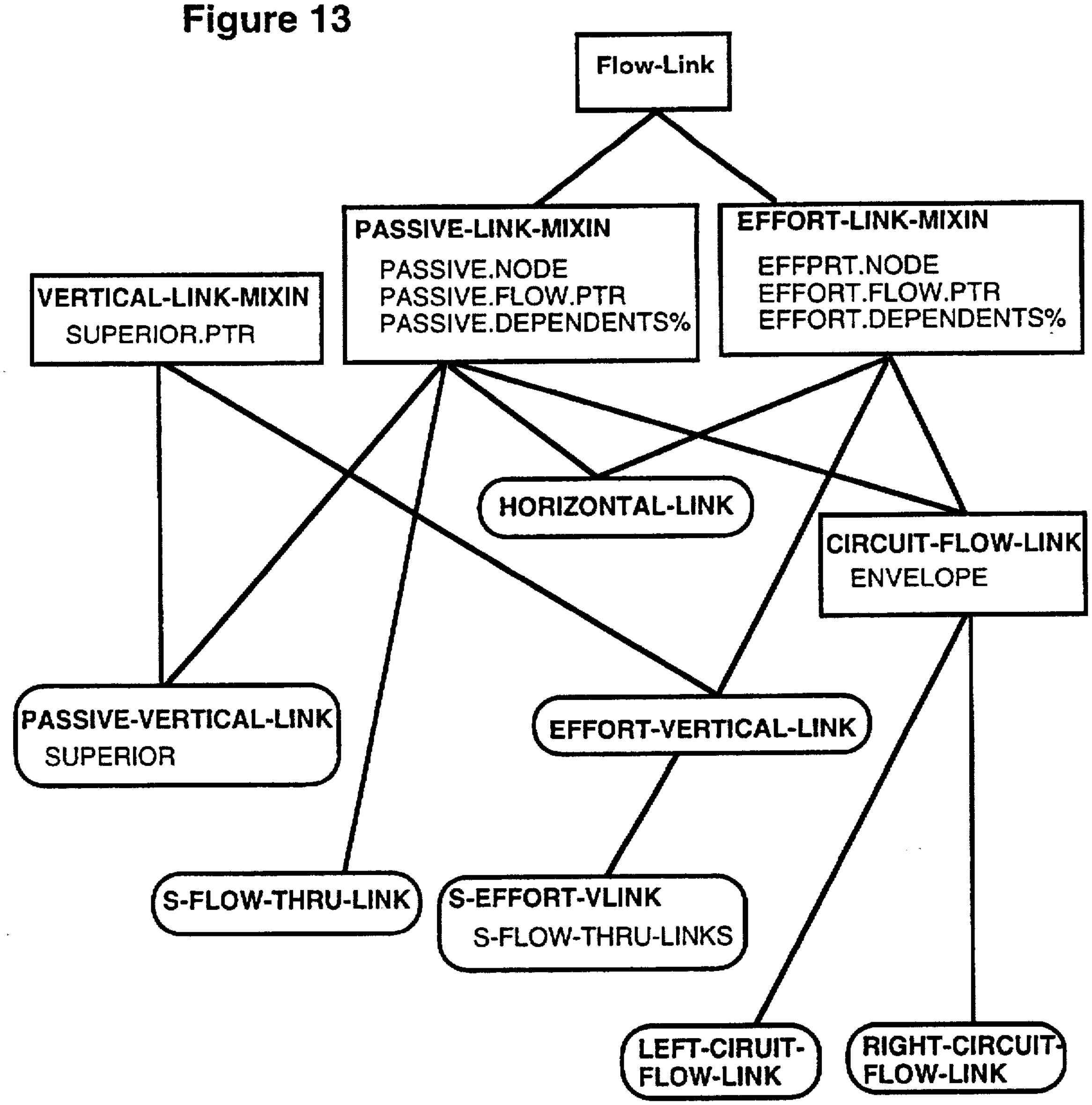
FIG. 13 is a is a diagram of the flow-link hierarchy with object attributes.

The subclasses of Flow-Link are shown in the diagram of FIG. 13 below. Briefly, the meanings of objects of the instantiable Flow-Link classes when asserted in a flow justification slot of an In-Line-Node are as follows:

Horizontal-Link—indicates a flow exists between the pair of sibling nodes of a P-Cluster.

Effort-Vertical-Link—indicates that the node is a source of effort for an ancestral cluster in a supporting a flow through that cluster.

Passive-Vertical-Link—indicates that the node is a passive effort that completes a path of flow but contributes no source of effort to the flow.

S-Effort-Vlink—indicates that the node is the source of effort supporting a flow through its siblings in an S-Cluster.

S-Flow-Thru-Link—indicates that the node is the child of an S-Cluster and is clusterely conducting flow through the cluster.

Left-Circuit-Flow-Link and Right-Circuit-Flow-Link—indicate that flow is occurring through one or more Circuit objects of which the node is a child.

More detailed descriptions of these classes and their slots are given subsequently.

FIGS. 14A, 14B, 14C, and 14D illustrate the dynamic simulation-time relationships between the various kinds of Flow-Links and the In-Line-Nodes for which they are used as tokens of a flow.

Figure 14A:
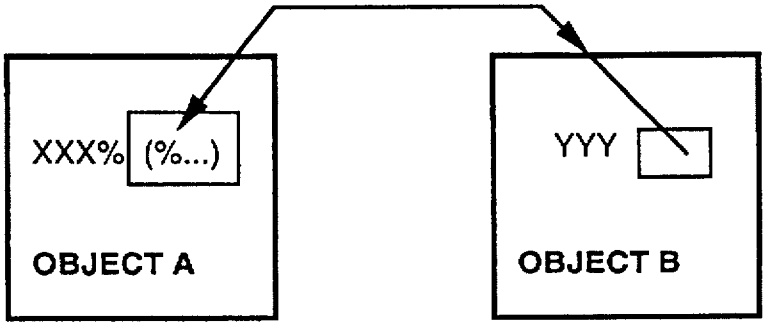
FIG. 14A is a diagram of a Transient Cross-Link between objects.

FIG. 14A illustrates a Transient Cross-Link: Objects of Class A maintain a list in slot xxx %, the first item of which is "%" and the rest of which are objects of Class B. The Class B object maintains a pointer to the CONS cell in slot yyy for fast deletion from the list in xxx % of the Class A object.

Figure 14B:
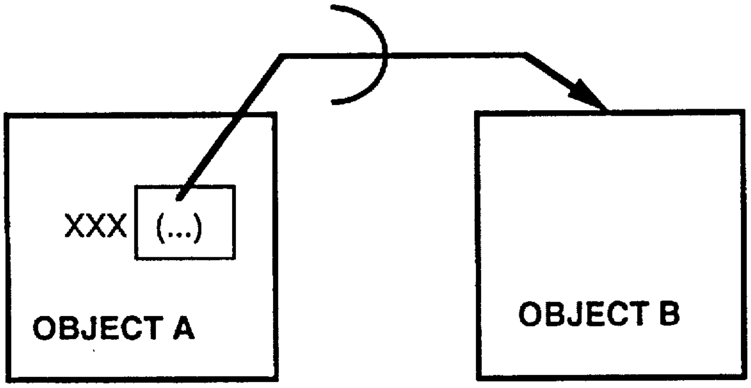
FIG. 14B is a diagram of a Multivalued Link between objects.

FIG. 14B illustrates a Multivalued Link: Objects of Class A maintain a permanent list of any number of objects in slot xxx, all of which must be of class B.

Figure 14C:
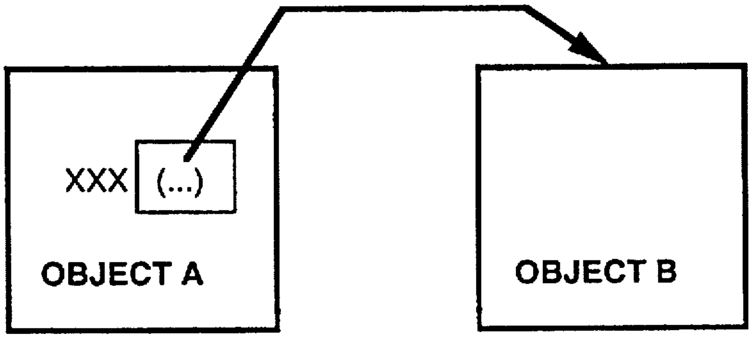
FIG. 14C is a diagram of a Type-Restricted Multivalued Link between objects.

FIG. 14C illustrates a Type-Restricted Multivalued Link: Objects of Class A maintain a permanent list in slot xxx that contains no more than one object of Class B. Any other items in slot xxx are not of Class B.

Figure 14D:
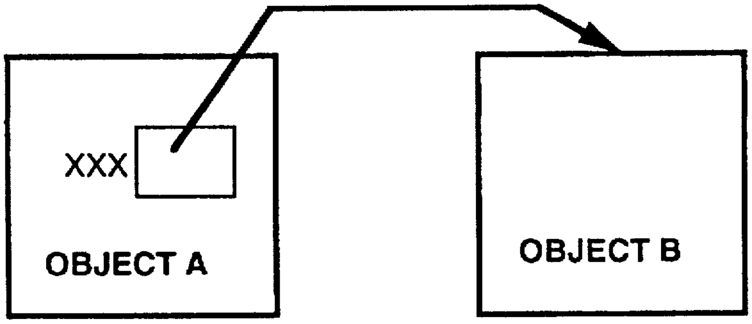
FIG. 14D is a diagram of a Single-valued Link between objects.

FIG. 14D illustrates a Single-valued Link: Objects of Class A store a permanent pointer to a single object of Class B in slot xxx.

Any slot names suffixed by a "%" sign indicate that the slot holds a list of objects, each of which contains a pointer back to the list position of the object in the list, as symbolized by the double-headed arrow pointing back to the slot from the listed object. The first elements of these lists are always a "%" so that any object can be surgically deleted from the list tail without accessing the slot in which the list resides. This approach wallows items to be deleted from a list without the slower sequential searching, without duplication of "cons" cells, and also generates less garbage in the form of discarded "cons" cells than do non-surgical deletions. More importantly, there may be alternative slots in which a given object is listed and extra program logic would be needed to determine which slot should be searched in some cases. Simply doing list surgery at the location of the back pointer in the deleted object requires no knowledge of the actual slot.

There are several subclasses of Flow-Links whose instances are tokens indicating flow in In-Line-Nodes. Different flow-links are associated with different parent-child relationships. If a flow-path object (i.e., an In-Line Node) has no Flow-Links in either its Flows-Left % or Flows-Right % token slots when the Phase II computations commence, there is no flow through the object. If it has links in one or the other of the token slots, there is flow in the associated direction. If it has tokens in both slots, then the flow is ambiguous, and various methods of disambiguation are performed in Phase II.

Procedure Compute-Flow-Links is invoked by Event-Notify to determine when the event supports the assertion of new Flow-links in siblings, ancestors, and children of the event node or causes existing assertions to become invalid. Procedures Add-Flow-Links_For-New-Pass, Add-Flow-Links-For-New-Effort, and Add-Flow-Links-For-New-Orient are called for changes in Pass-P, Effort-Dir, and Orientation, respectively. These event-specific procedures test how the specific event affects the conditions for flow through In-Line-Nodes. A single invocation of Compute-Flow-Links may call both Add-Flow-Links-For-New-Effort and Add-Flow-Links-For-New-Orient, so it is possible in some cases for one of those procedures to retract Flow-Links Asserted by the other.

Horizontal-Links

Instances of this type of Flow-Link assert the fact that there is a flow between a pair of nodes in a P-Cluster. Procedure Add-H-Links asserts all Horizontal-Links in the In-Line-Nodes and records the various back-pointers that are used for fast updates. Each such pair forms a circuit (in the more general sense) where flow is caused by an effort or flow-source node through a passive node that conducts flow back to the source. Every instance of this class is asserted and retracted simultaneously in such a pair of nodes. Back-pointers are stored in the Effort-Ptr and Passive-Ptr slots of a Horizontal-Link for fast deletion when the conditions underlying the link assertion becomes invalid. The conditions are:

(1) both nodes in the pair have a Pass-P value mapping to Boolean True.

(2) one node in the pair has an Effort-Dir not mapping to None nodes.

If both nodes in the pair have an Effort-Value, then there are two Horizontal-Links asserted for the pair.

Vertical Links

Assertion of the Flow-Links subclasses inheriting from Vertical-Link-Mixin creates tree structures of Flow-Links that parallel subtrees of a flow-network parts hierarchy (clusters, circuits, and In-Line-Atoms) through which flow is occurring at any given simulation time. The assertion of vertical links always forms a tree rooted in either:

a Horizontal-Link associated with a flow through a pair of nodes in a P-Cluster;

a Circuit-Flow-Link (described subsequently) associated with flow through a Circuit object;

an S-Flow-Thru-Link (described subsequently) recording the existence of a flow across each of a series of S-Cluster children from and to an Effort-Source child in the series.

Vertical flow-links are recursively asserted in Phase I by subprocedures called by Procedure Compute-Flow-Links in each conductive child of a cluster.

The Superior.Ptr slot in a vertical link points to its list position in the Dependents % slot of its superior link.

When a node with a vertical link in its token slot changes to a False value of Pass-P or an Orientation incompatible with its current flow direction, the link is retracted from the token slot of the associated node. This retraction will cause retraction of the token from its position in the list of dependents of its superior flow-link. Retraction and assertions of vertical links are propagated top-down by Compute-Flow-Links recursion as indicated in the procedure calling-sequence diagram previously discussed. The effects of a state-change of a child In-Line-Node on its parents propagated from the bottom-up by Event-Notify recursion.

Effort-Vertical-Link

When the root of a tree of vertical links is a P-Cluster, there is always one branch of the tree at each level that contains an Effort-Vertical-Link associated with the single effort-node at the next-higher and next-lower level. The superior of an Effort-Vertical-Link is always another link inheriting from Effort-Link-Mixin (i.e., another Effort-Vertical-Link, a Horizontal-Link, or a Circuit-Flow-Link).

All Effort-Vertical-Links and those of its subclass, S-Effort-VLink, are asserted by the Procedure Add-Effort-Vlink, which is downward-recursive relative to the Flow-Network parts hierarchy (as indicated in the previous diagram of the Event-Notify calling sequences).

Passive-Vertical-Link

The passive-node in the original node pair has only Passive-Vertical-Link children. A passive vertical link contains the Superior slot which points directly to the superior of the passive link (the superior.ptr points only to the list position of the inferior link itself in the superior link and does not give access to the superior link). The Superior pointer is used for setting the Effort-Value of passive atomic nodes in Phase II computations. The effort vertical links do not need this slot because the Effort-Input of an effort node is always the Effort-Value of the node itself, not of any remote effort-source.

All Passive-Vertical-Links are asserted by Procedure Add-Passive-VLinks, which is downward-recursive relative to the Flow-Network parts hierarchy (as indicated in the previous diagram of the Event-Notify calling sequences).

Links for Recording S-Cluster Through-Flows

A parts hierarchy of true clusters always alternates layers of S-Clusters with layers of P-Clusters. When an S-Cluster contains a child node that causes the S-Cluster to be the effort-node in the P-Cluster at the next-higher level, Compute-Flow-Links asserts an S-Effort-Vlink in one of the effort-source child's token slot and asserts S-Flow-Thru-Links in each of the other S-Cluster children. The S-Flow-Thru-Links are also stored in the S-Flow-Thru-Links slot of the S-Effort-Vlink. S-Effort-Vlinks inherit from Vertical-Link-Mixin. SFlow-Thru-Links do not.

The classes S-Effort-Vlink and S-Flow-Thru-Link are defined because, when an S-Cluster contains more than one active Effort-Source child, the relationship must be maintained between the effort Flow-Link associated with each active effort to the unique set of passive flow links in the effort-source's siblings. In this way, when one effort-source becomes inactive, the associated passive flow links in the effort-source siblings can all be retracted without disturbing the passive S-Flow-Thru-Links associated with the efforts exerted by other siblings and their associated S-Flow-Thru-Links. S-Flow-Thru-Links will have dependent Passive-Vertical-Links when the node they are associated with is a Cluster.

An S-Cluster serving as the passive-node in flow through a higher-level P-Cluster or Circuit has only Passive-Vertical-Links asserted in the token slots of its children; there are no S-Flow-Thru-Links used when an S-Cluster plays the passive role.

Example of a Dynamically-Asserted System of Flow-Links

Figure 15A:
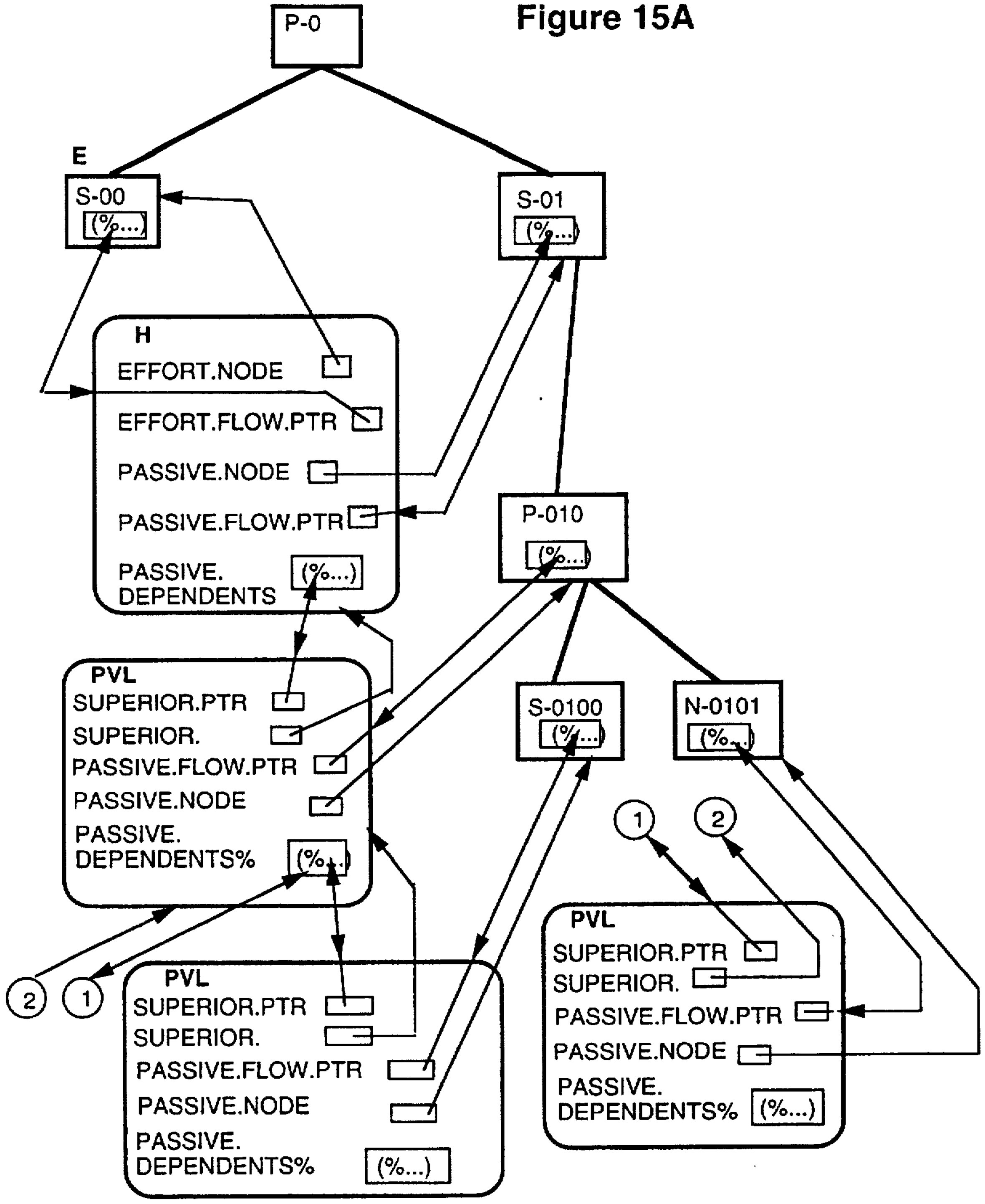
FIG. 15A is a diagram showing an example of relationships between the passive branch of a Parallel-cluster (P-cluster) pair and flow-link objects.
Figure 15B:
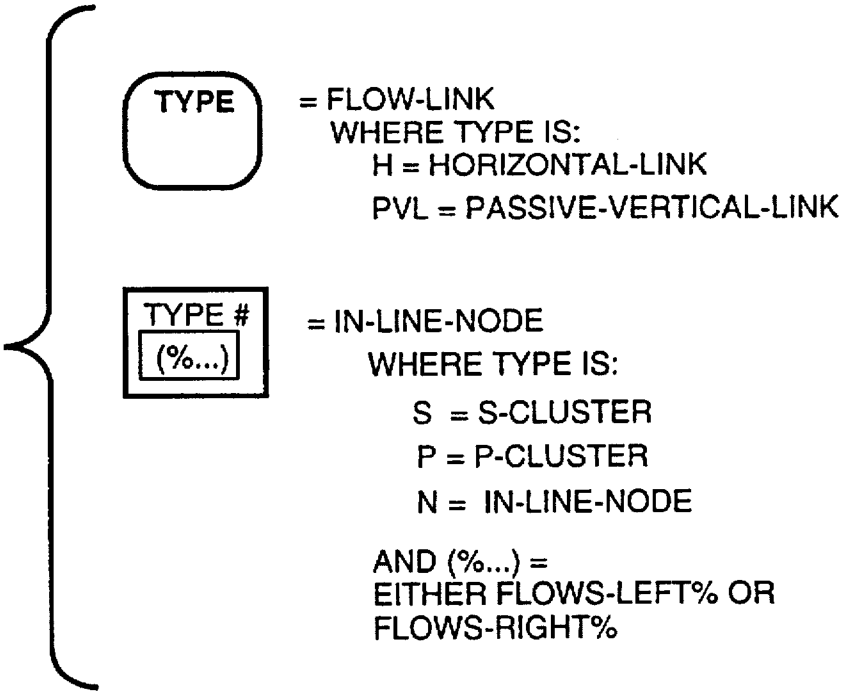
FIG. 15B is a legend for FIG. 14A.
Figure 16B:
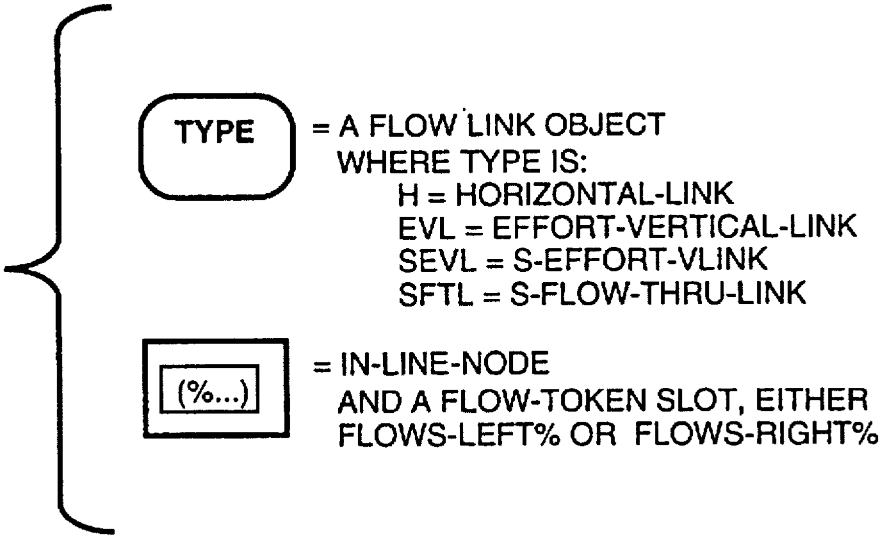
FIG. 16B is a legend for FIG. 15A.
Figure 16A:
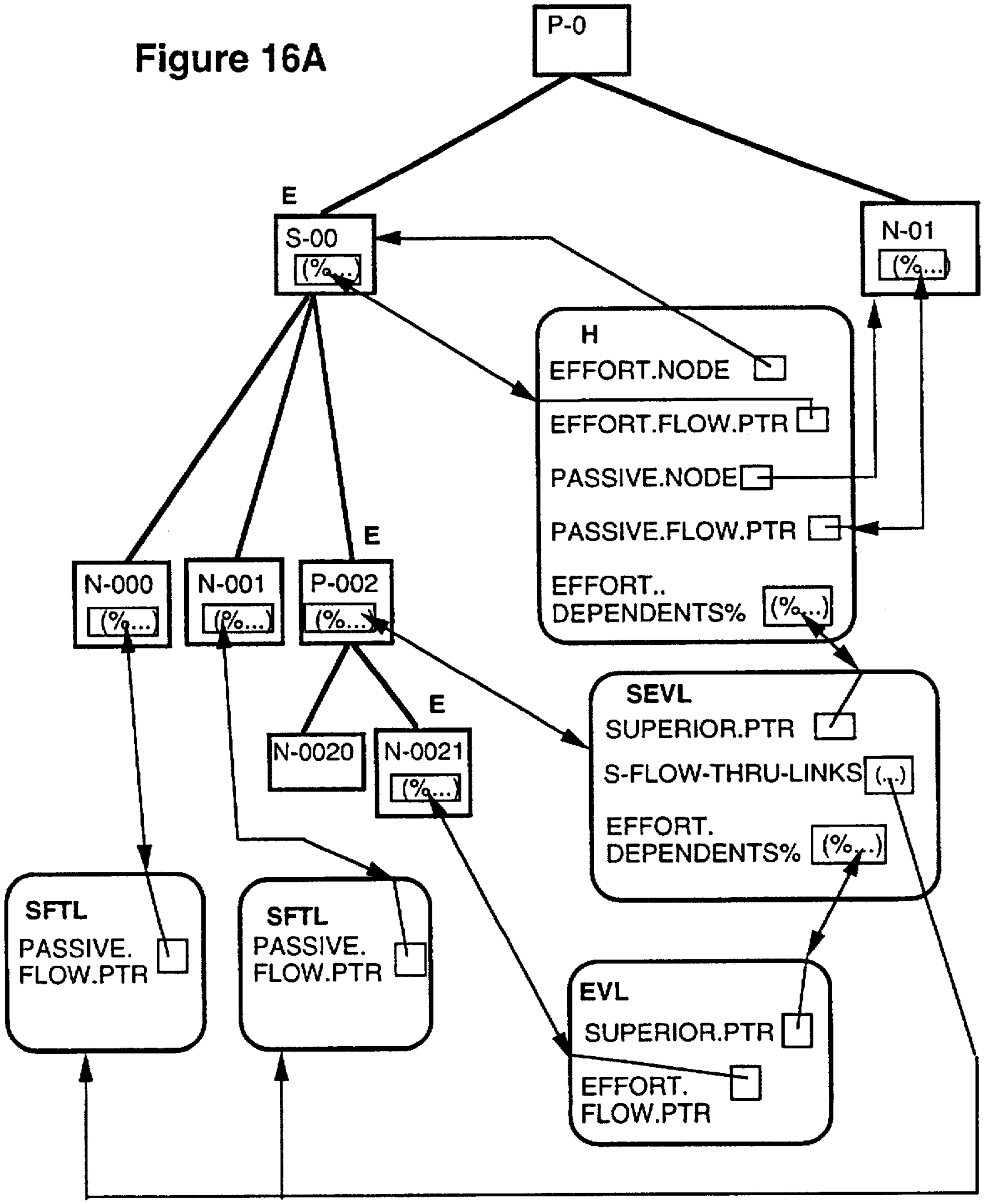
FIG. 16A is a diagram showing an example of relationships between the effort branch of a P-cluster Pair and flow-link objects.

An example of a flow-network subgraph that consists of a simple 2-node P-Cluster, P-0, is shown in the diagrams of FIGS. 15A and 16A. The unlabeled boxes containing the "(% . . . )" within each cluster or node in these diagrams stand for either one of the token slots, Flows-Left % or Flows-Right %.

The effort-source of the node pair is S-00, as indicated by the bold-face "E" above the box representing that cluster. The passive branch is S-01.

The first diagram shows the Flow-Links associated with the passive branch of the node pair, S-01. Note that a number of connections are omitted. S-01, being a cluster, must have at least one other child besides the one shown, P-010. That node would have to have its own Passive-Vertical-Link (PVL) associated with it in the same way as shown for P-010. Since node S-0100 is also a Cluster, it also has children not shown and each child must have a PVL that is a dependent of the PVL associated with S-0100 in the same way that the S-0100 PVL is associated with the PVL of the P-Cluster parent, P-010.

The effort branch of the flow in P-0 is shown in the second diagram. It can be seen there that the effort-branch flow link configuration is not uniform down through the levels of the cluster hierarchy as was the passive branch. The flow exists because all nodes are conductive (Pass-P=True) and because Node N-0021 has an effort associated, with it (as indicated by the "E" in bold-face above that node. Note that the sibling of N-0021, N0020, has no flow-links associated with it because there is no flow through that node dependent on the higher-level connections external to their shared P-Cluster. However, there could be another Horizontal-Link connecting Nodes N-0020 and N-0021 if N-0020 is conductive. Note also that no flow-links are stored in or point to the top-level P-Cluster, P-0, even though it is responsible for the entire system of flow-links shown.

Circuit-Flow-Links

Circuits, like P-Clusters may conduct internal flows but, like S-Clusters, are conductive only when all of their children are conductive. Unlike either P-Clusters or S-Clusters, circuits are not components and do not conduct any flows external to themselves. Also, there is a many-to-many relationship between Circuits and their children whereas there is a one-to-many relationships between a P- or S-Cluster and its children.

Due to the fact that the number of circuits in the system is combinatorially explosive in the worst cases and could be large in many practical cases, the Circuit-Flow-Links have been designed to keep the number of flow-tokens associated with a circuit to an absolute minimum.

A P-Cluster will have a Horizontal-Link for every pair of child nodes for which one node is an effort source and both are conductive. In contrast, a node that is the child of a circuit has two and only two flow-links regardless of how many circuits it is in and regardless of how many active effort-sources any circuit may have. A flow-link of class Left-Circuit-Flow-Link is asserted in the Flows-Left % slot of a child if there is one or more effort-sources in one or more circuits inducing flow to the Left relative to the child. A flow-link of class Right-Circuit-Flow-Link is asserted in the Flows-Right % slot to indicate flow to the right relative to a child.

The same Circuit-Flow-Link token may be asserted many times in the corresponding flow-justification slot of the In-Line-Node, once for each flow-conducting circuit in which the node participates.

Relationship of Circuit-Flow-Link with Other Data Structures

Figure 17:
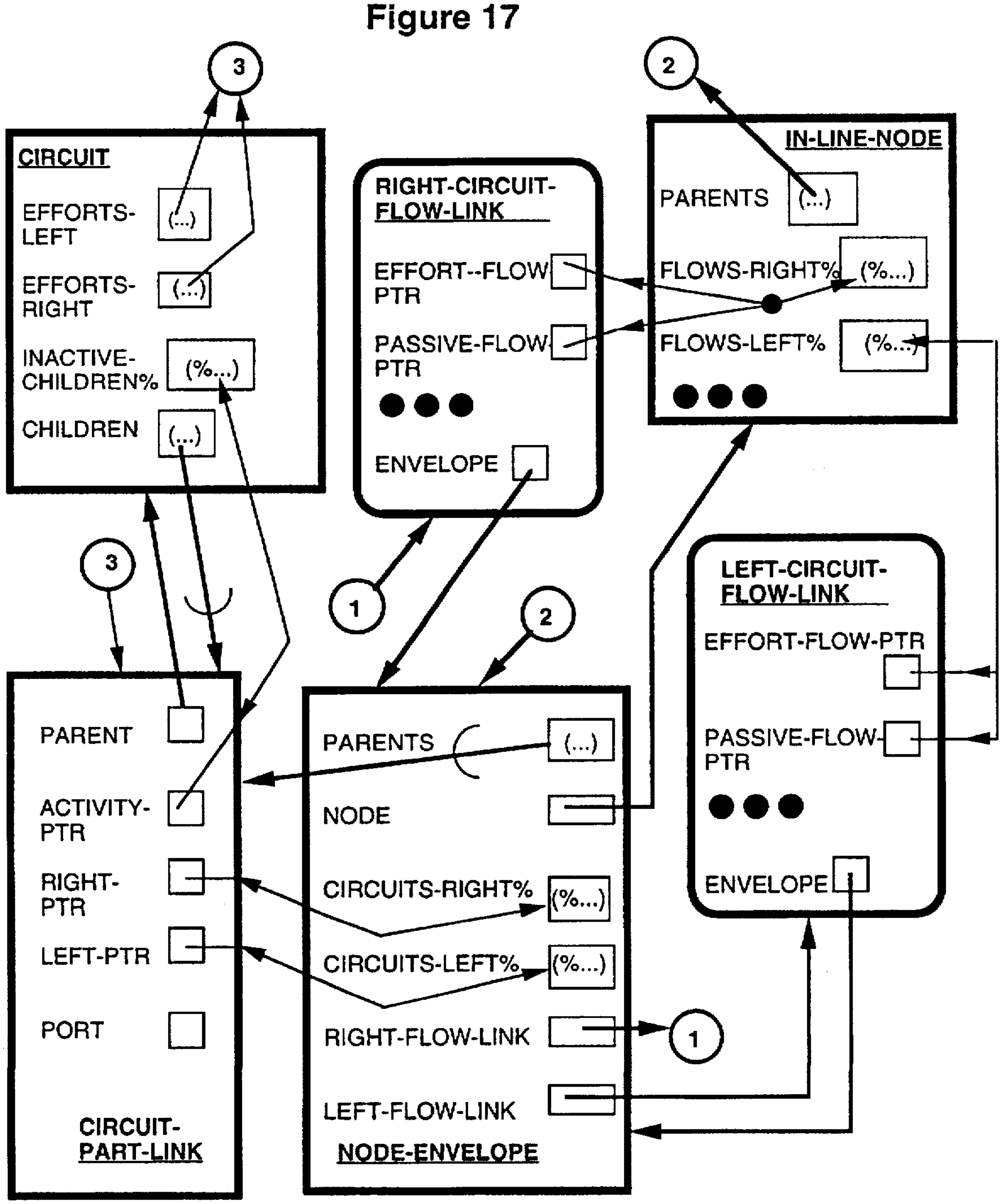
FIG. 17 is diagram of relationships of objects used for circuit flow computations.

The relationships of Circuit-Flow-Links and other objects are shown in FIG. 17: (Not all the dynamic relationships, indicated by thin lines, can or will necessarily all be in effect at any given time).

The two subclasses of Circuit-Flow-Link inherit the slots Passive.Dependents % and Effort. Dependents % from the classes Passive.Link.Mixin and Effort.Link.Mixin. These slots are represented by the large ellipsis in the Flow-Link structures in the diagram. If the In-Line-Node is an S-Cluster or P-Cluster, these slots will always have vertical link dependents of class Passive-Vertical-Link and/or Effort-Vertical-Link whenever the Passive-Flow-Ptr and/or Effort-Flow-Ptr slots are non-nil. These dependents will be asserted to the appropriate Dependents % slot by downward recursion of Procedure, Compute-Flow-Links.

Design Note:

In the current design, the Parents slot of an In-Line-Node is always occupied by a list of exactly one item. The item is either a true S- or P-Cluster, or a pointer to a Circuit-Child-Envelope which itself has multiple pointers to Circuit-Part-Links. The proposed extension to this design will include non-trivial usages of Q.P-Clusters and Q.S-Clusters (the latter is not utilized at all in the current design). After this extension is completed, an In-Line-Node could in fact have multiple parents: a set of Q.S-Clusters in addition to a Circuit-Child-Envelope "parent". The structural and procedural details of this extension have not been worked out. The fact that the Parents slot is multivalued does, however, provide a procedural hook for this extension.

Procedure-Update-Circuit-Efforts

Procedure Update-Circuit-Efforts adds the Circuit-Part-Link of an event node having Effort-Dir values other than None to the lists stored in the Efforts-Left and Efforts-Right slots of a Circuit object. It retracts the Part-Link of an event node when the Effort-Dir changes to None. If the Orientation of the Circuit becomes incompatible with efforts in one or both directions, the Efforts-Left and/or -Right slots may be nulled out. The Effort-Dir of a Circuit is not explicitly stored, but is implied by the values of the two multivalued slots. The Efforts-Left and -Right slots are updated regardless of whether the circuit is currently conductive.

Procedure Update-Circuit-Effort is called by the Effort-Dir access trigger method on the event node. It may also be called by the Orientation access trigger if changing the Orientation of the event node causes the Orientation of a Circuit parent to change in such a way that Part-Links must be added or deleted from the two effort slots.

Design Note:

The Efforts-Left and Efforts-Right slots of Circuits have no back-pointers associated with them and, when a child Part-Link must be deleted from one of those slots, the lists they contain must be searched sequentially. These lists are likely to be short in any practical application because a list of more than one item is likely to involve the ambiguity of a qualitative summation of efforts, making discrete event simulation difficult if such ambiguity were a common feature of the model. Therefore, the slower method without back pointers was decided upon for maintenance of these two slots.

Circuit/Child Relationships Maintained by Procedure Update-Circuit-Children

Procedure Update-Circuit-Children is called by the event node access trigger method for Pass-P, Effort-Dir, or Orientation whenever the event changes the conductivity, Effort-Dir, or Orientation of a parent Circuit.

The conductivity changes when the Inactive. Children % slot of the Circuit changes from empty to occupied or vice versa. Changes in Circuit effort direction are implicit in the values of the Efforts-Left and Efforts-Right slots of the Circuit. The Circuit orientation is explicitly maintained in the Circuit's Orientation slot by the Orientation trigger on an event node's change in orientation.

If a Circuit is conductive, Procedure Update-Circuit-Children converts the direction of effort indicated by the Efforts-Left and Efforts-Right of the Circuit into the child-relative direction for each circuit child using the Port slot value of the Circuit-Part-Link to the child. If the child-relative direction is to the Left, the Circuit-Part-Link is asserted into the Circuits-Left % slot of the Envelope. If the child-relative direction is Right, the Part-Link is asserted in the Circuits-Right % slot of the Envelope. A conductive Circuit with efforts both left and right is asserted in both the Circuits-Left % and Circuits-Right % of each child Envelope.

When the Inactive. Children % slot of a Circuit contains one or more Part-Links, or when both its Efforts-Left and Efforts-Right slots become empty, then the circuit is conducting no flow and the Circuit-Part-Link to each of its children is retracted from the Circuits-Left % and/or Circuits-Right % slots of each child Envelope as indicated by the values of the Right-Ptr and Left-Ptr slots of the Circuit-Part-Link- (a Null value indicates no retraction is necessary in the corresponding slot).

Circuit-Flow-Link Assertion by Procedure Add-H-Links

Procedure Compute-Flow-Links calls Add-H-Links on each conductive and active (i.e., one or both of the Effort-Left and -Right lists is not empty) Circuit parent of the event node. For each Part-Link child node of each such circuit the following is done for both the Left-Flow-Link and the Right-Flow-Link of the Circuit-Child-Envelope:

IF the circuit has an implicit Effort-Dir value relative to the child node that is either Ambiguous or that is associated with the Flow-Link for that direction:

IF the node has an Effort-Dir that is the one associated with the Circuit-Flow-Link AND the Effort-Flow-Ptr slot is empty Assert the Circuit-Flow-Link in the associated token slot of the child node (i.e., Flows-Left % for the Left-Circuit-Flow-Link, Flows-Right % for the Right- Circuit-Flow-Link)

Record the assertion's position in the Effort-Flow-Ptr slot of the Flow-Link.

IF the Circuit has an Effort-Source other than the child node in the Effort list associated with the flow link AND the Passive-Flow-Ptr slot of the Flow-Link is empty Assert the Flow-Link in the appropriate token slot of the child node Record the assertion's position in the Passive-Flow-Ptr slot of the Flow-Link.

Circuit Flow-Link Retraction by Procedure Retract-Flow-Entry

For each Circuit parent of the event node that is NOT active (i.e., has no source of effort) and/or is NOT conductive, Procedure Retract-Flow-Entry is called by Compute-Flow-Links. The logic is the converse of that described for Add-H-Links:

IF any of the conditions for Add-H-Links are NOT true AND the Passive- or Effort-Flow-Ptr of the Flow-Link is NOT empty Retract the flow-link SET the appropriate pointer slot (Passive- or Effort-Flow-Ptr) to NIL.

Phase II:

Setting Flow-Directions and Qualitative-Potentials

The list of In-Line-Nodes affected by the state change of one or more In-Line-Atoms was generated in Phase I when the state changes occurred. Phase II commences afterward on a signal from the Simulator module of CONFIG, as discussed in the FPMM-Gen document. The Flow-Dir and Effort-Input (the qualitative potential across an In-Line-Node) attributes of each of the In-Line-Atoms on the *Affected-Nodes* list created in Phase I are computed in Phase II and the *Affected-Nodes* list is then nulled out. The node list also contains Clusters, for which only the Flow-Dir is set. The setting of the Flow-Dir and Effort-Input attributes of In-Line-Atoms may then trigger invocations of CONFIG processes for atomic nodes in the same or subsequent time slices. The objects viewed as In-Line-Atoms by FPMM are Variable-Clusters in CONFIG Devices.

Like Phase I, Phase II is a "bottom-up" procedure, starting with In-Line-Atoms. Because clusters are only of significance if they assist in computing attribute values for the In-Line-Atoms that are part of CONFIG devices, the goal here is to avoid computing values for clusters unless needed to resolve ambiguities in the values of attributes of In-Line-Atoms.

The call tree diagram for Phase II procedures is shown in FIG. 8A. For reasons stated in the design note below, only those sections of the design concerned with unambiguous or automatic disambiguation will be implemented. It has been concluded that in the context of running a DEVS, disambiguation techniques requiring user queries will not be of sufficient value to justify the completion of this design, which could be very costly in terms of development effort. Instead, the focus has been changed to offer the user as many automatic disambiguation strategies as possible. All of the recursive procedures in the diagram of FIG. 8A, all of which exist solely to support propagation of user-supplied disambiguation decisions, will not be implemented in the next version of CONFIG, CONFIG3 Build 3A. The existing code, and now incomplete code, will be commented out.

Design Note:

Disambiguation of Flow-Dir may involve querying the user about one node and using the response as a constraint on the actual value for other nodes that also have ambiguous Flow-Dir based on their token slots. A simple example is an S-Cluster. If one node has flow tokens in both token slots, they all do. The response to a user query about any one determines the Flow-Dir for all the rest without further querying. The current design incorporates this constraint propagation only for true SP topologies and does not propagate any constraints based on Effort-Input or the presence of Flow-Sources vs. Effort-Sources. The current design is therefore incomplete in this respect. Instead, the focus changed to providing mechanisms for avoiding ambiguity in the first place; namely, allowing magnitudes to be assigned to Effort-Values and introducing the definition of Flow-Sources. The cost/value trade-off of completing the constraint propagation design and implementation may not be worthwhile. It may be more reasonable to terminate simulations when an ambiguity is detected after announcing it to the user.

Procedure Set-System-Flows

The top-level Phase II procedure, Set-System-Flows, simply iterates over the list of *Affected-Nodes*, calling Set-Flow on each node for which the Flow-Decided? attribute is NIL Determination of the flow for one atomic node may cause the flow to also be determined for the nodes siblings, ancestors, and children of ancestors. The FlowDecided? slot of these other nodes will set to T (true) when it is determined by Set-Flow. This flag prevents a node on the *Affected-Nodes* list from having its flow set more than once on a call to Set-System-Flows.

Design Note:

The values of Flow-Dir of clusters are generally of importance only if the Flow-Dir or Effort-Input are ambiguous in the In-Line-Atoms, the CONFIG objects that are the true focus of FPMM. Some wasted computation occurs in the current design in computing the Flow-Dir of a cluster when there is no ambiguity in any of the In-Line-Atoms' flow attributes. The Phase I procedures that add nodes to the *AffectedNodes* list should probably be modified to do so only if the node is of class In-Line-Atom. Then, the flow-attributes of Clusters could be computed only as needed to determine attributes of atoms.

Procedure Set-Flow

This procedure takes an argument of one node. If the Flow-Dir and Effort-Input are unambiguous based on the node's flow token slot values, the Flow-Dir is immediately set to the direction associated with the non-NIL flow-token slot. If there is ambiguity in either Flow-Dir or Effort-Input (the qualitative potential) of the node, then attempts are made to automatically disambiguate the value(s) of the ambiguous attribute(s).

IF the node has Flow-Link tokens in only one of the two token slots, Flows-Left % and Flows-Right %, SET the Flow-Dir of the node to the direction associated with the occupied flow token slot ;; Else the Flow-Dir is Ambiguous (but this is not explicitly set)

IF the node is an In-Line-Atom

IF the Flow-Dir is Ambiguous

Call Resolve-Ambiguous-Flow

ELSE

SET the node's Effort-Input only by calling Compute-Effort-Input.

Procedure Resolve-Ambiguous-Flow

This procedure is called whenever an In-Line-Node has Flow-Links in both of its flow justification slots. It first calls Compute-Flow-Related-Attributes, which attempts to determine the Flow-Dir and Effort-Input of the node simultaneously based on any difference in magnitude of the efforts acting to cause flow in the two opposing directions. In the design to be implemented in Build 3A, if this fails the simulation will be aborted and the user will be informed of the node at which ambiguity was detected.

In the design extension that has now been deferred, rather than aborting the simulation after automatic disambiguation fails, procedure Resolve-Ambiguous-Flow attempts to determine the Flow-Dir and Effort-Input based on constraints imposed on flow by the parent or parents of the node. This type of disambiguation presupposes user-input of disambiguating information for at least one node prior to the current event node. Therefore, all procedures shown in FIG. 8A responsible for this constraint propagation and use will not be implemented in CONFIG3 Build 3A. The description of the constraint propagation procedures are, however, retained in this document in the event that at some future, time a decision is made that a need is identified in user applications that would warrant its completion and implementation. The last two paragraphs in this section apply to this partially-implemented and incomplete design.

In the design in which user-supplied information is accepted, if automatic disambiguation fails, an attempt is made to compute the value based on constraints imposed by user-supplied information for some other node. This is done by calling Flow-From-Constraints. These constraints are derived from Kirchhoff's laws for voltage and current. If the constraints cannot determine values unambiguously, the user must be queried for the value of Flow-Dir and/or Effort-Input. When this occurs, the Flow-Dir and Effort-Input for the parent cluster, if any, of the node are also computed for use in resolving any apparent ambiguity in siblings of the node for which the user queries were made. The new constraints are propagated to all ancestors of the node by Resolve-Parent-Flows as shown in the Phase II call tree diagram of FIG. 8A.

This approach avoids performing any computation of cluster attributes unless necessary for disambiguating the attributes of In-Line-Atoms. Propagation of constraints not only avoids unnecessary queries, but also avoids allowing a user to give contradictory answers, as for instance, indicating that two nodes in a series have opposite flow directions.

Procedure Compute-Effort-Input

Computation of the Effort-Input, or qualitative potential, can exploit information on relative magnitudes to resolve ambiguity in both Flow-Dir and Effort-Input. The technique is derived from the reasoning used in engineering to simplify equations by dropping terms whose magnitudes are trivial in comparison to the terms retained. Since qualitative modeling does not attempt to achieve the accuracy of numerical modeling, the modeler can, in some instances, treat a value as qualitatively insignificant even though it would be considered significant in a quantitative model. This simplification by magnitude is performed by the Q+ and Q– procedures called by Compute-Effort-Input.

This procedure determines the effort acting on a node as summarized as follows:

(1) Let efforts.left be the list of Effort-Values for the union of the sets of the Effort-Sources associated with every Flow-Link in the node's Flows-Left % slot. The Effort-Sources responsible for the assertion of a given Flow-Link are found by calling Procedure Effort-Sources.

(2) Let effort.left be (Q+ efforts.left)

(3) LET efforts.right be the list of effort-values produced by repeating Step 1 on the Flow-Links in the Flows-Right % slot of the node, calling Procedure Effort-Sources to get the Effort-Source nodes for each Flow-Link.

(4) Let effort.right be (Q+ efforts.right)

Return the pair of values (Direction Effort.Value)

This pair is created by calling (Q– effort.right effort.left

Procedure Effort-Sources

This procedure collects the Effort-Sources by means that vary depending on the class of the Flow-Link. For example, the list of Effort-Source nodes associated with a Horizontal-Link and most other classes inheriting from Effort-Link-Mixin has a single item: the value of the Flow-Link's Effort-Node slot. The exception to this are the Circuit-Flow-Links, which do not use the Effort-Node slot.

The Effort-Sources associated with a Passive-Vertical-Link must be found by recursive traversals to the root Flow-Link, which will either be one of the classes inheriting from Effort-Link-Mixin or an S-Flow-Thru-Link.

The Effort-Source for an S-Flow-Thru-Link is the S-Cluster parent of the node associated with the S-Flow-Thru-Link.

When the node is the child of a conductive and active Circuit, it will have Circuit-Flow-Links asserted in the flow token slots. The logic of computing an Effort-Input is similar to that for computing the Effort-Value of an S-Cluster described previously in the section on Procedure Set-Effort. If a circuit has one or more Flow-Sources, it can have only one value of Effort-Input for all its children: the Effort-Value common to all Flow-Sources in one of the Efforts-Left or Efforts-Right slot. There cannot be Flow-Sources in both slots and if there is more than one Flow-Source on the Circuit, they must all have identical Effort-Values. Therefore, if a Circuit has one or more such Flow-Sources in the effort token slot (i.e., either the Efforts-Left or Efforts-Right slot) associated with the Circuit-Flow-Link in the child node, it returns a list containing one of them selected arbitrarily. If the Circuit has no Flow-Sources in the associated effort-token slot, it returns the list of all Effort-Sources in that token slot unless there are Flow-Sources in the opposing effort-token slot, in which case NIL is returned. As with S-Clusters, the qualitative potential and therefore the flow through all nodes on the circuit are determined by flow-sources only if they are present.

Design Note:

Some savings in computation would be realized by adding an Effort-Value slot to Circuits. This was not seen as necessary since circuits are never treated as components. However, the above procedure for collecting the Effort-Sources on a Circuit must be performed for each child node, and these redundant iterations could be replaced by a single call to Set-Effort for the Circuit, after which Procedure Effort-Sources would return the circuit as if it were a node. Since Set-Effort is not called by Event-Notify on Circuits, that procedure could be attached to the Effort-Value and Effort-Dir access triggers for the child nodes Circuits. The logic related to Flow-Sources would be identical for that involved with S-Clusters.

Procedure Q+

This procedure takes a list of Effort-Values as an argument. If the list contains only one item, it returns that item. If there are more than one and there is some item, E1, for which it is true that (Q>>E1 X)

for all X in the set of efforts, then E1 is returned. Otherwise, NIL is returned, indicating that the sum is qualitatively ambiguous.

Implementation Note:

A LISP method is defined so that it is always true that (Q>>X Zero).

where Zero is a global variable defined in FPMM and exported to other modules.

Other methods are defined in CONFIG-Flow-Classes and are based on separating the set of Effort-Values into subsets of differing magnitudes.

Procedure Q–

This procedure takes two Effort-Values, ER and EL as arguments, ER being an effort directed to the Right and EL directed to the Left.

If it is true that (Q>> ER EL) then the value pair (Right ER) is returned.

If it is true that (Q>>EL ER) then the value pair (Left EL) is returned.

If neither value is Q>>than the other, then the value pair (Ambiguous NIL) is returned.

Procedure Flow-From-Constraints

This procedure is called by Resolve-Ambiguous-Flows. A search is conducted for values in parent and sibling nodes for Flow-Dir and Effort-Input values that would determine those values for the node that is its argument. This procedure, being part of the design associated with using information supplied by the user, will not be implemented in Build3A. The pseudo code below summarizes this procedure and subprocedures shown in the call tree diagram of FIG. 8A.

```
IF a node is in an S-Cluster, and the Flow-Dir is known for the parent, then the Flow-Dir is the same as for the parent.
ELSE IF the node is in a P-Cluster
IF the node has an Effort-Dir of None
  IF there is a sibling that also has no Effort-Dir but has a known Flow-Dir,
    THEN the node has the same Flow-Dir relative to the P-Cluster. (Kirchhoff's voltage law).
  ELSE IF the node has siblings with Flow-Dir in the opposite direction of the node's Effort-Dir relative to the parent cluster and there are no other sibling Effort-Sources or external sources of effort that could account for that Flow-Dir
    THEN the node has a Flow-Dir that is the same as its Effort-Dir (Kirchhoff's voltage law)
  IF the Flow-Dir is still undetermined and all siblings are known to have Flow-Dir relative to the parent that are in opposition to the Flow-Dir of the parent itself
    THEN the Flow-Dir of the node is the same as the parent P-Cluster (Kirchhoff's current law).
    ELSE ;; the node has Circuit parents and is adjacent to junctions of degree>2
      IF all Flow-Dir values of other nodes adjacent to the junction in either port of the node are either all IN to the junction or OUT from the junction
      THEN the Flow-Dir through the node is in the opposite direction relative to the junction.
```

Design Note:

This procedure not only does not account for Flow-Sources, but it also does not account for the possibility that the set of Circuits on which a node resides may be dynamically configured as a true SP hierarchy due to some of the Circuits being non-conductive. This leaves open the possibility of redundant queries and permitting contradictory answers. A design extension to include dynamic (i.e., simulation-time) clustering would be needed to avoid this problem. Since there is no need to compute dynamic clusters unless an ambiguous situation is detected, such clustering would not have to be every time a circuit child changed state; it would only need to be performed after the ambiguity has been detected and the simulation temporarily halted anyway for the query to be made. This would appear to make such a design extension practical in terms of simulation performance efficiency.

Procedure Flow-From-Parent-Constraints

This procedure is part of the design intended to support propagation of user-supplied disambiguating information and will not be implemented in Build 3*a*.

It is a subprocedure of Flow-From-Constraints returns a Flow-Dir for a node if one can be computed, and the logic for disambiguating Flow-Dir is incorporated in the pseudo-code of the preceding section. Flow-From-Parent-Constraints also has the important side-effect of setting the Effort-Dir of the node and its cluster parent. As can be seen from previous pseudo-code, knowing the Effort-Dir of a node and its siblings is necessary for disambiguating Flow-Dir, and whenever the node in question has a sibling that is a cluster, the sibling's Effort-Dir must be computed.

A cluster with Effort-Sources in both of its Effort token slots (Efforts-Left and Efforts-Right) initially has an Effort-Dir value of Ambiguous. Flow-From-Parent-Constraints attempts to determine a direction of Effort for the cluster parent as follows:

IF the Flow-Dir of the cluster is known and there are no external sources of effort to account for the Flow-Dir
THEN the Effort-Dir of the cluster is the same as its Flow-Dir
ELSE IF the cluster is a P-Cluster
IF the Flow-Dir of all passive child nodes are known AND they are all the same direction relative to the P-Cluster AND there are no external sources of effort to account for this
THEN the Effort-Dir of the P-Cluster is the opposite of the common Flow-Dir of the passive children.
ELSE IF the Flow-Dir through all active child nodes are known AND they are all the same relative to the P-Cluster AND there are no external sources of effort to account for this
THEN the Effort-Dir is the same as the common Flow-Dir of the active children.

Initialization of Flow-Related Object Attributes

Prior to running a simulation, the following procedure is done as an adjunct to the CONFIG Init! function:

Without propagation of any values:

Set the values of Pass-P of all nodes and clusters to FALSE.

Set the Effort-Dir of all effort sources and clusters to NONE.

Set the Effort-Value of all effort-sources and clusters to Zero.

Set the Effort-Input of all effort-sources and clusters to Zero Set the orientation of all nodes and clusters to BOTH.

Set the flow-direction value of all nodes to NONE.

Set Flows-Left % and Flows-Right % of all nodes and Clusters to (%).

Set the Efforts-Left and Efforts-Right of all Circuits and Clusters to NIL.

Set the Circuits-Left % and Circuits-Right % of all Circuit-Child-Envelopes to (%).

Set the CDR of the Inactive-Children % of all Circuits and S-Clusters to the list of all children Pan-Links in the Children slot of the aggregate (i.e., all children are initially non-conductive).

Set the Active.Children % of all P-Clusters to (%).

After the procedure defined here has been executed: allow the CONFIG Init! function to set the initial simulation values for the flow-related attributes—Orientation, Effort-Dir, Effort-Value and Pass-P.

While the invention is susceptible to various modifications and alternative forms, a specific embodiment thereof has been shown in the drawings and described in detail. It should be understood, however, that it is not intended to limit the invention to the particular form shown, but on the contrary, the intention is to cover all modifications, equivalents, and alternatives falling within the scope of the invention as defined by the appended claims.

What is claimed is:

1. A recording medium readable by a computer, tangibly embodying a program of instructions executable by the computer to perfom method steps of modeling and analysis of flow configurations, said method step comprising:

qualitatively modeling flow transmission path elements for systems of connected components and their connections to an environment, constructing flow transmission path structures from said path elements, aggregating said flow transmission path structures into aggregate data structures that are circuits of sub-graphs, inputting local flow state change data into said path structures form models in simulations or analyses, evaluating effects of local flow changes from a simulation or analysis model on the global flow transmission path configuration and the local flow states of components of the system model in order to produce flow state information, and outputting the flow state information to local component models, and using the flow state information and the local component models in simulations and analyses.

2. The recording medium of claim 1 wherein the step of qualitatively modeling flow transmission path elements includes providing a set of qualitative flow path elements for use in the steps of constructing flow transmission path structures, aggregating said flow transmission path structures into circuits of sub-graphs, and evaluating effects of local flow changes on the global flow transmission path configuration and the local flow states of components of the system.

3. The recording medium of claim 2 wherein the step of providing a set of qualitative flow path elements includes providing resistive types, effort-source types, and flow-source types for representing components and aggregates, and junctions for representing divergences and convergences of flow.

4. The recording medium of claim 2 wherein the step of providing a set of qualitative flow path elements includes providing an abstraction of flow transmission variables, including flow and effort variables, for elements of flow paths that includes combining flow and resistance into a qualitative-potential variable, and includes qualitative information on resistance indicating substantially finite and substantially infinite resistance, net flow indicating substantially zero and flow in first and second directions, permissible directions of flow, and effort-input.

5. The recording medium of claim 1 wherein the step of qualitatively modeling flow transmission path elements includes providing flow-related variables and an internal flow map for each type of component model for simulations or analyses that inputs local flow state changes for said evaluation of global and local effects.

6. The recording medium of claim 5 wherein the step of providing flow-related variables and an internal flow map for each said type of component model includes providing "virtual" circuits that include a junction to the external model environment for storage device types.

7. The recording medium of claim 1 wherein the step of constructing flow transmission path structures includes the steps of:

manually establishing the connections between component models, and automatically establishing the internal connections of path elements contained within the device model by reference to said flow map for that type of component model.

8. The recording method of claim 1 wherein the step of aggregating said flow transmission path structures into circuits of sub-graphs includes the steps of:

clustering the serial and parallel structures of the flow transmission path structure into sub-graphs, including said clusters in circuit structures for sub-graphs of said path structure that cannot be clustered by strict reduction of serial and parallel paths, and using said sub-graphs as individual nodes in a circuit.

9. The recording medium of claim 8 wherein the step of including said clusters in circuit structures uses circuits that are any collection of system components defining a cyclic path such that no path element nodes are repeated in the path sequence.

10. The recording medium of claim 8 wherein the step of using said sub-graphs as individual nodes in a circuit includes using qualitative information on resistance indicating substantially finite and substantially infinite resistance, net flow indicating substantially zero and flow in first and second directions, permissible directions of flow, and effort-input, and also directional path information and cluster-circuit interface information.

11. The recording medium of claim 1 wherein the step of inputting local flow state change data into said path structures from models in simulations or analyses includes providing for each internal node in a component model in a simulation or analysis, a corresponding map node for the component type, to establish internal connections for said component that mirror the connections of the corresponding flow map nodes, and providing that any change in a flow-related device variable in the simulation or analysis triggers flow-path determination.

12. The recording medium of claim 1 wherein the step of evaluating effects of local flow changes from a simulation or analysis model on the global flow transmission path configuration and the local flow states of components of the system model includes the steps of:

identifying components that may be affected, collecting for each affected node, flow-related attributes favoring flow in the two possible directions, and determining flow-related properties for each affected path element.

13. The recording medium of claim 12 wherein the step of evaluating effects of determining flow-related properties for each affected path element includes considering possibly conflicting flow tendencies and choosing the flow direction while resolving any ambiguities.

14. The recording medium of claim 13 wherein the step of resolving any ambiguities when comparing flow tendencies includes using information on permissible directions of flow, favoring flow sources over effort sources, distinguishing qualitative values of significant magnitude from those of relatively insignificant magnitude, or else asking the user.

15. The recording medium of claim 1 wherein the step of outputting flow state information to local component models in simulations or analyses includes linking to associated local flow states of components of the simulation or analysis that triggered the determination method.

16. A computer program product for controlling a computer to model and analyze flow configurations, the program product comprising:

a recording medium readable by the computer, means recorded on the recording medium for qualitatively modeling flow transmission path elements for systems of connected components and their connections to an environment, means recorded on the recording medium for constructing flow transmission path structures from said path elements, means recorded on the recording medium for aggregating said flow transmission path structures into aggregate data structures that are circuits of sub-graphs, means recorded on the recording medium for inputting local flow state change data into said path structures from models in simulations or analyses, means recorded on the recording medium for evaluating effects of local flow changes from a simulation or analysis model on the global flow transmission path configuration and the local flow states of components of the system model in order to produce flow state information, and means recorded on the recording medium for outputting flow state information from the means for evaluating to local component models, and for using the flow state information and local component models in simulations and analyses.

17. The computer program product of claim 16 wherein the means for qualitatively modeling flow transmission path elements includes means for providing a set of qualitative flow path elements for use in construction of flow transmission path structures, aggregation of said flow transmission path structures into circuits of sub-graphs, and evaluation of effects of local flow changes on the global flow transmission path configuration and the local flow states of components of the system.

18. The computer program product of claim 17 wherein the means for providing a set of qualitative flow path elements includes means for providing resistive types, effort-source types, and flow-source types for representing components and aggregates, and junctions for representing divergences and convergences of flow.

19. The computer program product of claim 17 wherein the means for providing a set of qualitative flow path elements includes means for providing an abstraction of flow transmission variables, including flow and effort variables, for elements of flow paths that includes combining flow and resistance into a qualitative-potential variable, and includes qualitative information on resistance indicating substantially finite and substantially infinite resistance, net flow indicating substantially zero and flow in first and second directions, permissible directions of flow, and effort-input.

20. The computer program product of claim 16 wherein the means for qualitatively modeling flow transmission path elements includes means for providing flow-related variables and an internal flow map for each type of component model for simulations or analyses that inputs local flow state changes for said evaluation of global and local effects.

21. The computer program product of claim 20 wherein the means for providing flow-related variables and an internal flow map for each said type of component model includes means for providing "virtual" circuits that include a junction to the external model environment for storage device types.

22. The computer program product of claim 16 wherein the means for constructing flow transmission path structures is comprised of:

means for manually establishing the connections between component models, and means for automatically establishing the internal connections of path elements contained within the device model by reference to said flow map for that type of component model.

23. The computer program product of claim 16 wherein the means for aggregating said flow transmission path structures into circuits of sub-graphs is comprised of:

means for clustering the serial and parallel structures of the flow transmission path structure into sub-graphs, means for including said clusters in circuit structures for sub-graphs of said path structure that cannot be clustered by strict reduction of serial and parallel paths, and means for using said sub-graphs as individual nodes in a circuit.

24. The computer program product of claim 23 wherein the means for including said clusters in circuit structures uses circuits that are any collection of system components defining a cyclic path such that no path element nodes are repeated in the path sequence.

25. The computer program product of claim 23 wherein the means for using said sub-graphs as individual nodes in a circuit includes means for using the same types of qualitative information as path elements, and also directional path information and cluster-circuit interface information.

26. The computer program product of claim 16 wherein the means for inputting local flow state change data into said path structures from models in simulations or analyses is comprised of:

means for providing for each internal node in a component model in a simulation or analysis, a corresponding map node for the component type, to establish internal connections for said component that mirror the connections of the corresponding flow map nodes, and means for providing that any change in a flow-related device variable in the simulation or analysis triggers flow-path determination.

27. The computer program product of claim 16 wherein the means for evaluating effects of local flow changes from a simulation or analysis model on the global flow transmission path configuration and the local flow states of components of the system model is comprised of:

means for identifying components that may be affected, means for collecting for each affected node, flow-related attributes favoring flow in the two possible directions, and means for determining flow-related properties for each affected path element.

28. The computer program product of claim 27 wherein the means for evaluating effects of determining flow-related properties for each affected path element includes means for considering possibly conflicting flow tendencies and choosing the flow direction while resolving any ambiguities.

29. The computer program product of claim 28 wherein the means for resolving any ambiguities when comparing flow tendencies includes means for using information on permissible directions of flow, favoring flow sources over effort sources, distinguishing qualitative values of significant magnitude from those of relatively insignificant magnitude, or else asking the user.

30. The computer program product of claim 16 wherein the means for outputting flow state information to local component models in simulations or analyses includes means for linking to associated local flow states of components of the simulation or analysis that triggered the determination method.

31. A recording medium readable by a computer, tangibly embodying a program of instructions executable by the computer to perform method steps of modeling and analysis of flow configurations in discrete event simulation, said method steps comprising:

qualitatively modeling flow transmission path elements for systems of connected components and their connections to an environment, constructing flow transmission path structures from said path elements, aggregating said flow transmission path structures into aggregate data structures that are circuits of sub-graphs, inputting local flow state change data into said path structures from models in discrete event simulations, evaluating effects of local flow changes from a simulation or analysis model on the global flow transmission path configuration and the local flow states of components of the system model in order to produce flow state information, and outputting the flow state information to local component models, and using the flow state information and the local component models in discrete event simulations.

32. The recording medium of claim 31 wherein the step of qualitatively modeling flow transmission path elements includes providing a set of qualitative flow path elements for use in the steps of constructing flow transmission path structures, aggregating said flow transmission path structures into circuits of sub-graphs, and evaluating effects of local flow changes on the global flow transmission path configuration and the local flow states of components of the system.

33. The recording medium of claim 32 wherein the step of providing a set of qualitative flow path elements includes providing resistive types, effort-source types, and flow-source types for representing components and aggregates, and junctions for representing divergences and convergences of flow.

34. The recording medium of claim 32 wherein the step of providing a set of qualitative flow path elements includes providing an abstraction of flow transmission variables, including flow and effort variables, for elements of flow paths that includes combining flow and resistance into a qualitative-potential variable, and includes qualitative information on resistance indicating substantially finite and substantially infinite resistance, net flow indicating substantially zero and flow in first and second directions, permissible directions of flow, and effort-input.

35. The recording medium of claim 31 wherein the step of qualitatively modeling flow transmission path elements includes providing flow-related variables and an internal flow map for each type of component model for discrete event simulations that inputs local flow state changes for said evaluation of global and local effects.

36. The recording medium of claim 35 wherein the step of providing flow-related variables and an internal flow map for each said type of component model includes providing "virtual" circuits that include a junction to the external model environment for storage device types.

37. The recording medium of claim 31 wherein the step of constructing flow transmission path structures includes the steps of:

manually establishing the connections between component models, and automatically establishing the internal connections of path elements contained within the component model by reference to said flow map for that type of component model.

38. The recording medium of claim 31 wherein the step of aggregating said flow transmission path structures into circuits of sub-graphs includes the steps of:

clustering the serial and parallel structures of the flow transmission path structure into sub-graphs, including said clusters in circuit structures for sub-graphs of said path structure that cannot be clustered by strict reduction of serial and parallel paths, and using said sub-graphs as individual nodes in a circuit.

39. The recording medium of claim 38 wherein the step of including said clusters in circuit structures uses circuits that are any collection of system components defining a cyclic path such that no path element nodes are repeated in the path sequence.

40. The recording medium of claim 38 wherein the step of using said sub-graphs as individual nodes in a circuit includes using qualitative information on resistance indicating substantially finite and substantially infinite resistance, net flow indicating substantially zero and flow in first and second directions, permissible directions of flow, and effort-input, and also directional path information and cluster-circuit interface information.

41. The recording medium of claim 31 wherein the step of inputting local flow state change data into said path structures from models in discrete event simulations includes providing for each internal node in a component model in a discrete event simulation, a corresponding map node for the component type, to establish internal connections for said component that mirror the connections of the corresponding flow map nodes, and providing that any change in a flow-related device variable in the discrete event simulation triggers flow-path determination.

42. The recording medium of claim 31 wherein the step of evaluating effects of local flow changes from a discrete event simulation model on the global flow transmission path configuration and the local flow states of components of the system model includes the steps of:

identifying components that may be affected, collecting for each affected node, flow-related attributes favoring flow in the two possible directions, and determining flow-related properties for each affected path element.

43. The recording medium of claim 40 wherein the step of evaluating effects of determining flow-related properties for each affected path element includes considering possibly conflicting flow tendencies and choosing the flow direction while resolving any ambiguities.

44. The recording medium of claim 43 wherein the step of resolving any ambiguities when comparing flow tendencies includes using information on permissible directions of flow, favoring flow sources over effort sources, distinguishing qualitative values of significant magnitude from those of relatively insignificant magnitude, or else asking the user.

45. The recording medium of claim 31 wherein the step of outputting flow state information to local component models in discrete event simulations includes linking to associated local flow states of components of the simulation that triggered the determination method.

46. A computer program product for controlling a computer to model and analyze flow configurations in discrete event simulation, the program product comprising:

a recording medium readable by the computer, means recorded on the recording medium for qualitatively modeling flow transmission path elements for systems of connected components and their connections to an environment, means recorded on the recording medium for constructing flow transmission path structures from said path elements, means recorded on the recording medium for aggregating said flow transmission path structures into aggregate data structures that are circuits of sub-graphs, means recorded on the recording medium for inputting local flow state change data into said path structures from models in discrete event simulations, means recorded on the recording medium for evaluating effects of local flow changes from a discrete event simulation model on the global flow transmission path configuration and the local flow states of components of the system model in order to produce flow state information, and means recorded on the recording medium for outputting the flow state information to local component models, and for using the flow state information and the local component models in discrete event simulations.

47. The computer program product of claim 46 wherein the means for qualitatively modeling flow transmission path elements includes means for providing a set of qualitative flow path elements for use in construction of flow transmission path structures, aggregation of said flow transmission path structures into circuits of sub-graphs, and evaluation of effects of local flow changes on the global flow transmission path configuration and the local flow states of components of the system.

48. The computer program product of claim 47 wherein the means for providing a set of qualitative flow path elements includes means for providing resistive types, effort-source types, and flow-source types for representing components and aggregates, and junctions for representing divergences and convergences of flow.

49. The computer program product of claim 47 wherein the means for providing a set of qualitative flow path elements includes means for providing an abstraction of flow transmission variables, including flow and effort variables, for elements of flow paths that includes combining flow and resistance into a qualitative-potential variable, and includes qualitative information on resistance indicating substantially finite and substantially infinite resistance, net flow indicating substantially zero and flow in first and second directions, permissible directions of flow, and effort-input.

50. The computer program product of claim 46 wherein the means for qualitatively modeling flow transmission path elements includes means for providing flow-related variables and an internal flow map for each type of component model for discrete event simulations that input local flow state changes for said evaluation of global and local effects.

51. The computer program product of claim 50 wherein the means for providing flow-related variables and an internal flow map for each said type of component model includes means for providing "virtual" circuits that include a junction to the external model environment for storage device types.

52. The computer program product of claim 46 wherein the means for constructing flow transmission path structures is comprised of:

means for manually establishing the connections between component models, and means for automatically establishing the internal connections of path elements contained within the component model by reference to said flow map for that type of component model.

53. The computer program product of claim 46 wherein the means for aggregating said flow transmission path structures into circuits of sub-graphs is comprised of:

means for clustering the serial and parallel structures of the flow transmission path structure into sub-graphs, means for including said clusters in circuit structures for sub-graphs of said path structure that cannot be clustered by strict reduction of serial and parallel paths, and means for using said sub-graphs as individual nodes in a circuit.

54. The computer program product of claim 53 wherein the means for including said clusters in circuit structures uses circuits that are any collection of system components defining a cyclic path such that no path element nodes are repeated in the path sequence.

55. The computer program product of claim 53 wherein the means for using said sub-graphs as individual nodes in a circuit includes means for using the same types of qualitative information as path elements, and also directional path information and cluster-circuit interface information.

56. The computer program product of claim 46 wherein the means for inputting local flow state change data into said path structures from models in discrete event simulations is comprised of:

means for providing for each internal node in a component model in a discrete event simulation, a corresponding map node for the component type, to establish internal connections for said component that mirror the connections of the corresponding flow map nodes, and means for providing that any change in a flow-related device variable in said discrete event simulation triggers flow-path determination.

57. The computer program product of claim 46 wherein the means for evaluating effects of local flow changes from a discrete event simulation model on the global flow transmission path configuration and the local flow states of components of the system model is comprised of:

means for identifying components that may be affected, means for collecting for each affected node, flow-related attributes favoring flow in the two possible directions, and means for determining flow-related properties for each affected path element.

58. The computer program product of claim 57 wherein the means for evaluating effects of determining flow-related properties for each affected path element includes means for considering possibly conflicting flow tendencies and choosing the flow direction while resolving any ambiguities.

59. The computer program product of claim 58 wherein the means for resolving any ambiguities when comparing flow tendencies includes means for using information on permissible directions of flow, favoring flow sources over effort sources, distinguishing qualitative values of significant magnitude from those of relatively insignificant magnitude, or else asking the user.

60. The computer program product of claim 46 wherein the means for outputting flow state information to local component models in discrete event simulations includes means for linking to associated local flow states of components of the simulation or analysis that triggered the determination method.

61. A recording medium readable by a computer, tangibly embodying a program of instructions executable by the computer to perform method steps of modeling and analysis of flow configurations in a discrete event simulation, said method steps comprising:

qualitatively modeling flow transmission path elements for systems of connected components and their connections to an environment, constructing flow transmission path structures from said path elements, aggregating said flow transmission path structures into aggregate data structures that are circuits of sub-graphs, inputting local flow state change data into said path structures from models in discrete event simulations, evaluating effects of local flow changes from a simulation model on the global flow transmission path configuration and the local flow states of components of the system model in order to produce flow state information, and outputting the flow state information to local component models, and using the flow state information and the local component models in the discrete event simulation, wherein the step of evaluating effects of local flow changes from a discrete event simulation model on the global flow transmission path configuration and the local flow states of components of the system model includes the steps of:

identifying components that my be affected, collecting for each affected node, flow-related attributes favoring flow in the two possible directions, and determining flow-related properties for each affected path component, and wherein the step of collecting for each affected node, flow-related attributes favoring flow in the two possible directions, is completed for all of the components identified by the step of identifying components that may be affected, prior to the step of determining flow-related properties for each affected path element, in order to delay the step of determining flow-related properties for each affected path element until the end of a discrete-event time quantum for said discrete event simulations.

62. The recording medium of claim 61, wherein the step of determining flow-related properties for each affected path element includes considering possibly conflicting flow tendencies and choosing the flow direction while resolving any ambiguities by using information on permissible directions of flow, favoring flow sources over effort sources, distinguishing qualitative values of significant magnitude from those of relatively insignificant magnitude, or else asking the user.

63. The recording medium of claim 61, wherein the step of qualitatively modeling flow transmission path elements includes providing a set of qualitative flow path elements for use in the steps of constructing flow transmission path structures, aggregating said flow transmission path structures into circuits of sub-graphs, and evaluating effects of local flow changes on the global flow transmission path configuration and the local flow states of components of the system, and wherein the step of providing a set of qualitative flow path elements includes providing an abstraction of flow transmission variables, including flow and effort variables, for elements of flow paths that includes combining flow and resistance into a qualitative-potential variable, and includes qualitative information on resistance indicating substantially finite and substantially infinite resistance, net flow indicating substantially zero and flow in first and second directions, permissible directions of flow, and effort-input.

64. The recording medium of claim 61, wherein the step of qualitatively modeling flow transmission path elements includes providing flow-related variables and an internal flow map for each type of component model for simulations or analyses that inputs local flow state changes for said evaluation of global and local effects, and wherein the providing of flow-related variables and an internal flow map for each said type of component model includes providing "virtual" circuits that include a junction to the external model environment for storage device types.

65. The recording medium of claim 61 wherein the step of aggregating said flow transmission path structures into circuits of sub-graphs includes the steps of:

clustering the serial and parallel structures of the flow transmission path structure into sub-graphs, including said clusters in circuit structures for sub-graphs of said path structure that cannot be clustered by strict reduction of serial and parallel paths, and using said sub-graphs as individual nodes in a circuit.

66. The recording medium of claim 65 wherein the step of including said clusters in circuit structures uses circuits that are any collection of system components defining a cyclic path such that no path element nodes are repeated in the path sequence.

67. A recording medium readable by a computer, tangibly embodying a program of instructions executable by the computer to perform method steps of modeling and analysis of flow configurations in discrete event simulation, said program of instructions comprising:

a program executable by the computer for building models in the computer of physical components and a model of a physical system comprised of selected ones of the physical components;

a program executable by the computer for performing a discrete event simulation of said physical system using said models of the physical system and the selected ones of the physical components in the physical system; and a flow path management program executable by the computer for:

qualitatively modeling flow transmission path elements for the physical system and connections to and environment of the physical system, constructing flow transmission path structures from said path elements, aggregating said flow transmission path structures into aggregate data structures that are circuits of sub-graphs, inputting local flow state change data into said path structures from said models during a discrete event simulation by execution of said simulation program, evaluating effects of local flow changes from said models on the global flow transmission path configuration and the local flow states of components of the system model in order to produce flow state information, and outputting the flow state information to local component models, wherein the simulation program is executable by the computer for using the flow state information and the local component models in the discrete event simulation, wherein the flow management program is executable by the computer for evaluating effects of local flow changes from a discrete event simulation model on the global flow transmission path configuration and the local flow states of components of the system model by:

identifying components that may be affected, collecting for each affected node, flow-related attributes favoring flow in the two possible directions, and determining flow-related properties for each affected path element, and wherein the collecting for each affected node, flow-related attributes favoring flow in the two possible directions, is completed for all of the components identified by the stop of identifying components that may be affected, prior to the determining of flow-related properties for each affected path element, in order to delay the determining of flow-related properties for each affected path element until the end of a discrete-event time quantum for said discrete event simulation.

68. The recording medium of claim 67, wherein the flow path management program is executable by the computer for evaluating effects of determining flow-related properties for each affected path element by considering possibly conflicting flow tendencies and choosing the flow direction while resolving any ambiguities, and resolving any ambiguities when comparing flow tendencies by using information on permissible directions of flow, favoring flow sources over effort sources, distinguishing qualitative values of significant magnitude from those of relatively insignificant magnitude, or else asking the user.

69. The recording medium as recited in claim 67, wherein the flow path management program is executable by the computer for qualitatively modeling flow transmission path elements by constructing flow transmission path structures, aggregating said flow transmission path structures into circuits of sub-graphs, and evaluating effects of local flow changes on the global flow transmission path configuration and the local flow states of components of the system, and wherein the qualitative modeling of flow transmission path elements includes using an abstraction of flow transmission variables, including flow and effort variables, for elements of flow paths that includes combining flow and resistance into a qualitative-potential variable, and includes qualitative information on resistance indicating substantially finite and substantially infinite resistance, net flow indicating substantially zero and flow in first and second directions, permissible directions of flow, and effort-input.

70. The recording medium of claim 67, wherein the flow path management program is executable by the computer for accessing models of flow transmission path elements including flow-related variables and an internal flow map for each type of component model for discrete event simulation that inputs local flow state changes for said evaluation of global and local effects, and wherein the flow-related variables and an internal flow map for each said type of component model includes flow-related variables and an internal flow map for "virtual" circuits that include a junction to the external model environment for storage device types.

71. The recording medium of claim 69 wherein the flow path management program is executable by the computer for aggregating said flow transmission path structures into circuits of sub-graphs by:

clustering the serial and parallel structures of the flow transmission path structure into sub-graphs, including said clusters in circuit structures for sub-graphs of said path structure that cannot be clustered by strict reduction of serial and parallel paths, and using said sub-graphs as individual nodes in a circuit.

72. The recording medium of claim 71 wherein the clusters in circuit structures use circuits that are any collection of system components defining a cyclic path such that no path element nodes are repeated in the path sequence.

* * * * *